(12) United States Patent
Miyamoto et al.

(10) Patent No.: US 10,577,713 B2
(45) Date of Patent: Mar. 3, 2020

(54) SUBSTRATE HOLDER, PLATING APPARATUS, AND METHOD FOR MANUFACTURING SUBSTRATE HOLDER

(71) Applicant: EBARA CORPORATION, Tokyo (JP)

(72) Inventors: Matsutaro Miyamoto, Tokyo (JP); Jumpei Fujikata, Tokyo (JP); Kiyoshi Suzuki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 161 days.

(21) Appl. No.: 15/824,192

(22) Filed: Nov. 28, 2017

(65) Prior Publication Data

US 2018/0155847 A1 Jun. 7, 2018

(30) Foreign Application Priority Data

Dec. 1, 2016 (JP) ................. 2016-234169

(51) Int. Cl.
*C25D 17/06* (2006.01)
*C25D 17/00* (2006.01)
*H01L 21/673* (2006.01)
*H01L 21/687* (2006.01)
*H01L 21/02* (2006.01)

(52) U.S. Cl.
CPC .......... *C25D 17/06* (2013.01); *C25D 17/001* (2013.01); *C25D 17/004* (2013.01); *H01L 21/02697* (2013.01); *H01L 21/67346* (2013.01); *H01L 21/68721* (2013.01)

(58) Field of Classification Search
None
See application file for complete search history.

(56) References Cited

U.S. PATENT DOCUMENTS

| 5,578,167 | A | * | 11/1996 | Sooriakumar | .... H01L 21/67075 |
| | | | | | 118/503 |
| 8,197,649 | B2 | * | 6/2012 | Saiki | ................... C25B 1/46 |
| | | | | | 204/252 |
| 8,337,680 | B2 | * | 12/2012 | Yoshioka | .............. C25D 17/06 |
| | | | | | 204/297.06 |
| 2003/0019741 | A1 | * | 1/2003 | Kholodenko | ........... C25D 7/12 |
| | | | | | 204/224 R |

(Continued)

FOREIGN PATENT DOCUMENTS

| JP | 5643239 B | 12/2014 |
| JP | 2015-145537 A | 8/2015 |
| JP | 2016-003376 A | 1/2016 |

*Primary Examiner* — Harry D Wilkins, III
(74) *Attorney, Agent, or Firm* — BakerHostetler

(57) ABSTRACT

Provided is a substrate holder where an effect of a pressure of a plating solution can be suppressed. A substrate holder includes first and second holding members for sandwiching a substrate. The first holding member includes: a support base; a movable base for supporting the substrate; and a biasing mechanism disposed between the support base and the movable base, and biasing the movable base in a direction along which the movable base is separated from the support base. The second holding member includes a protruding portion brought into contact with the substrate so as to seal the substrate. A biasing force of the biasing mechanism which is applied to a region or a position of the movable base differs from a biasing force of the biasing mechanism which is applied to another region or at another position of the movable base.

14 Claims, 54 Drawing Sheets

(56) References Cited

U.S. PATENT DOCUMENTS

| | | | |
|---|---|---|---|
| 2004/0074763 A1* | 4/2004 | Okase | C25D 17/06 204/230.3 |
| 2009/0071820 A1* | 3/2009 | Saiki | C25B 1/46 204/252 |
| 2009/0139871 A1 | 6/2009 | Saito et al. | |
| 2013/0192983 A1 | 8/2013 | Fujikata | |
| 2014/0024178 A1* | 1/2014 | Scanlan | C25D 17/06 438/127 |
| 2016/0348264 A1 | 12/2016 | Fujikata et al. | |

* cited by examiner

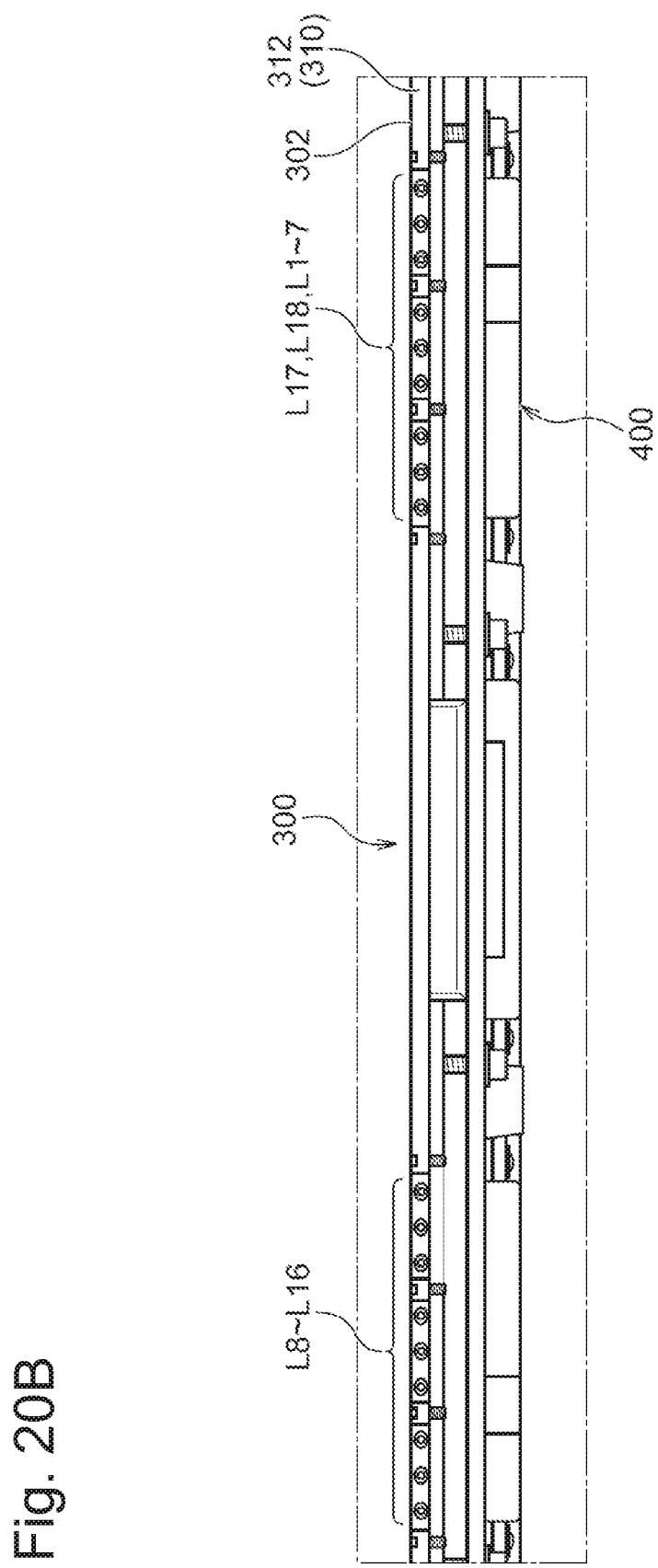

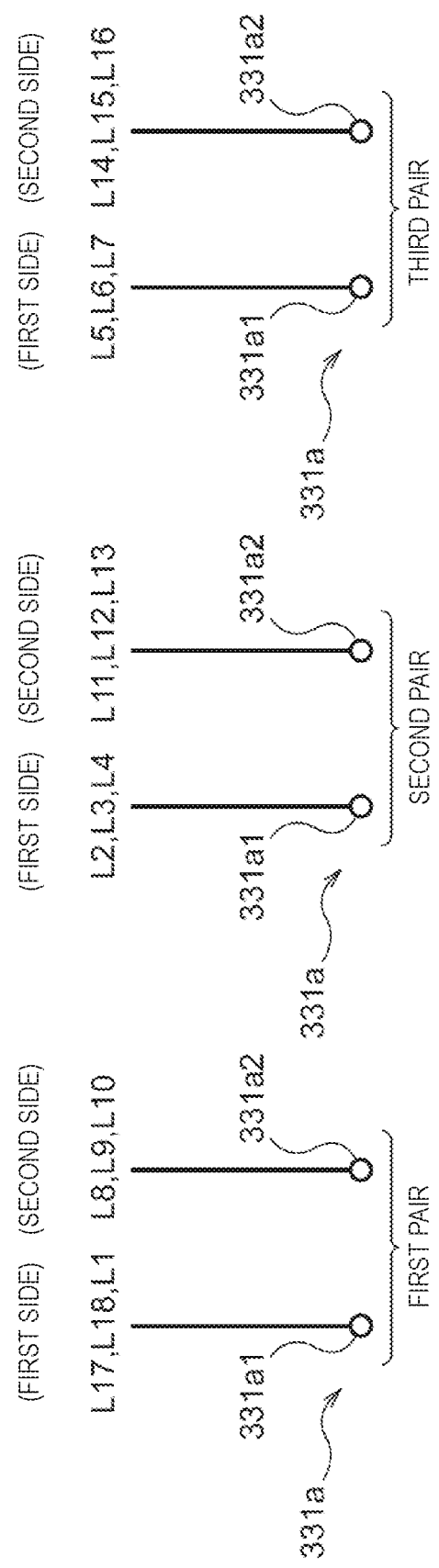

SUBSTRATE HOLDER, PLATING APPARATUS, AND METHOD FOR MANUFACTURING SUBSTRATE HOLDER

CROSS-REFERENCE TO RELATED APPLICATIONS

This application is based upon and claims benefit of priority from Japanese Patent Application No. 2016-234169 filed Dec. 1, 2016, the entire contents of which are incorporated herein by reference.

TECHNICAL FIELD

The present invention relates to a substrate holder, a plating apparatus, and a method for manufacturing a substrate holder.

BACKGROUND ART

Conventionally, wirings, bumps (protruding electrodes) and the like are formed on a surface of a substrate such as a semiconductor wafer or a printed circuit board. An electrolytic plating method is used as a method for forming the wirings, the bumps and the like.

A plating apparatus, which is used in the electrolytic plating method, includes a substrate holder which seals an end surface of a substrate having a circular shape or a polygonal shape, and holds the substrate with a surface (surface to be plated) of the substrate exposed. In performing plating treatment on the surface of the substrate in such a plating apparatus, the substrate holder holding the substrate is immersed into a plating solution.

Japanese Patent No. 5643239 specification (PTL 1) describes a configuration where a movable base 82 is supported on a support base 80 of a substrate holder 18 by compression springs 86, a substrate is placed on the movable base 82, and an outer peripheral portion of the substrate W is sandwiched by the movable base 82 and a seal holder 62. In this configuration, a change in thickness of the substrate W is absorbed by the movement of the movable base 82 so that the substrate W having a different thickness is held by the substrate holder 18 in a state where a size of a compressed substrate sealing member 66 is maintained within a predetermined range.

In Japanese Patent Laid-Open No. 2015-145537 (PTL 2), a plating apparatus is described where an anode holder 28, a regulation plate 134 and a substrate holder 24 are mounted on a positioning holder 182 which is a member used in common so that the center of the anode 26, the center of an opening of the regulation plate 134, and the center of the substrate W are made to agree with each other with certainty.

Japanese Patent Laid-Open No. 2016-3376 (PTL 3) describes a substrate holder 8 where a substrate W is sandwiched between a first holding member 22 and a second holding member 24. In this substrate holder 8, an outer peripheral portion of the substrate W is pressed by a substrate sealing member 28. PTL 3 describes a configuration where a conductive block 60 biased by a spring 63 is disposed in a holder hanger 34 of the substrate holder 8, and the conductive block 60 is brought into contact with and separated from a plurality of external contacts 42. By energizing the respective external contacts 42 in a state where the substrate W is held by the substrate holder 8 and the conductive block 60 is separated from the external contacts 42, it is possible to detect whether or not there is an abnormality in internal contacts 45 and/or a conductive film of the substrate W. By bringing the conductive block 60 into contact with the external contacts 42, a uniform electric current can be supplied to the plurality of internal contacts 45.

SUMMARY OF INVENTION

Technical Problem

Recently, a size of a substrate treated in a substrate treatment apparatus such as a plating apparatus has increased. When a size of the substrate increases, a size of the substrate holder also increases. Accordingly, in a dip-type plating apparatus where a substrate holder is vertically immersed, a large pressure difference is generated between an upper portion and a lower portion of the substrate holder due to an effect of a pressure of a plating solution (hereinafter also referred to as "fluid pressure"). Due to such a pressure difference, there may be a variation in size of the compressed substrate sealing member between the upper portion and the lower portion of the substrate holder so that leakage of a plating solution may be caused. Variation in size of the compressed substrate sealing member between the upper portion and the lower portion of the substrate holder may cause a substrate to incline so that a quality of plating may be affected. However, the above-mentioned configurations described in PTL 1 to PTL 3 do not take into account an effect caused by a pressure difference of a plating solution on the substrate holder.

It is an object of the present invention to solve at least a portion of the above-mentioned problems.

Solution to Problem

According to an aspect of the present invention, there is provided a substrate holder. The substrate holder includes a first holding member and a second holding member which are configured to sandwich a substrate. The first holding member includes: a support base; a movable base configured to support the substrate; and a biasing mechanism disposed between the support base and the movable base, and configured to bias the movable base in a direction along which the movable base is separated from the support base. The second holding member includes a protruding portion brought into contact with the substrate so as to seal the substrate. A biasing force of the biasing mechanism which is applied to a region or a position of the movable base differs from a biasing force of the biasing mechanism which is applied to another region or another position of the movable base. A position may be one position or a plurality of positions.

According to an aspect of the present invention, there is provided a method for manufacturing a substrate holder for sandwiching a substrate, the method including the steps of: preparing a support base, a movable base and a biasing mechanism; and assembling the support base, the movable base and the biasing mechanism with each other such that a region or a position of the movable base is biased with a biasing force which differs from a biasing force applied to another region or another position of the movable base.

BRIEF DESCRIPTION OF DRAWINGS

FIG. 20B is a top plan view showing the portion of the face portion in the vicinity of the position where the cables are introduced with the illustration of the wiring buffer portion omitted;

FIG. 22 is an explanatory view for describing a connection relationship between the cables and external connection contacts;

DESCRIPTION OF EMBODIMENTS

Hereinafter, embodiments of the present invention are described with reference to drawings. In the respective embodiments described hereinafter, identical or corresponding members are given the same symbols, and the repeated description is omitted. In this specification, the descriptions such as "front surface", "back surface", "front", "back", "up", "down", "left" and "right" are used. These descriptions merely describe positions and directions on a paper on which a drawing is illustrated for the sake of convenience of the description, and may differ from positions and directions of an apparatus in an actual arrangement such as an arrangement when the apparatus is in use.

Figure 1:
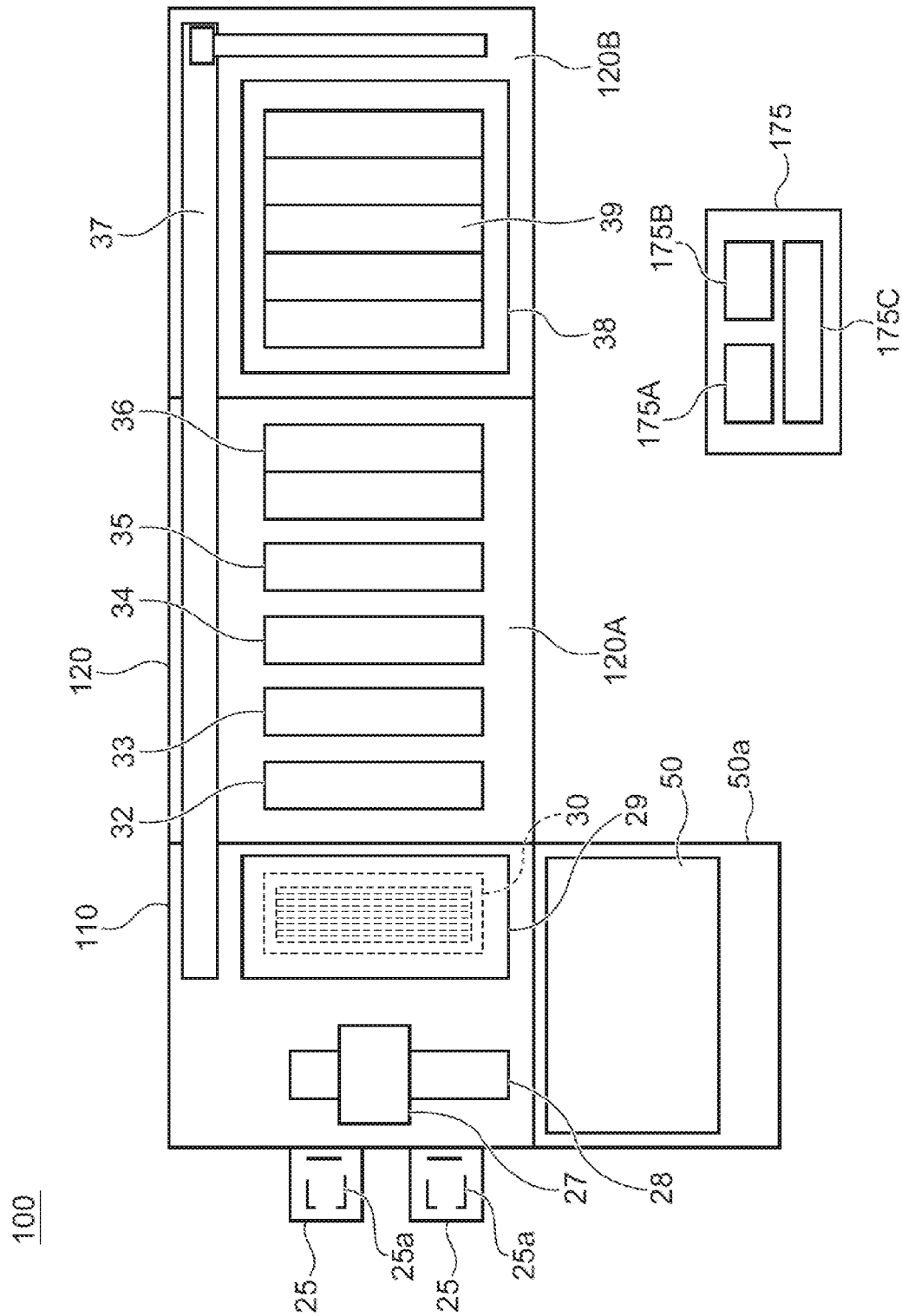
FIG. 1 is an overall layout diagram of a plating apparatus in which a substrate holder according to one embodiment of the present invention is used.

FIG. 1 is an overall layout diagram of a plating apparatus in which a substrate holder according to one embodiment of the present invention is used. As shown in FIG. 1, the plating apparatus 100 is roughly divided into a loading/unloading part 110 where a substrate (corresponding to one example of an object to be treated) is loaded on the substrate holder 1, or the substrate is unloaded from the substrate holder 1; a treatment part 120 where treatment is performed on the substrate; and a cleaning part 50a. The treatment part 120 includes: a pretreatment and post-treatment part 120A where pretreatment and post-treatment are performed on a substrate; and a plating treatment part 120B where plating treatment is performed on the substrate. A substrate, on which treatment is performed in the plating apparatus 100, includes a quadrangular substrate and a circular substrate. The quadrangular substrate includes a glass substrate, a liquid crystal substrate and a printed circuit board which have a polygonal shape such as a rectangular shape, and other objects to be plated having a polygonal shape. The circular substrate includes a semiconductor wafer, a glass substrate, and other objects to be plated having a circular shape.

The loading/unloading part 110 includes two cassette tables 25 and a substrate attaching and detaching mechanism 29. Each cassette table 25 mounts cassettes 25a storing substrates such as semiconductor wafers, glass substrates, liquid crystal substrates or printed circuit boards thereon. The substrate attaching and detaching mechanism 29 is configured to attach and detach a substrate to and from the substrate holder 1 (described later with reference to FIG. 2A and following drawings). A stocker 30 for storing the substrate holders 1 is disposed in the vicinity of the substrate attaching and detaching mechanism 29 (below the substrate attaching and detaching mechanism 29, for example). A substrate transferring device 27, which includes a transfer robot, is disposed at the center of these units 25, 29, 30, and the substrate transferring device 27 transfers a substrate between these units. The substrate transferring device 27 is configured to be travelable by a traveling mechanism 28.

The cleaning part 50a includes a cleaning device 50 for cleaning and drying a substrate on which plating treatment is performed. The substrate transferring device 27 is configured to transfer the substrate on which plating treatment is performed to the cleaning device 50, and to extract the cleaned substrate from the cleaning device 50.

The pretreatment and post-treatment part 120A includes: a pre-wetting tank 32; a presoaking tank 33; a pre-rinse tank 34; a blow tank 35; and a rinse tank 36. A substrate is immersed into pure water in the pre-wetting tank 32. An oxide film on a surface of a conductive layer such as a seed layer formed on a surface of the substrate is removed by etching in the presoaking tank 33. The substrate, on which pre-soaking treatment is performed, is cleaned with a cleaning solution (pure water or the like) together with the substrate holder in the pre-rinse tank 34. The cleaned substrate is drained in the blow tank 35. The substrate, to which plating is applied, is cleaned with a cleaning solution together with the substrate holder in the rinse tank 36. The pre-wetting tank 32, the presoaking tank 33, the pre-rinse tank 34, the blow tank 35, and the rinse tank 36 are disposed in this order. The above-mentioned configuration of the pretreatment and post-treatment part 120A of the plating apparatus 100 is merely one example. The pretreatment and post-treatment part 120A of the plating apparatus 100 is not particularly limited to such a configuration, and may adopt other configurations.

The plating treatment part 120B includes a plurality of plating tanks 39 including an overflow tank 38. Each plating tank 39 stores one substrate therein. The substrate is immersed into a plating solution held in the inside of each plating tank 39 so as to apply plating such as copper plating to a surface of the substrate. A kind of plating solution is not particularly limited, and any of various plating solutions may be used corresponding to the application.

The plating apparatus 100 includes a substrate holder transporting device 37 of a linear motor type, for example. The substrate holder transporting device 37 is positioned on a side facing the respective equipment, and transports a substrate holder together with a substrate between the respective equipment. The substrate holder transporting device 37 is configured to transport a substrate holder between the substrate attaching and detaching mechanism 29, the pre-wetting tank 32, the presoaking tank 33, the pre-rinse tank 34, the blow tank 35, the rinse tank 36, and the plating tank 39.

A plating treatment system which includes the plating apparatus 100 having the above-mentioned configuration includes a controller 175 configured to control the above-mentioned respective parts. The controller 175 includes: a memory 175B storing a predetermined program; a CPU (Central Processing Unit) 175A which executes the program in the memory 175B; and a control part 175C which is realized when the program is executed by the CPU 175A. For example, the control part 175C can perform controls such as a transfer control of the substrate transferring device 27, a control of attaching and detaching a substrate to and from a substrate holder performed by the substrate attaching and detaching mechanism 29, a transport control of the substrate holder transporting device 37, a control of a plating current and a plating time in the respective plating tanks 39, and a control of an opening diameter of an anode mask (not shown in the drawing) disposed in the respective plating tanks 39 and an opening diameter of a regulation plate (not shown in the drawing) disposed in the respective plating tanks 39. The controller 175 is configured to be communicable with a host controller not shown in the drawing which performs a centralized control of the plating apparatus 100 and other related devices. Accordingly, the controller 175 can transmit and receive data to and from a database which the host controller includes. In this embodiment, a storage medium which forms the memory 175B stores various kinds of programs such as various kinds of setting data and a plating treatment program described later. As a storage medium, a known storage medium may be used, which includes a computer readable memory such as a ROM and a RAM, and a disk-shaped storage medium such as a hard disk, a CD-ROM, a DVD-ROM or a flexible disk.

[Substrate Holder]

Figure 2A:
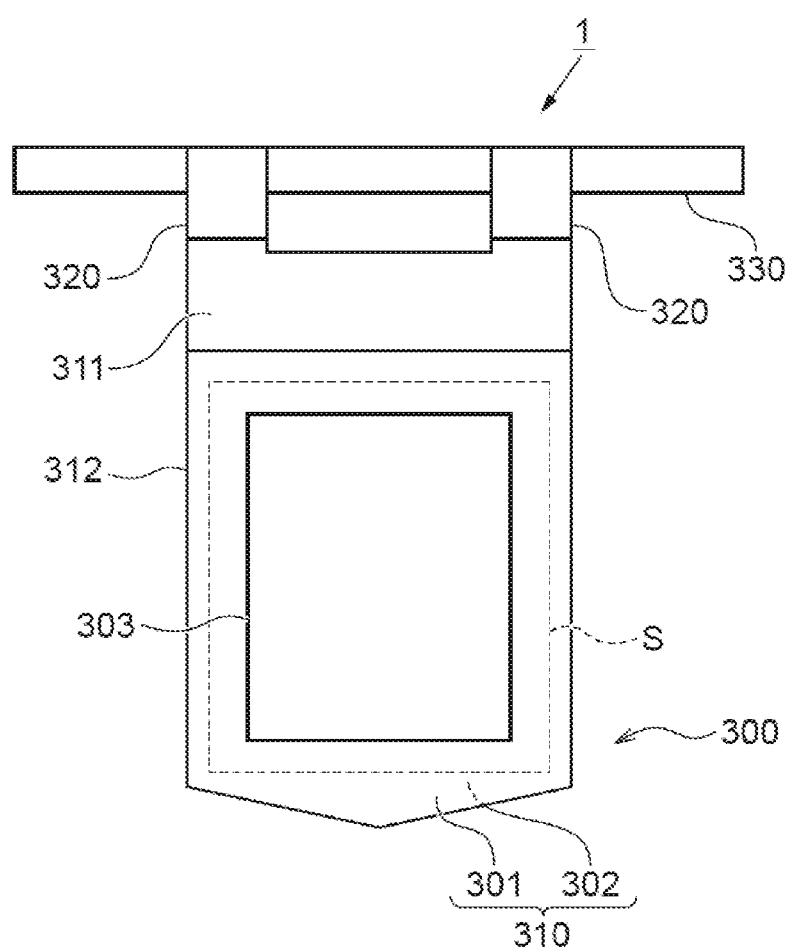
FIG. 2A is a schematic front view of the substrate holder according to one embodiment.
Figure 2B:
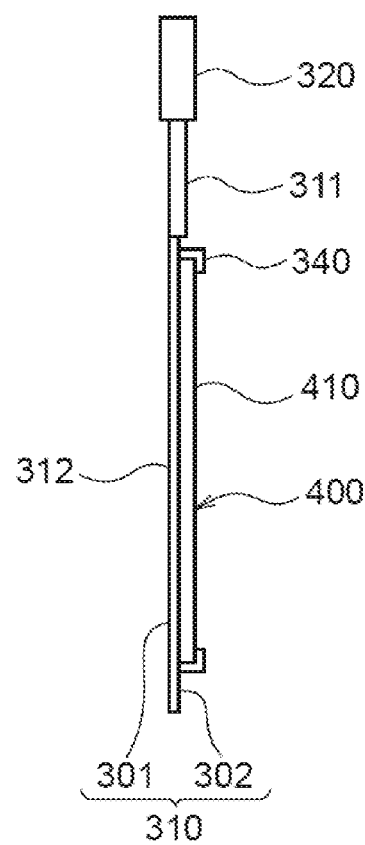
FIG. 2B is a schematic side view of the substrate holder.
Figure 2C:
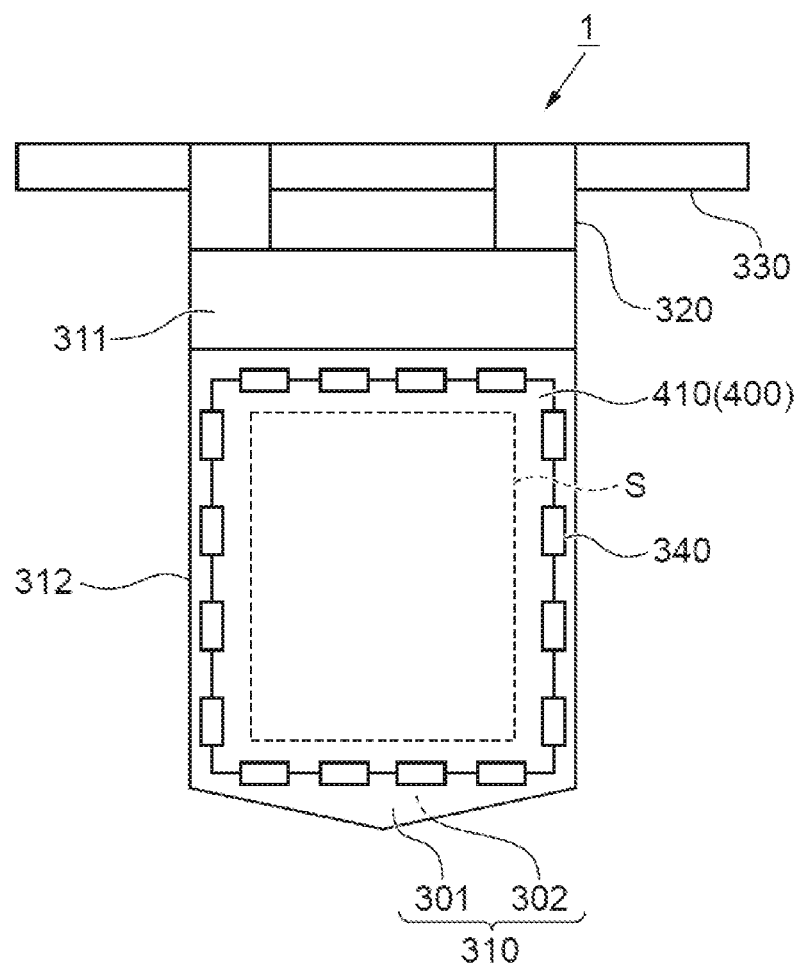
FIG. 2C is a schematic back view of the substrate holder.
Figure 3A:
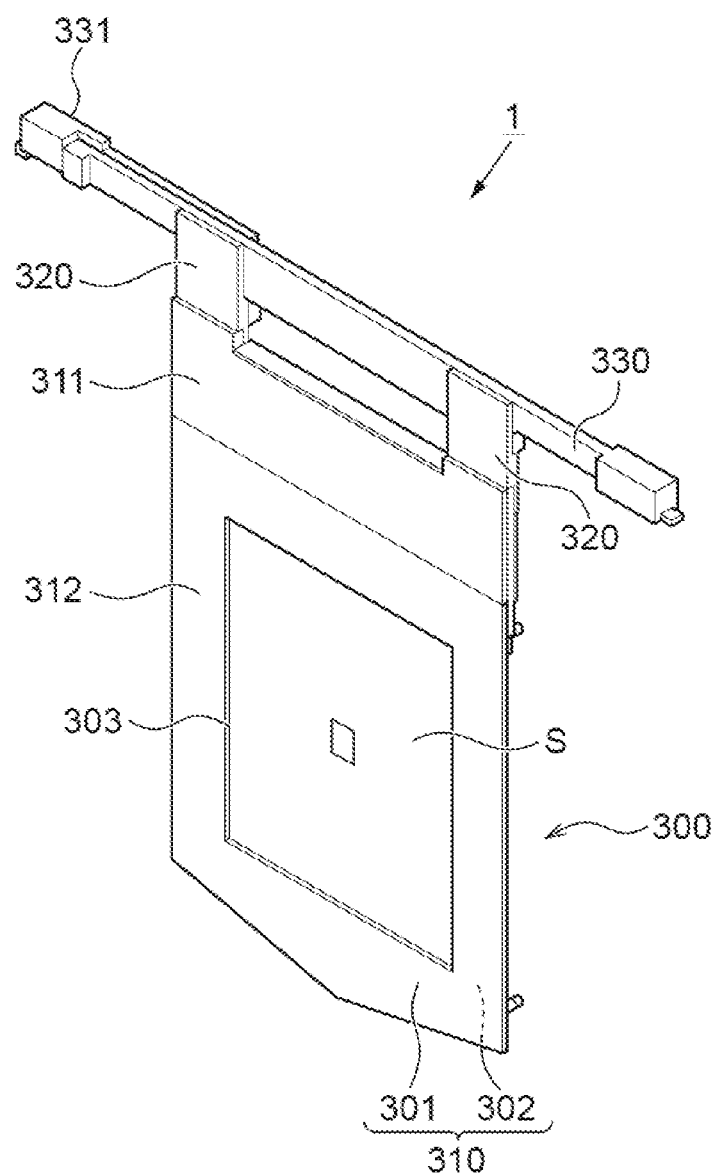
FIG. 3A is a front perspective view of the substrate holder.
Figure 3B:
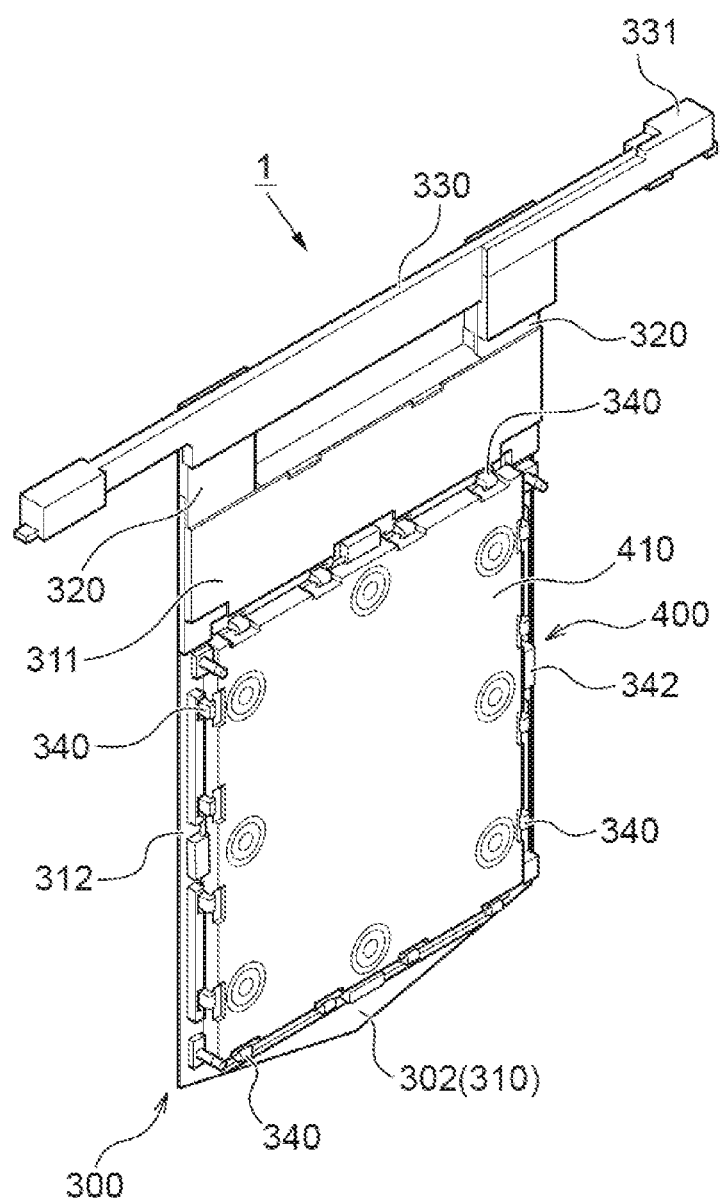
FIG. 3B is a rear perspective view of the substrate holder.
Figure 4A:
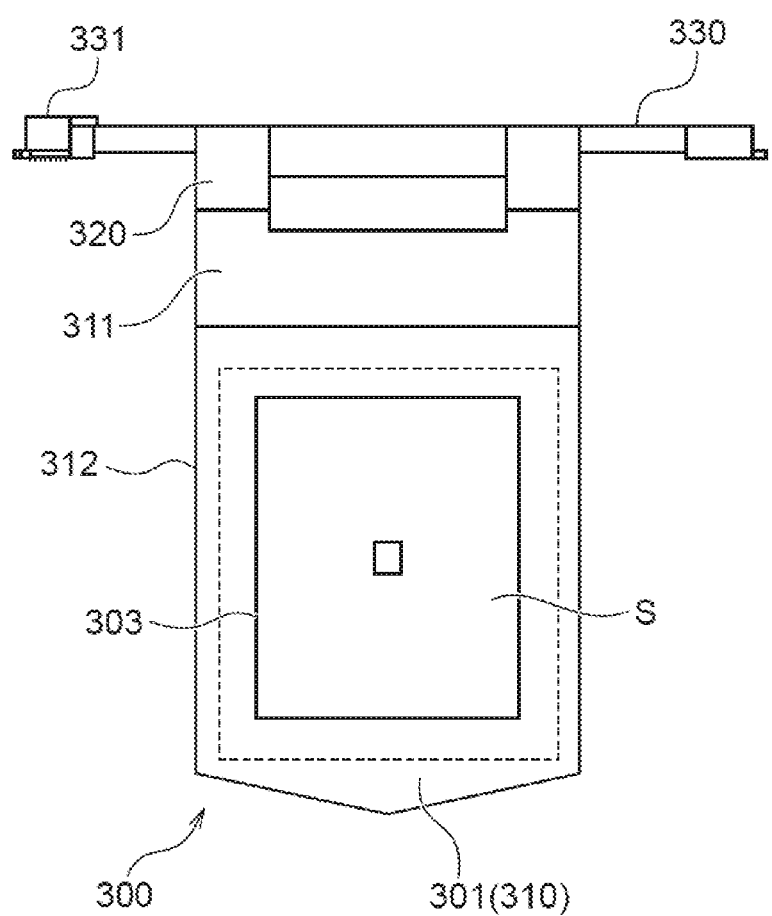
FIG. 4A is a front view of the substrate holder.
Figure 4B:
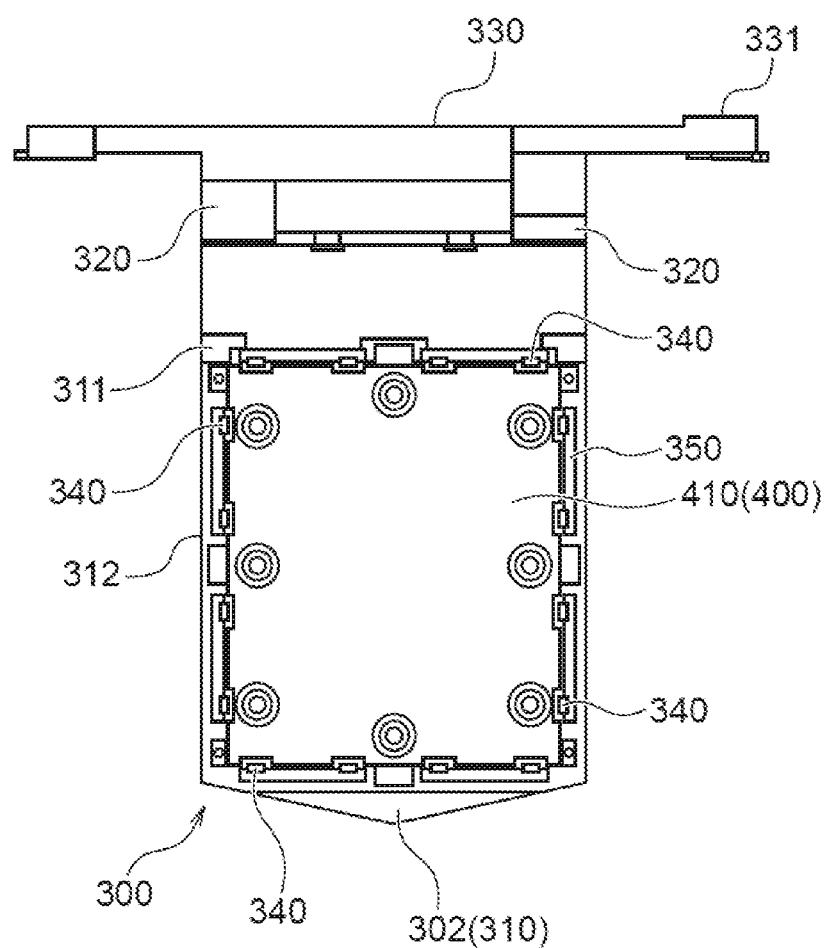
FIG. 4B is a back view of the substrate holder.

FIG. 2A is a schematic front view of the substrate holder according to one embodiment. FIG. 2B is a schematic side view of the substrate holder. FIG. 2C is a schematic back view of the substrate holder. FIG. 3A is a front perspective view of the substrate holder. FIG. 3B is a rear perspective view of the substrate holder. FIG. 4A is a front view of the substrate holder. FIG. 4B is a back view of the substrate holder.

The substrate holder 1 includes a front plate 300 and a back plate 400. A substrate S is held between the front plate 300 and the back plate 400. In this embodiment, the substrate holder 1 holds the substrate S with one surface of the substrate S exposed. The substrate S may be a semiconductor wafer, a glass substrate, a liquid crystal substrate, a printed circuit board or any other object to be plated. The substrate S may have any shape such as a circular shape or a quadrangular shape. In the description made hereinafter, the description is made by taking a substrate having a quadrangular shape as an example. However, a change in shape of an opening portion of the substrate holder 1 allows the substrate holder 1 to hold a substrate having a circular shape or another shape.

The front plate 300 includes a front plate body 310 and an arm portion 330. The arm portion 330 is a grip portion gripped by the substrate holder transporting device 37, and is also a portion to be supported when the front plate 300 is disposed in the plating tank 39. The substrate holder 1 is transported in a vertically standing state with respect to an installation surface of the plating apparatus 100, and the substrate holder 1 is disposed in the plating tank 39 in a vertically standing state.

The front plate body 310 has a substantially rectangular shape. The front plate body 310 includes a wiring buffer portion 311 and a face portion 312, and has a front surface 301 and a back surface 302. The front plate body 310 is mounted on the arm portion 330 by way of two mounting portions 320. An opening portion 303 is formed on the front plate body 310 so that a surface to be plated of the substrate S is exposed through the opening portion 303. In this embodiment, the opening portion 303 is formed into a rectangular shape corresponding to the substrate S having a rectangular shape. When the substrate S is a semiconductor wafer or the like having a circular shape, the opening portion 303 is also formed into a circular shape.

The wiring buffer portion 311 is disposed at a portion of the front plate body 310 on a side close to the arm portion 330. The wiring buffer portion 311 is a region where cables are distributed which reach the front plate body 310 through the arm portion 330. The wiring buffer portion 311 is also a region where cables of extra length are accommodated. The wiring buffer portion 311 is formed with a thickness slightly larger than a thickness of other portions of the front plate body 310 (face portion 312) (see FIG. 2B). In this embodiment, the wiring buffer portion 311 is formed as a separate body from other portions of the front plate body 310 (face portion 312), and is mounted to the face portion 312. A connector 331 is mounted on one end side of the arm portion 330, and the connector 331 is provided for electrically connecting the front plate 300 to external wirings (see FIG. 3A and the like). The back plate 400 is fixed to the back surface 302 of the front plate body 310 (to be more specific, the face portion 312) by clamps 340 (FIG. 2C, FIG. 3B and FIG. 4B).

(Structure for Mounting Back Plate on Front Plate)

Figure 5A:
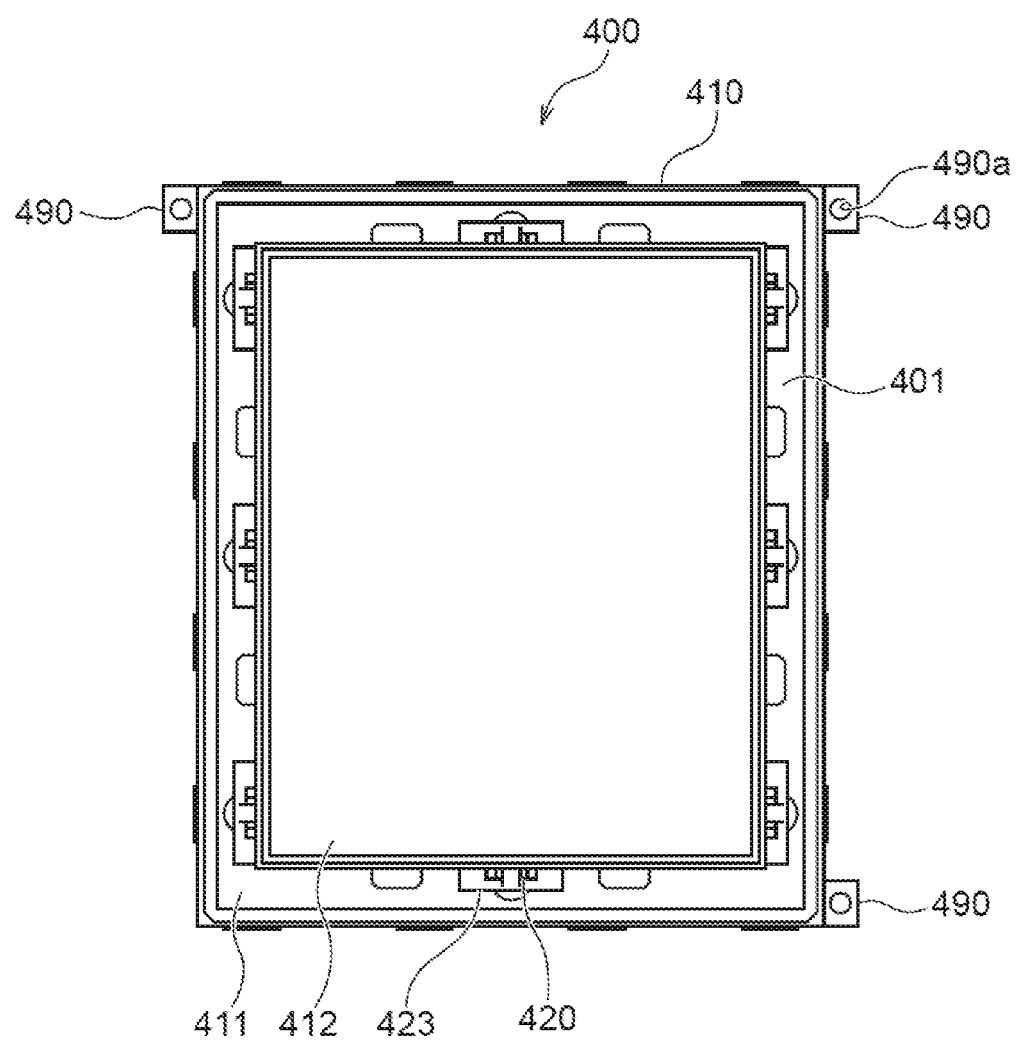
FIG. 5A is a front view of a back plate.
Figure 5B:
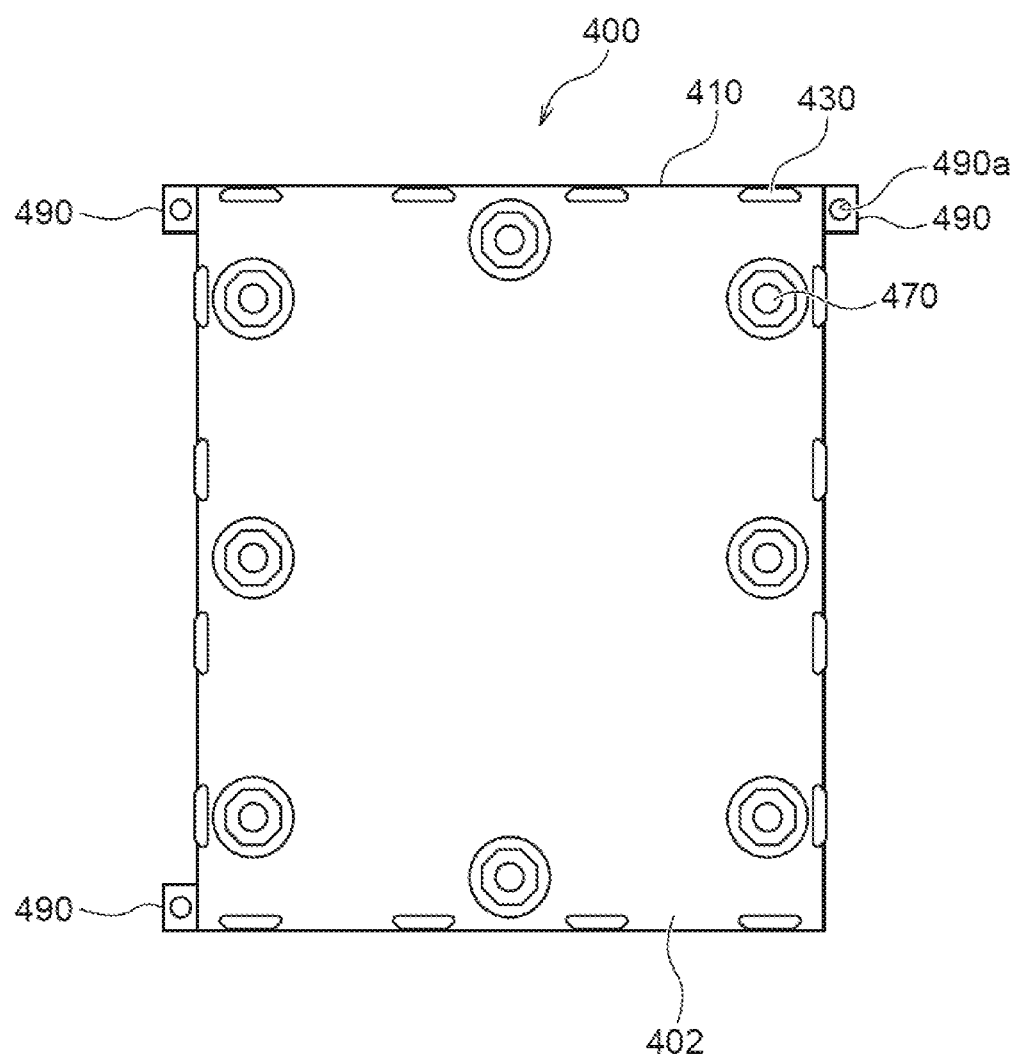
FIG. 5B is a back view of the back plate.
Figure 6A:
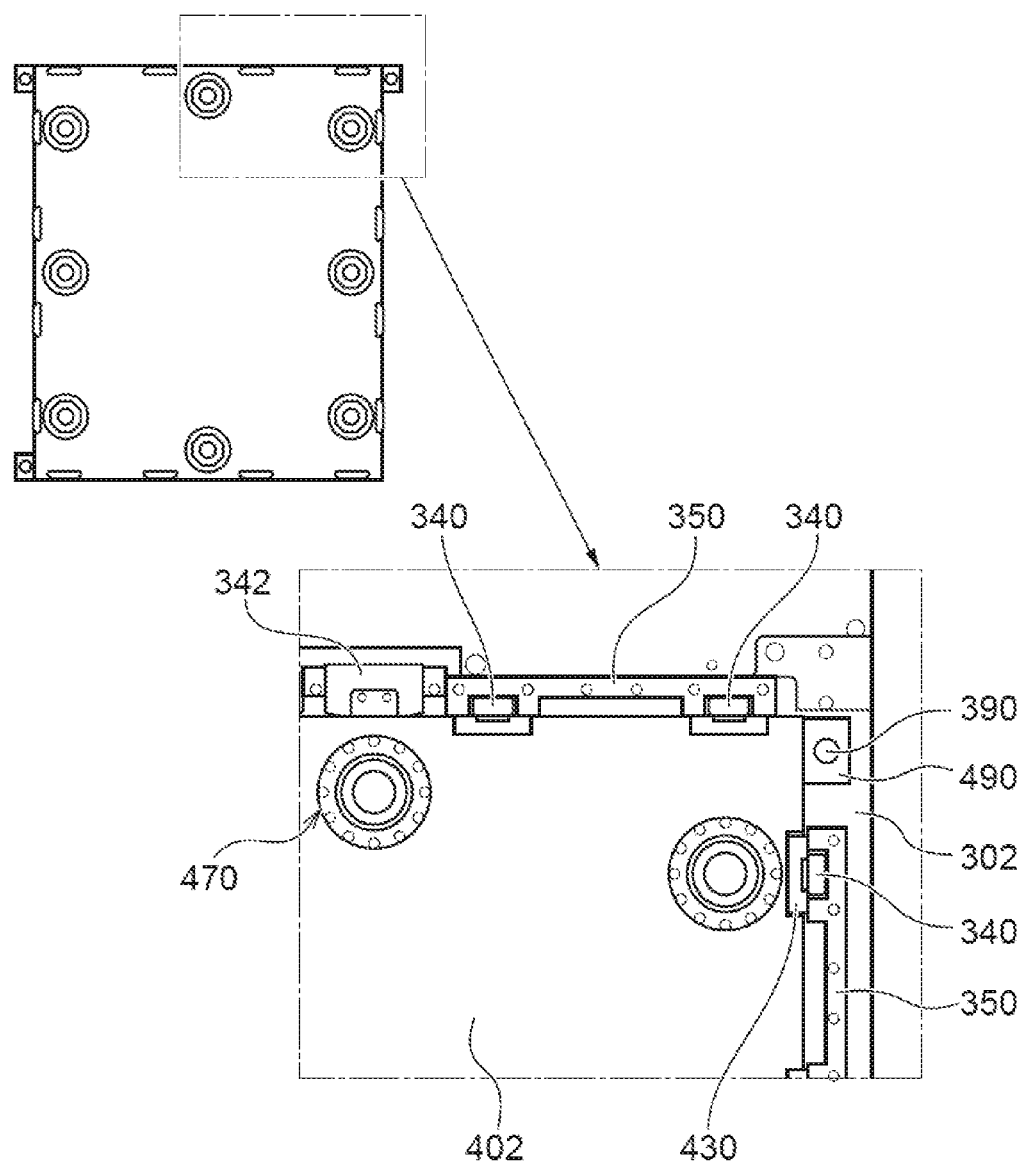
FIG. 6A is a partially enlarged back view of the substrate holder showing a state where the back plate is mounted on a front plate.
Figure 6B:
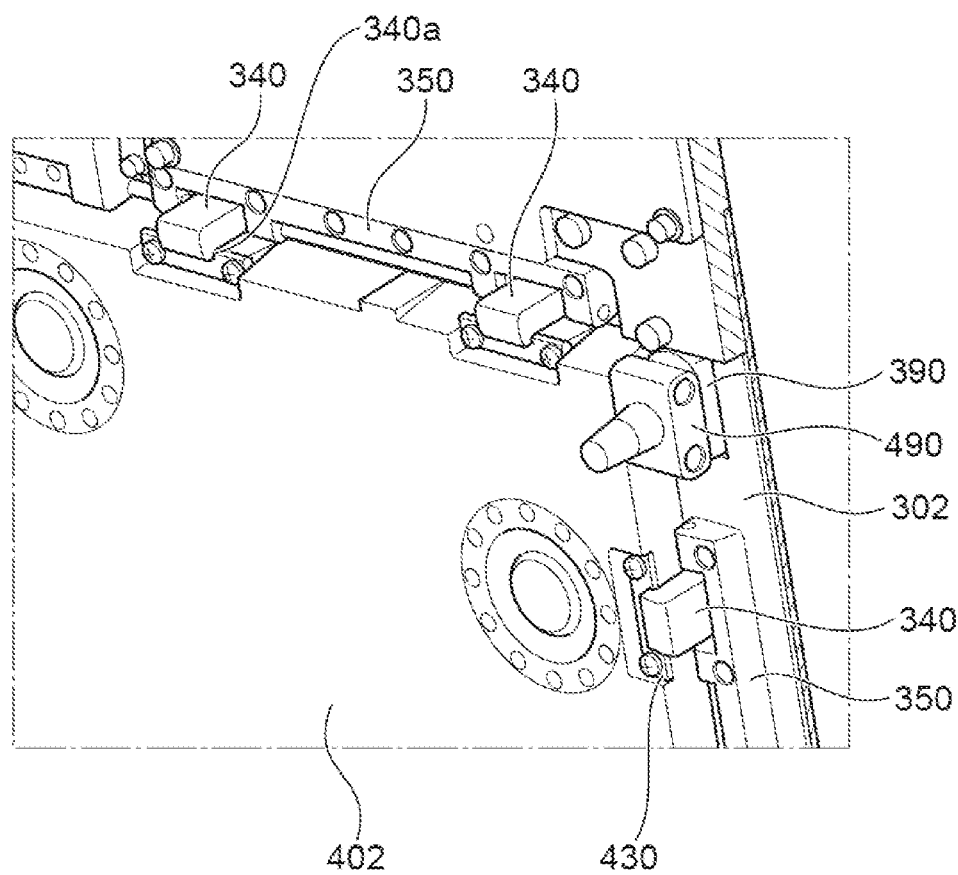
FIG. 6B is a partially enlarged perspective view of the substrate holder showing a state where the back plate is mounted on the front plate.
Figure 7:
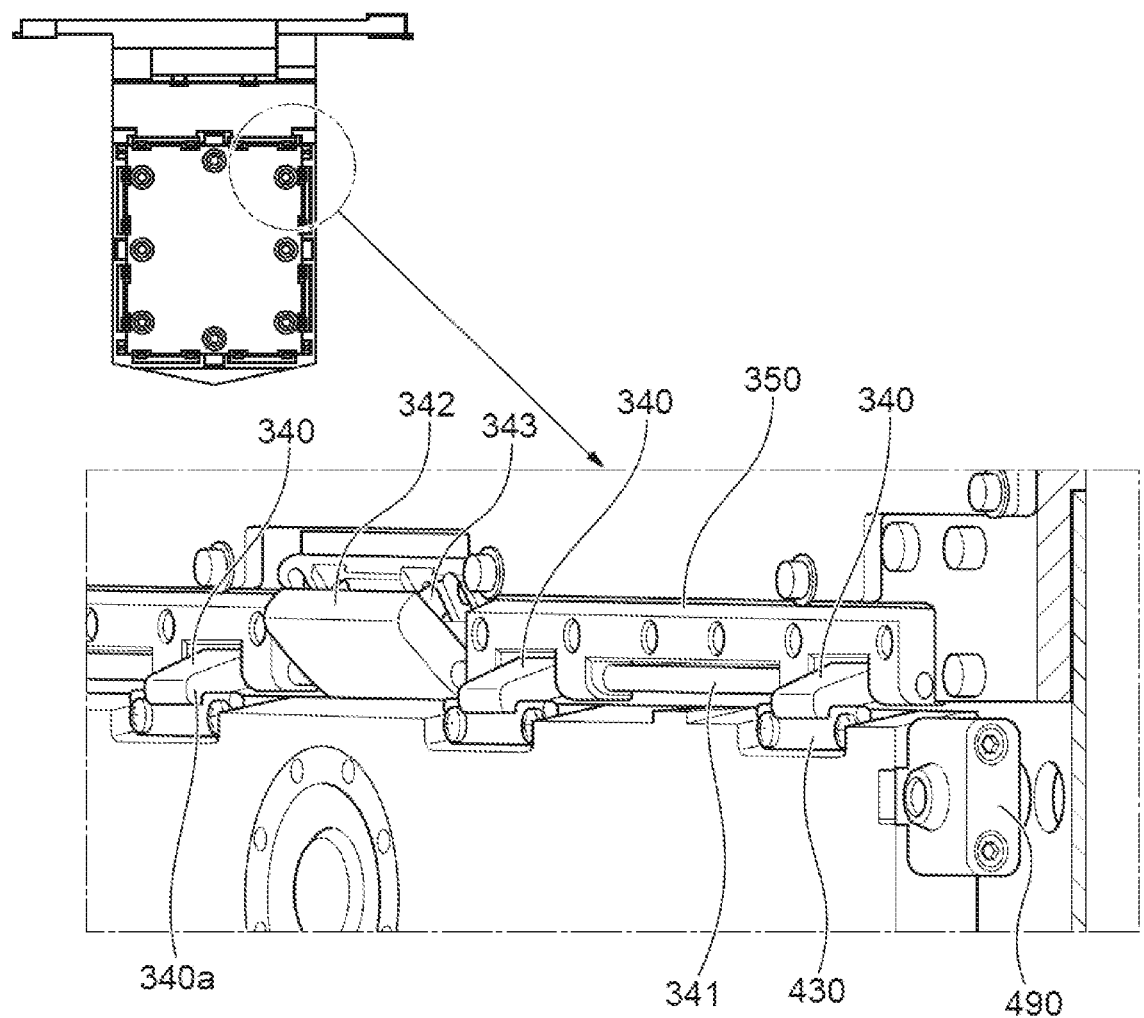
FIG. 7 is a perspective view showing a relationship between clamps and a connecting member.

FIG. 5A is a front view of the back plate. FIG. 5B is a back view of the back plate. FIG. 6A is a partially enlarged back view of the substrate holder showing a state where the back plate is mounted on the front plate. FIG. 6B is a partially enlarged perspective view of the substrate holder showing a state where the back plate is mounted on the front plate. FIG. 7 is a perspective view showing a relationship between the clamps and a connecting member.

The back plate 400 includes a back plate body 410. The back plate body 410 has a substantially rectangular shape, and has a size smaller than the front plate body 310 of the front plate 300 (FIG. 3B and FIG. 4B). The back plate body 410 has a front surface 401 (FIG. 5A) and a back surface 402 (FIG. 5B). The back plate body 410 includes a support base 411 and a movable base 412 (FIG. 5A).

The front surface 401 of the back plate body 410 forms a surface on which a substrate S is placed, and the front surface 401 is mounted on the back surface 302 of the front plate body 310. Eight clip portions 420 in total are mounted on the front surface 401 of the back plate body 410 corresponding to respective sides of the substrate S so as to hold (fix) the substrate S. In this embodiment, one clip portion 420 is provided for an upper side and a lower side of the substrate S respectively, and three clip portions 420 are provided for a left side and a right side of the substrate S respectively. The number and the arrangement of the clip portions 420 may be suitably selected corresponding to a size and a shape of the substrate S, and are not limited to the number and the arrangement of the clip portions 420 shown in the drawings.

Positioning pieces 490 are formed on three corners out of four corners of the back plate body 410. A through hole 490a is formed in each positioning piece 490. The positioning pieces 490 may be integrally formed with the back plate body 410. Alternatively, the positioning pieces 490 may be formed as separate bodies from the back plate body 410, and may be mounted on the back plate body 410. Positioning pins 390 are formed on the back surface 302 of the front plate body 310 at positions corresponding to respective positioning pieces 490 (FIG. 6A and FIG. 6B). The positioning pins 390 may be integrally formed with the front plate body 310. Alternatively, the positioning pins 390 may be formed as separate bodies from the front plate body 310, and may be mounted on the front plate body 310. In mounting the back plate 400 on the front plate 300, the positioning pins 390 are inserted into the through holes 490a of the positioning pieces 490 of the back plate 400 so as to position both the front plate 300 and the back plate 400.

As shown in FIG. 4B, fixing members 350 are disposed on the back surface 302 of the front plate 300 corresponding to four respective sides of the back plate 400. Two fixing members 350 are provided for each one side of the back plate 400, and the two fixing members 350 are disposed in parallel along one side of the back plate 400. As shown in FIG. 6A, FIG. 6B and FIG. 7, two clamps 340 are mounted on each fixing member 350. Accordingly, four clamps 340 are provided for each one side of the back plate 400. A lever 342 is mounted between the two fixing members 350 provided for each side of the back plate 400, and the lever 342 simultaneously operates the four clamps 340. The number of clamps provided for each one side of the back plate 400 is not limited to four, and three or less clamps or five or more clamps may be provided for each one side of the back plate 400.

A rotary shaft 341 is mounted over two fixing members 350 provided for each side of the back plate 400. The rotary shaft 341 is mounted on the fixing members 350 in a rotatable manner (FIG. 7). The respective clamps 340 and the lever 342 are mounted on the rotary shaft 341 in a non-rotatable manner by key connection (a key and a key groove) (FIG. 8A, FIG. 8B, FIG. 9A and FIG. 9B). Four clamps 340 are mounted on the rotary shaft 341 at the same phase. On the other hand, the lever 342 is mounted on the rotary shaft 341 at a phase different from the phase of the four clamps 340. With such a configuration, when the lever 342 rotates, the four clamps 340 rotate synchronously with the rotation of the lever 342. In this embodiment, the configuration is adopted where the clamps 340 rotate about the rotary shaft 341 extending parallel to the surfaces 301, 302 of the front plate body 310. However, the clamps 340 may be configured to reciprocate in the direction perpendicular to the surfaces 301, 302 of the front plate body 310 so as to clamp the back plate 400.

Figure 9A:
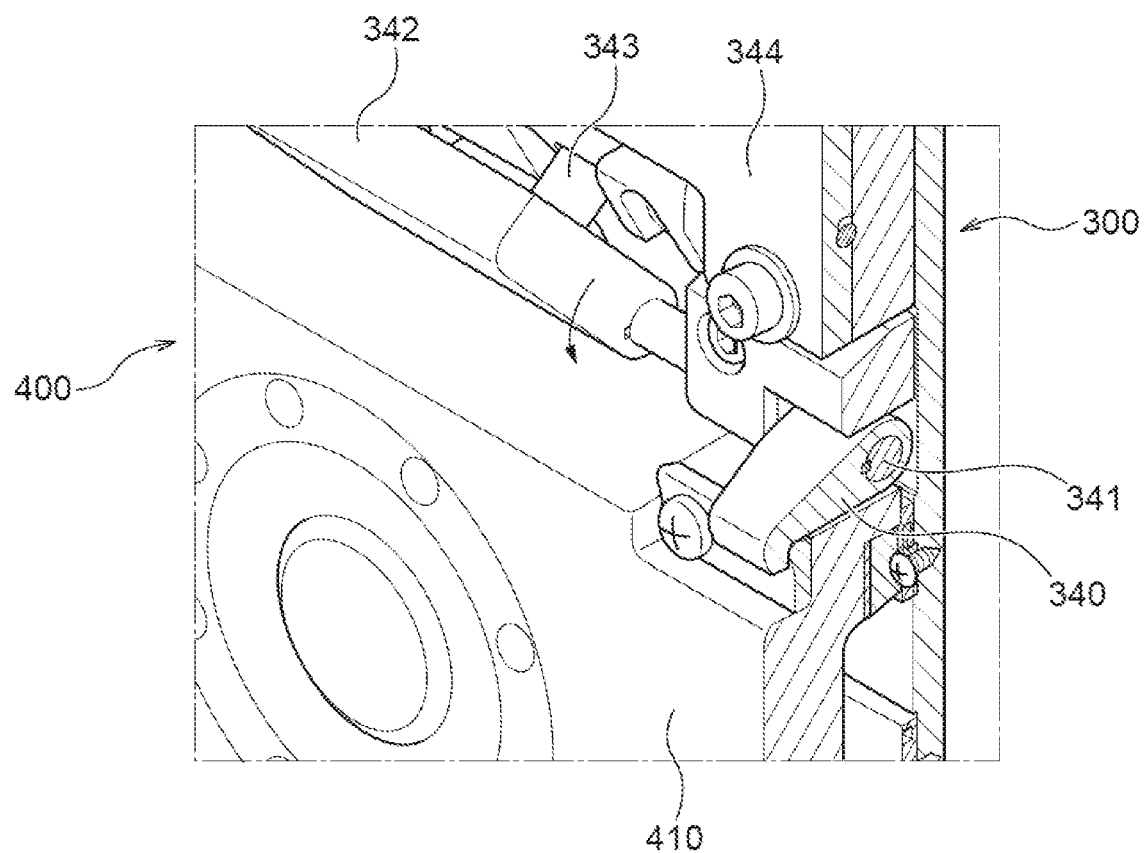
FIG. 9A is a cross-sectional perspective view of the clamp in a clamping state.
Figure 10A:
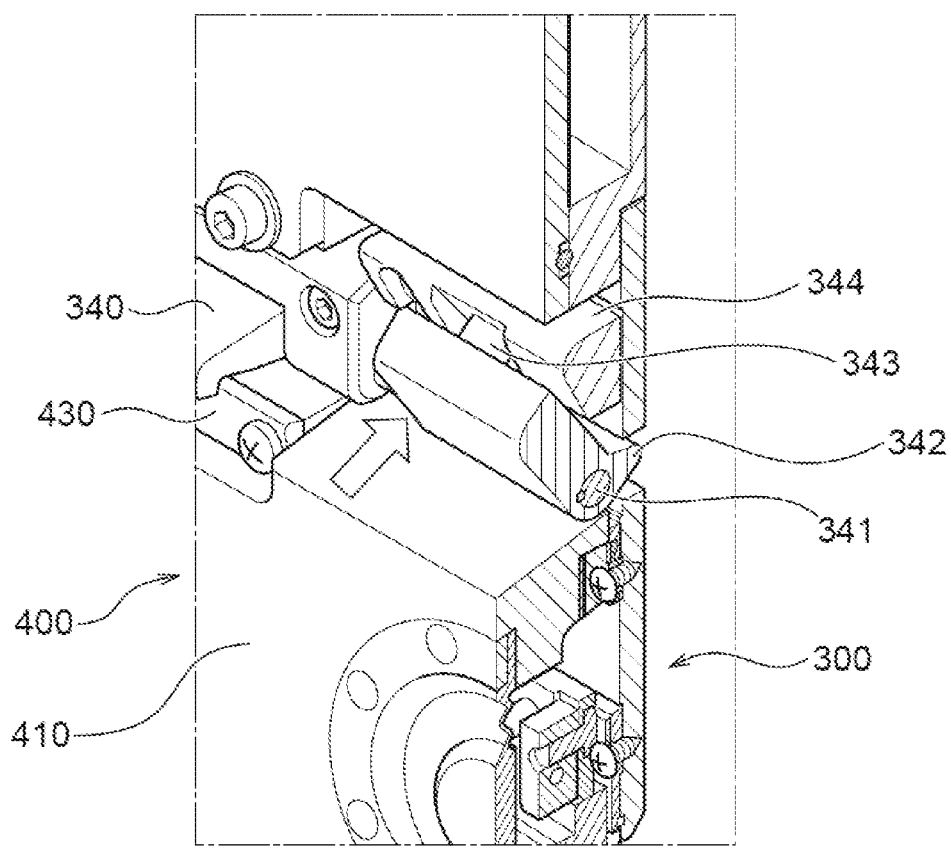
FIG. 10A is a perspective view showing a configuration of the clamp in an unclamping state.
Figure 10B:
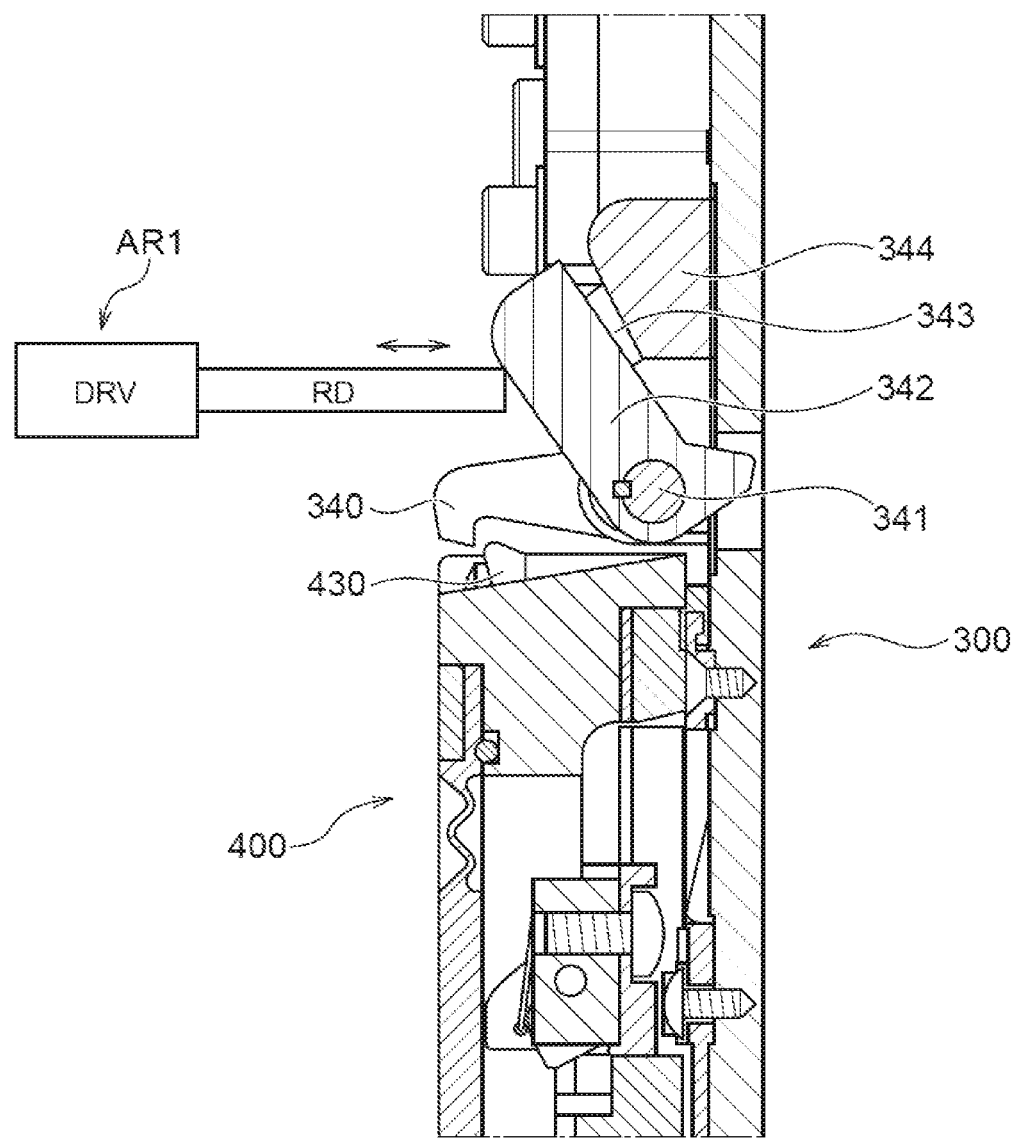
FIG. 10B is a side view of the clamp in an unclamping state.

Each clamp 340 includes an engaging portion 340a, which is bent in a hook shape, at a distal end portion thereof. Each clamp 340 has a through hole on a proximal end side thereof. The rotary shaft 341 is inserted into the through hole of the clamp 340, and the clamp 340 is fixed in a non-rotatable manner by the key and the key groove (see FIG. 9A). When an external force is not applied to the lever 342, as shown in FIG. 7, the lever 342 is biased so as to rise from the back surface 302 of the front plate 300 by a compression spring 343. Due to a biasing force of the compression spring 343, each clamp 340 is biased in the closing direction. In other words, the clamp 340 is formed of a normally-closed type clamp. The lever 342 is formed as a force receiving portion which can receive an external pressing force. For example, the lever 342 can receive a pressing force from an actuator provided to the substrate attaching and detaching mechanism 29. An actuator AR1 is schematically shown in FIG. 10B. The actuator AR1 includes a driving portion DRV such as an air cylinder or a motor, and a rod-like member RD driven by the driving portion DRV, for example. Upon reception of a pressing force from the actuator AR1, the lever 342 rotates in the direction of falling toward the back surface 302 of the front plate 300. Along with the rotation of the lever 342, the clamps 340 rotate in the direction of opening. In this embodiment, four actuators AR1 are provided corresponding to the levers 342 provided for the respective sides of the back plate 400. The four actuators AR1 are preferably driven simultaneously so as to press the levers 342 simultaneously. The four actuators AR1 are not limited to be driven simultaneously, and may be driven individually.

Engagement receiving portions 430 are formed on the back surface 402 of the back plate 400 at positions corresponding to the clamps 340. As described in this embodiment, the engagement receiving portions 430 may be formed as separate bodies from the back plate body 410 of the back plate 400, and may be mounted on the back plate body 410. Alternatively, the engagement receiving portions 430 may be integrally formed with the back plate body 410. A projecting portion 430a is formed on each engagement receiving portion 430. The projecting portion 430a has a shape which allows the hook-shaped engaging portion 340a of the clamp 340 to be caught by and to be engaged with the projecting portion 430a. To enable reliable engagement of the engaging portion 340a of the clamp 340 with the projecting portion 430a, the projecting portion 430a has a larger size than the engaging portion 340a.

Hereinafter, a structure for mounting the back plate 400 on the front plate 300 is described with reference to drawings.

Figure 8A:
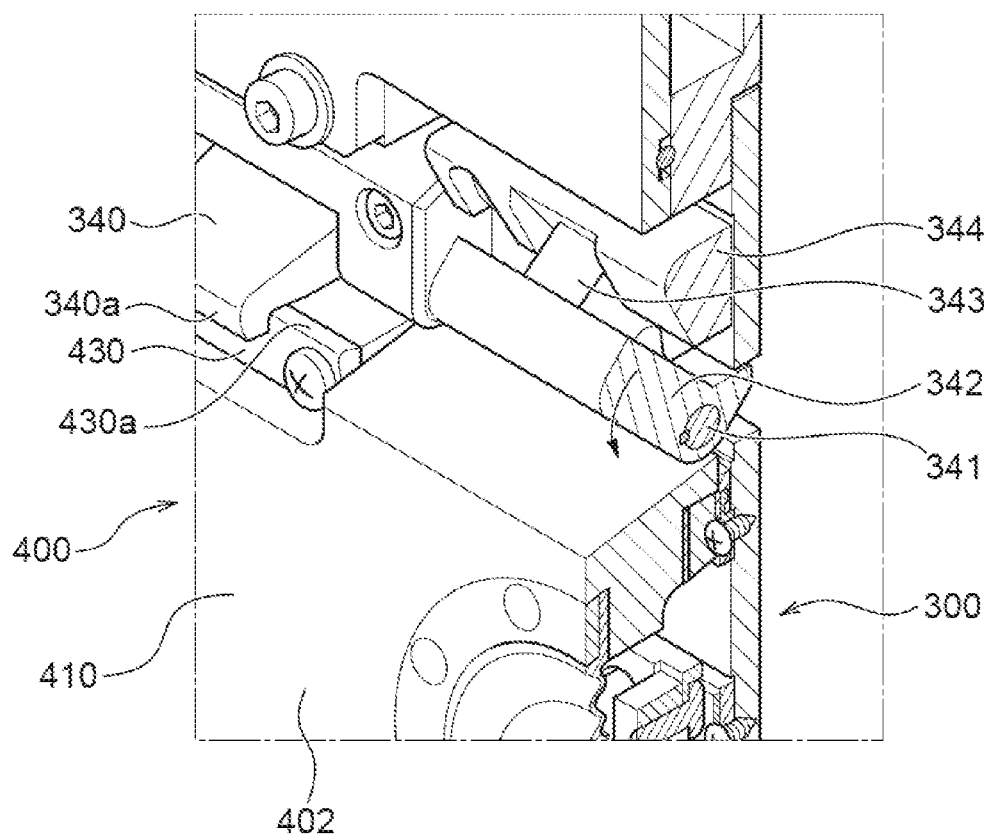
FIG. 8A is a perspective view of the clamp in a clamping state.
Figure 8B:
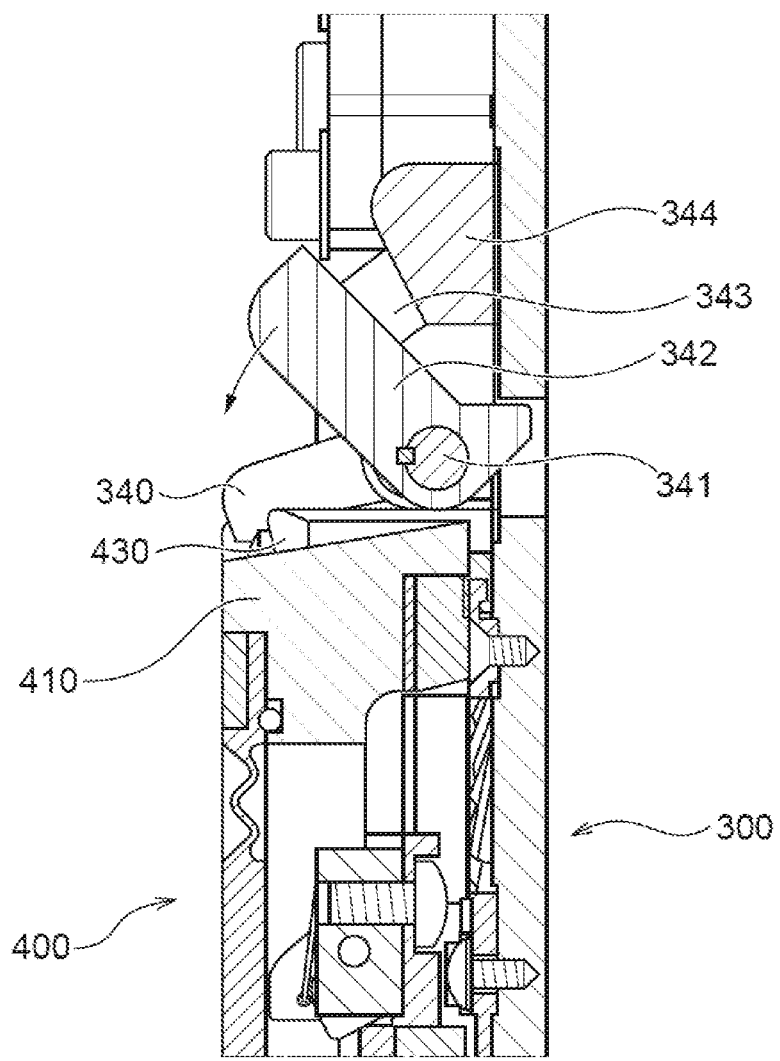
FIG. 8B is a side view of the clamp in a clamping state.
Figure 9B:
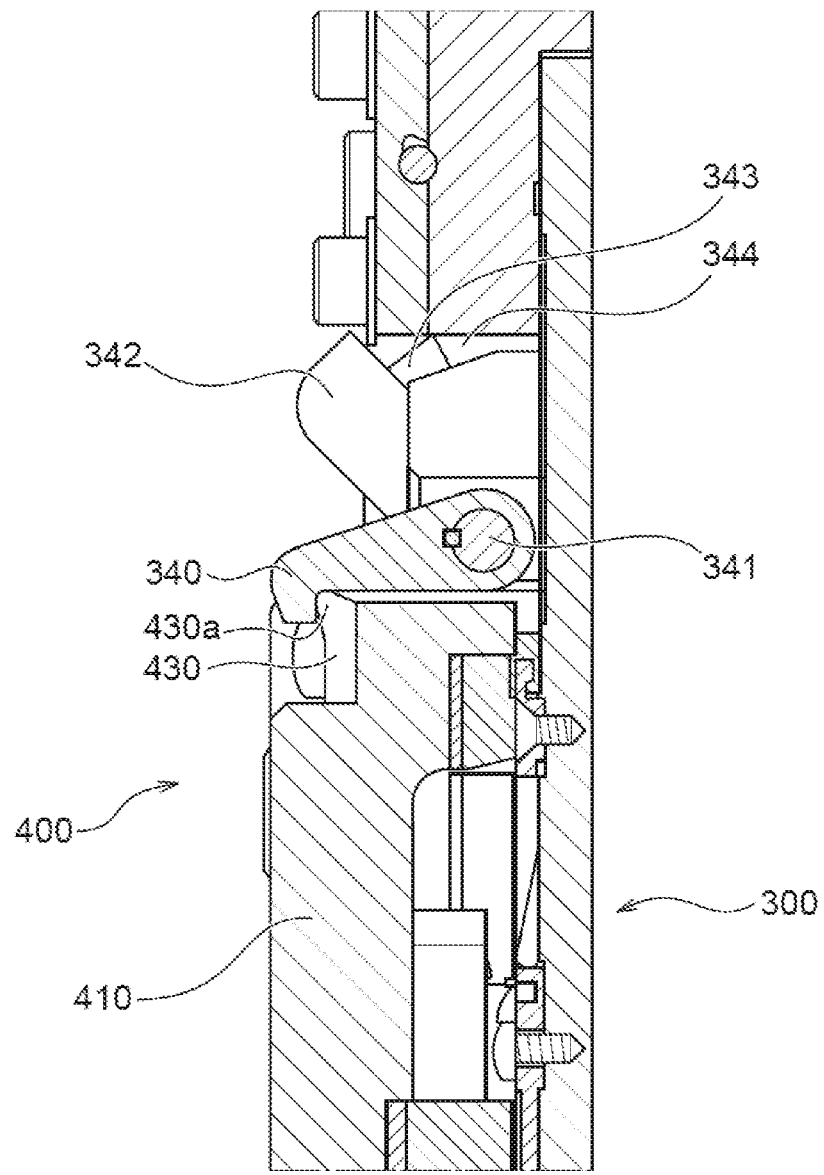
FIG. 9B is a cross-sectional view of the clamp in a clamping state.
Figure 11A:
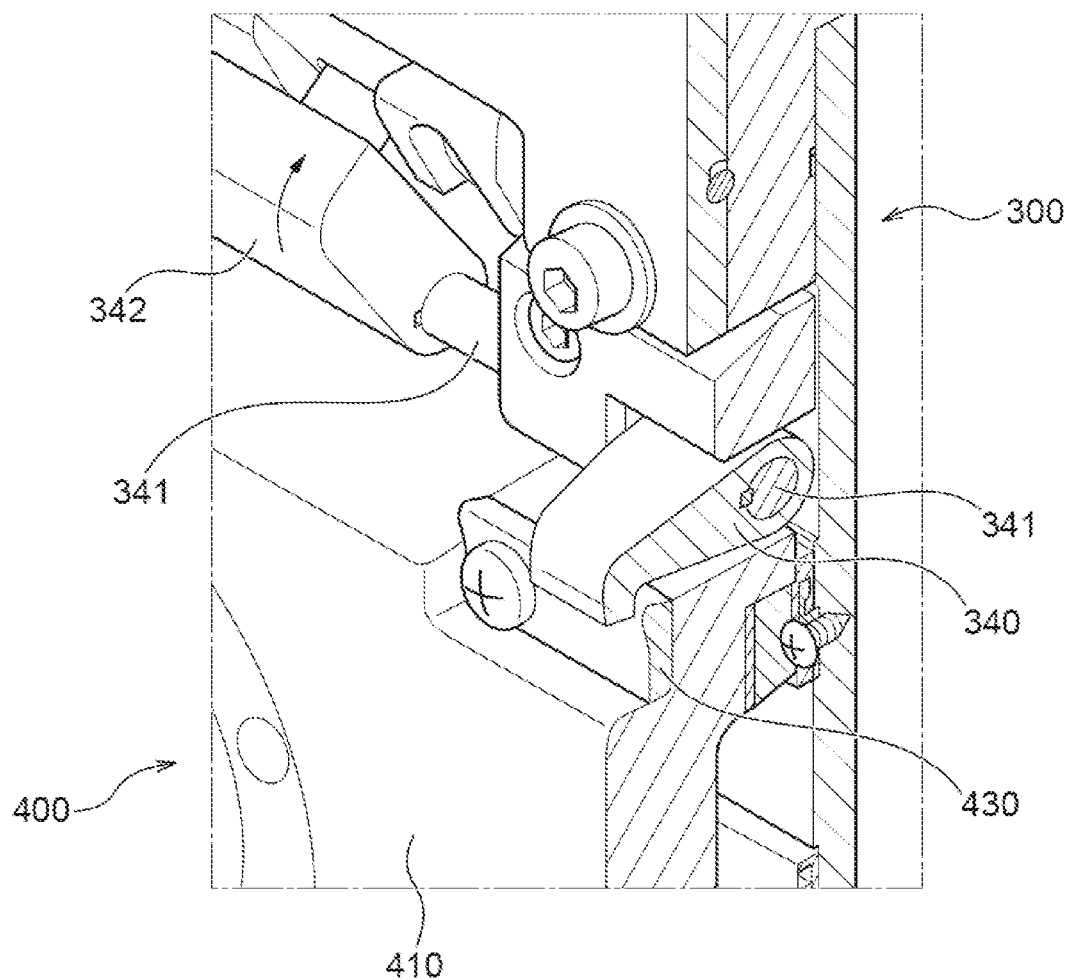
FIG. 11A is a cross-sectional perspective view of the clamp in an unclamping state.
Figure 11B:
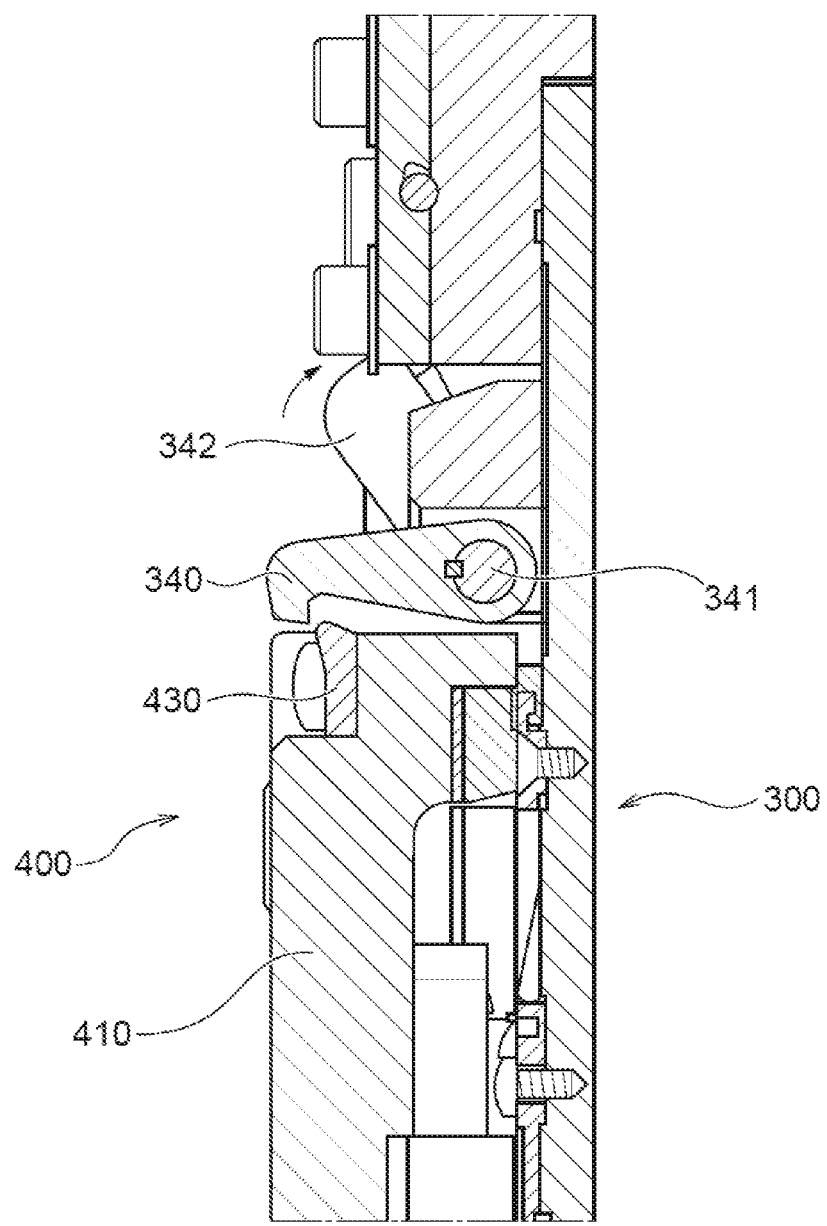
FIG. 11B is a cross-sectional view showing a configuration of the clamp in an unclamping state.

FIG. 8A is a perspective view of the clamp in a clamping state. FIG. 8B is a side view of the clamp in a clamping state. FIG. 9A is a cross-sectional perspective view of the clamp in a clamping state. FIG. 9B is a cross-sectional view of the clamp in a clamping state. FIG. 10A is a perspective view showing a configuration of the clamp in an unclamping state. FIG. 10B is a side view of the clamp in an unclamping state. FIG. 11A is a cross-sectional perspective view of the clamp in an unclamping state. FIG. 11B is a cross-sectional view showing a configuration of the clamp in an unclamping state.

As described above, the clamp 340 is of a normally-closed type. Accordingly, when a pressing force is not applied to the lever 342, as shown in FIG. 8A, FIG. 8B, FIG. 9A and FIG. 9B, the clamp 340 is in a closed state. To mount the back plate 400 on the front plate 300, firstly, a pressing force is applied to each lever 342 of the front plate 300 by the actuator AR1 (FIG. 10B) so as to rotate each clamp 340 in the opening direction against a biasing force of the compression spring 343 as shown in FIG. 10A, FIG. 10B, FIG. 11A and FIG. 11B. In a state where the clamps 340 are opened, the back plate 400 is disposed at a predetermined position on the back surface 302 of the front plate 300. In disposing the back plate 400 on the back surface 302, the positioning pins 390 of the front plate 300 are engaged with the through holes 490a of the positioning pieces 490 of the back plate 400 so that the back plate 400 is positioned at the predetermined position of the front plate 300.

Next, the pressing force of the actuator AR1 is removed from the lever 342 of the front plate 300. With such an operation, the lever 342 rotates toward the original position with a biasing force of the compression spring 343 so that the respective clamps 340 rotate in the closing direction. As a result, the engaging portions 340a of the clamps 340 are engaged with the engagement receiving portions 430 of the back plate 400 so that the back plate 400 is fixed to the front plate 300 (FIG. 8A, FIG. 8B, FIG. 9A and FIG. 9B).

To remove the back plate 400 from the front plate 300, as described above, a pressing force is applied to each lever 342 of the front plate 300 by the actuator (not shown in the drawing) so as to rotate each clamp 340 in the opening direction against a biasing force of the compression spring 343 (FIG. 10A, FIG. 10B, FIG. 11A and FIG. 11B). As a result, the clamps 340 are released from the engagement receiving portions 430 so that the back plate 400 can be removed from the front plate 300.

(Structure for Mounting Substrate on Back Plate)

Figure 12A:
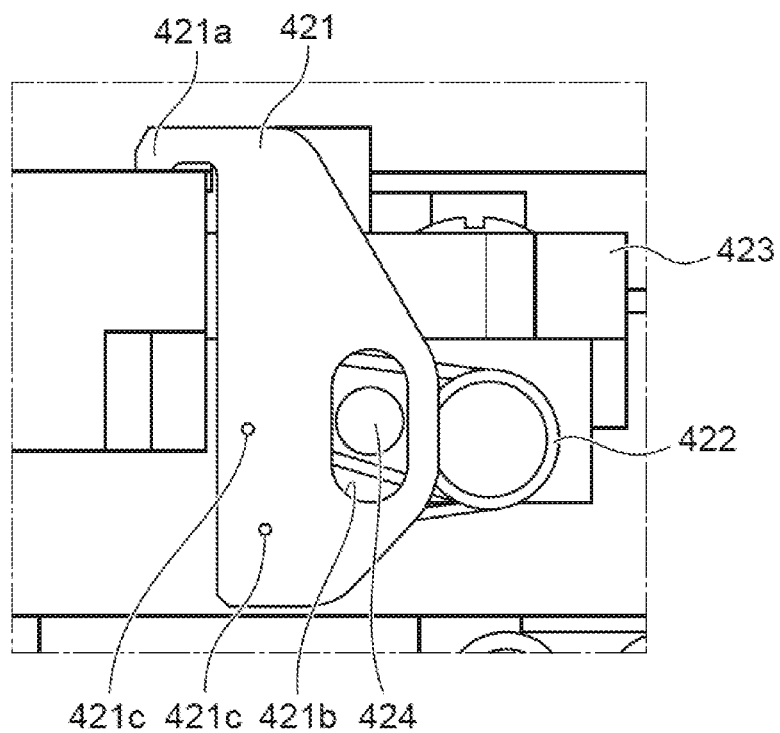
FIG. 12A is a side view with a part cut-away showing a clip of the back plate.
Figure 12B:
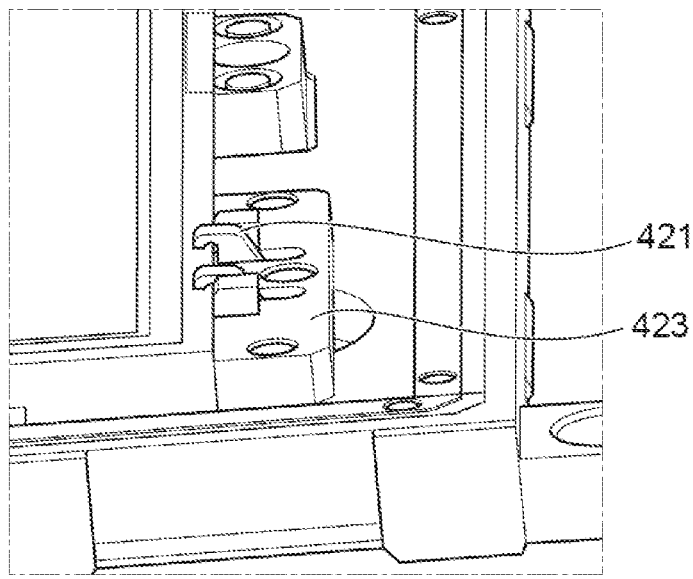
FIG. 12B is a partially enlarged perspective view showing the clips of the back plate.
Figure 13A:
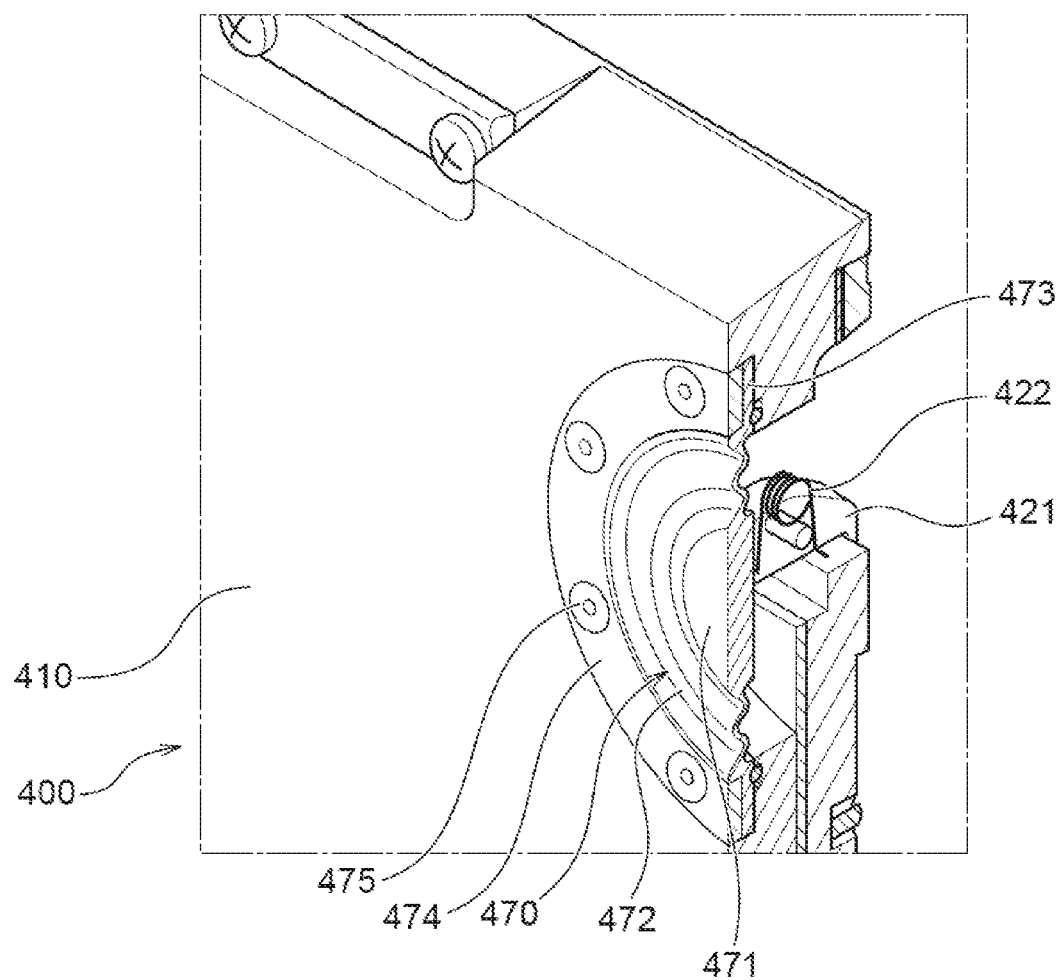
FIG. 13A is a perspective view with a part cut-away showing the clip in a closed state.
Figure 13B:
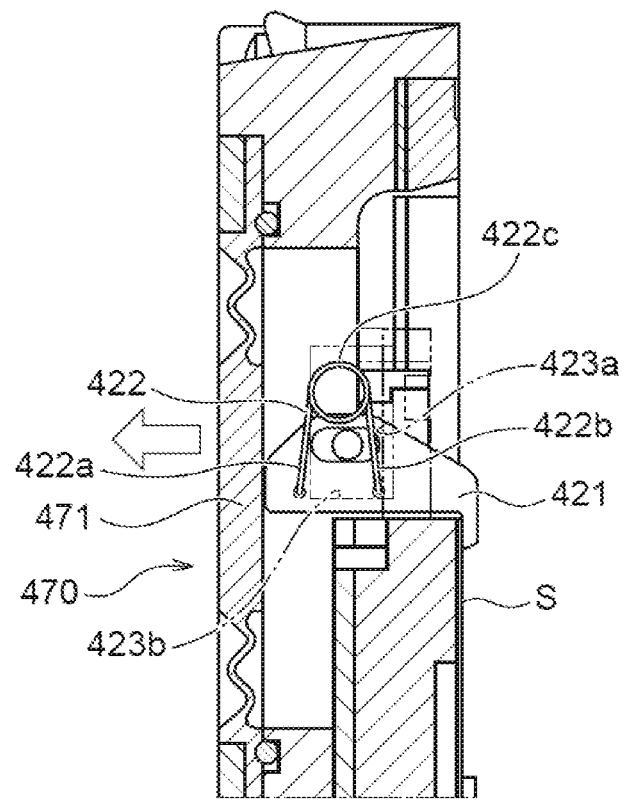
FIG. 13B is a cross-sectional view with a part cut-away showing the clip in a closed state.
Figure 14A:
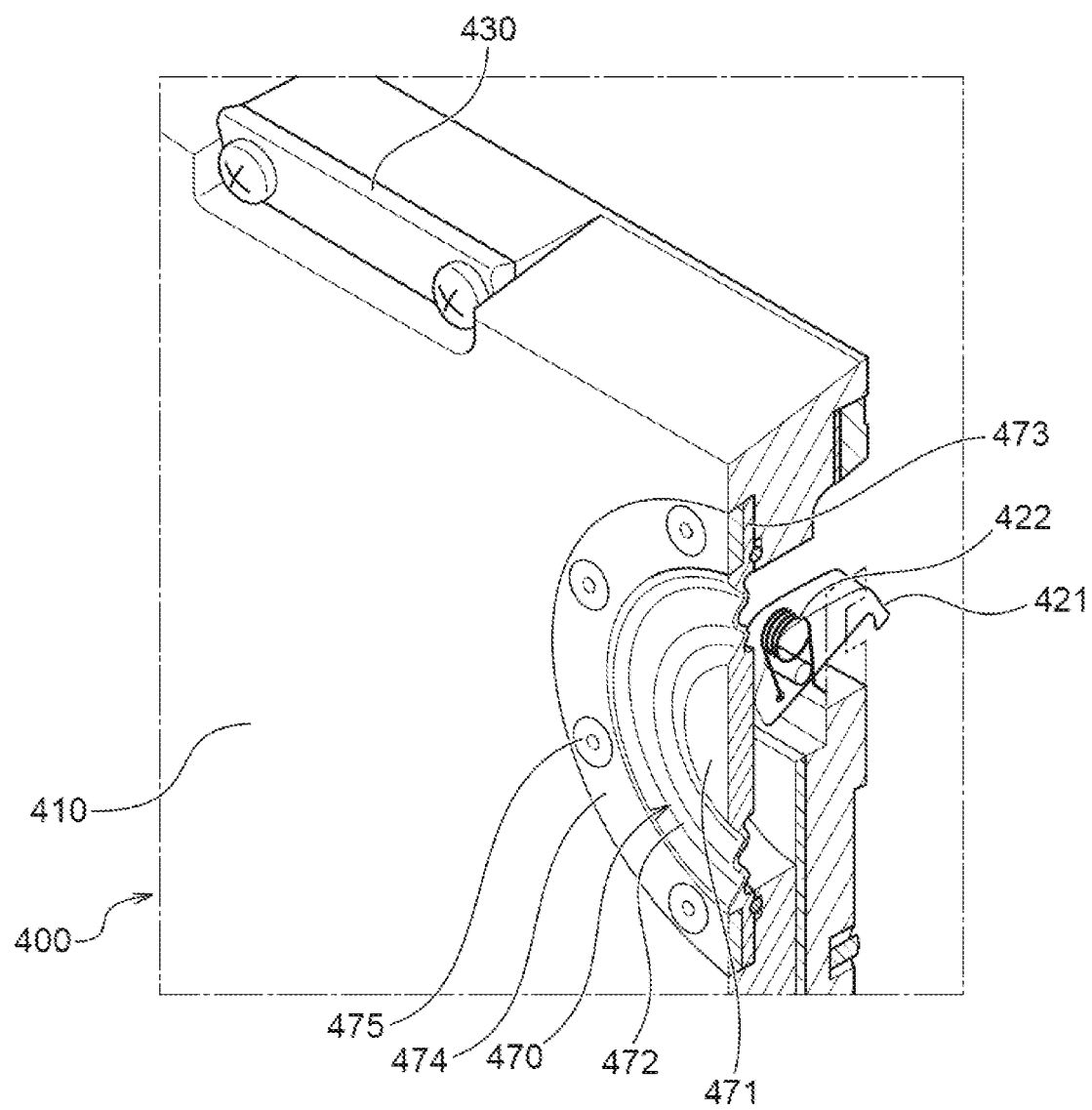
FIG. 14A is a perspective view with a part cut-away showing the clip in an open state.
Figure 14B:
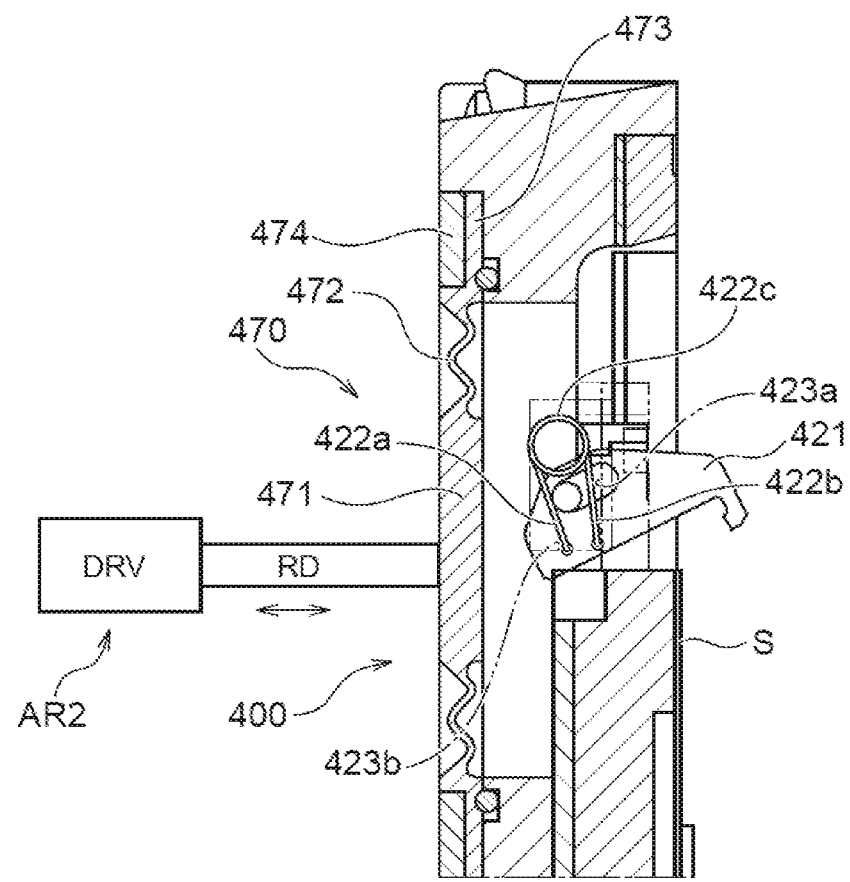
FIG. 14B is a cross-sectional view with a part cut-away showing the clip in an open state.

FIG. 12A is a side view with a part cut-away showing a clip of the back plate. FIG. 12B is a partially enlarged perspective view showing the clips of the back plate. FIG. 13A is a perspective view with a part cut-away showing the clip in a closed state. FIG. 13B is a cross-sectional view with a part cut-away showing the clip in a closed state. FIG. 14A is a perspective view with a part cut-away showing the clip in an open state. FIG. 14B is a cross-sectional view with a part cut-away showing the clip in an open state.

Eight clip portions 420 in total are mounted on the front surface 401 of the back plate 400 corresponding to the respective sides of the substrate S (see FIG. 5A). Buttons 470 are formed on the back surface 402 of the back plate 400 at positions corresponding to the respective clip portions 420 (see FIG. 5B). In a state where a force is not applied to the button 470, a surface of the button 470 on a side of the front surface 401 is disposed with a predetermined distance between the surface of the button 470 and proximal end portions of two clips 421 (FIG. 13B). The button 470 includes: a force receiving portion 471; an elastic portion 472 which supports the force receiving portion 471 in a displaceable manner with respect to the back plate body 410; and a mounting portion 473 formed on an outer periphery of the elastic portion 472. The button 470 is fixed to the back surface 402 at the mounting portion 473 thereof using a pressing member 474 and fastening members 475. The fastening members 475 are studs, bolts or the like, for example.

As shown in FIG. 12A and FIG. 12B, each clip portion 420 includes: a fixed portion 423 fixed to the front surface 401 of the back plate body 410; a fixed shaft 424 fixed to the fixed portion 423 in a non-rotatable manner; two clips 421 supported on the fixed shaft 424 such that the clips 421 are rotatable while moving translationally; and coil springs 422 mounted on the respective clips 421 so as to bias the clips 421 in the closing direction.

Each clip 421 includes a pawl portion 421a at a distal end portion thereof, and an elongated hole 421b and two circular holes 421c are formed in a portion of the clip 421 on the proximal end side. The clips 421 are mounted on the clip portion 420 in such a manner that the fixed shaft 424 is inserted into each elongated hole 421b. As shown in FIG. 13B, the coil spring 422 includes a wound portion 422c and leg portions 422a, 422b extending from the wound portion 422c. The coil spring 422 is formed such that a wire or the like is wound into a circular shape plural times thus forming the wound portion 422c, and the leg portions 422a, 422b having a predetermined length are maintained. The leg portion 422a has a bent portion, which is bent at a substantially right angle, at a distal end thereof, and the bent portion is inserted and fitted into the circular hole 421c which is disposed on the proximal end side out of two circular holes 421c formed in each clip 421. The other leg portion 422b is not mounted on the clip 421. The other leg portion 422b has a bent portion, which is bent at a substantially right angle, at a distal end thereof, and the bent portion is supported in a state of being brought into contact with a restricting surface 423a formed on the fixed portion 423. The leg portion 422a is guided by a guide surface 423b formed on the fixed portion 423 (FIG. 13B and FIG. 14B).

With such a configuration, each clip 421 can rotate toward the outer side of the back plate body 410 while moving in the direction along which the clip 421 is separated from the back plate body 410 (from FIG. 13B to FIG. 14B). As a result, the clip 421 is brought into an open state (FIG. 14A and FIG. 14B). The clip 421 can also rotate reversely toward the inner side of the back plate body 410 while moving in the direction along which the clip 421 approaches the back plate body 410 (from FIG. 14B to FIG. 13B). As a result, the clip 421 is brought into a closed state (FIG. 13A and FIG. 13B). In this embodiment, in a state where an external force is not applied to the clip 421, the clip 421 is biased in the closing direction by the coil spring 422. That is, the clip 421 is of a normally-closed type (FIG. 13A and FIG. 13B). In FIG. 14B, to prevent the drawing from becoming complicated, a state is shown where the force receiving portion 471 of the button 470 is not displaced. However, in an actual operation, the force receiving portion 471 presses the clips 421 in a displaced state toward the clips 421. With such pressing, the clips 421 are brought into an open state.

To place the substrate S on the back plate 400, an external pressing force is applied to eight buttons 470 (force receiving portions 471) of the back plate 400 by actuators AR2 (FIG. 14B). With such an operation, as shown in FIG. 14A and FIG. 14B, each force receiving portion 471 is displaced toward the side of the front surface 401 thus being brought into contact with the proximal end portions of two clips 421. With the force received from the force receiving portion 471, as shown in FIG. 14B, each clip 421 rotates toward the outer side of the back plate body 410 while moving in the direction along which the clip 421 is separated from the back plate body 410 so that the clip 421 is brought into an open state (FIG. 14B). As schematically shown in FIG. 14B, the actuator AR2 includes a driving portion DRV such as an air cylinder or a motor, and a rod-like member RD driven by the driving portion DRV, for example. Eight actuators AR2 are provided corresponding to eight buttons 470. The eight actuators AR2 are preferably driven simultaneously so as to press the buttons 470 simultaneously. The eight actuators AR2 are not limited to be driven simultaneously, and may be driven individually.

In a state where the clips 421 are in an open state, the substrate S is placed at a predetermined position on the front surface 401 of the back plate 400. Thereafter, a pressing force applied to the buttons 470 by the actuators AR2 is released. As a result, each clip 421 is rotated toward the inner side of the back plate body 410 while being moved in the direction along which the clip 421 approaches the back plate body 410 with a biasing force of the coil spring 422 so that the clip 421 is brought into a closed state (from FIG. 14B to FIG. 13B). At this stage of operation, the pawl portion 421a formed on the distal end of each clip 421 is engaged with a peripheral edge portion of the substrate S thus fixing the substrate S to the front surface 401 of the back plate 400.

The back plate 400 on which the substrate S is mounted as described above is mounted on the front plate 300 as described with reference to FIG. 5 to FIG. 13. With such an operation, mounting of the substrate S on the substrate holder 1 is completed. To remove the substrate S from the back plate 400, as described previously, an external pressing force is applied to the eight buttons 470 (force receiving portions 471) of the back plate 400 by the actuators AR2 (FIG. 14A and FIG. 14B).

In this embodiment, the configuration is adopted where the clips 421 rotate about the fixed shaft 424 extending parallel to the surfaces 401, 402 of the back plate body 410. However, the clips 421 may be configured to reciprocate in the direction perpendicular to the surfaces 401, 402 of the back plate body 410 so as to clamp the substrate S.

(Configuration of Seal Portion)

Figure 15:
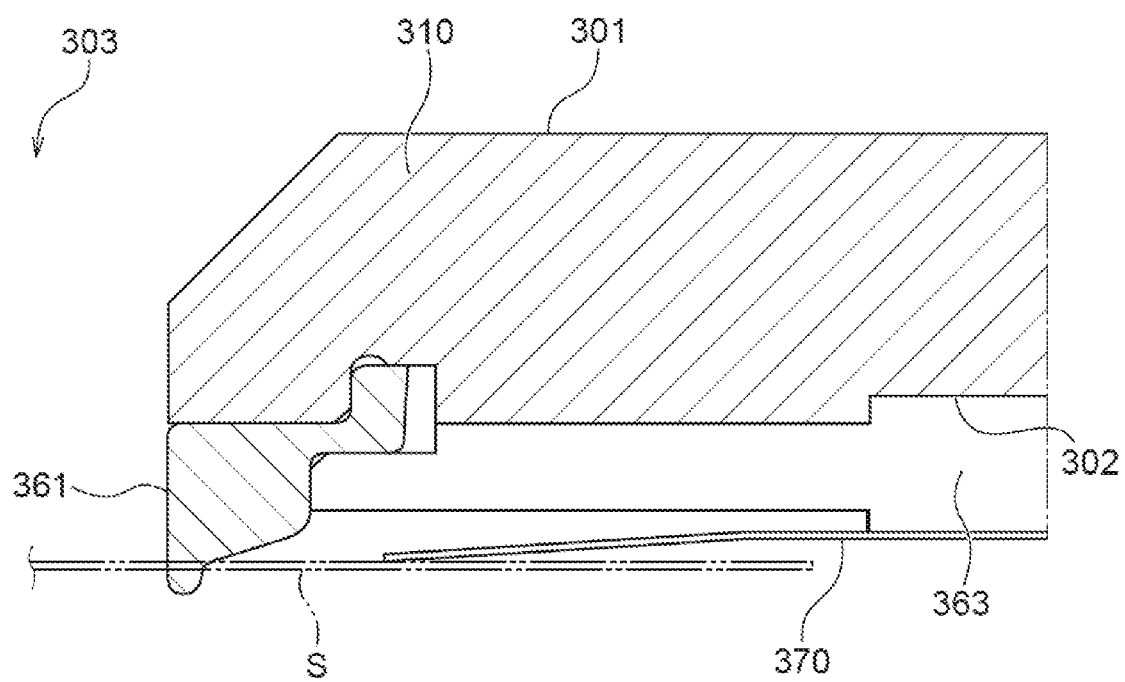
FIG. 15 is a cross-sectional view showing an inner seal portion of the front plate.
Figure 16:
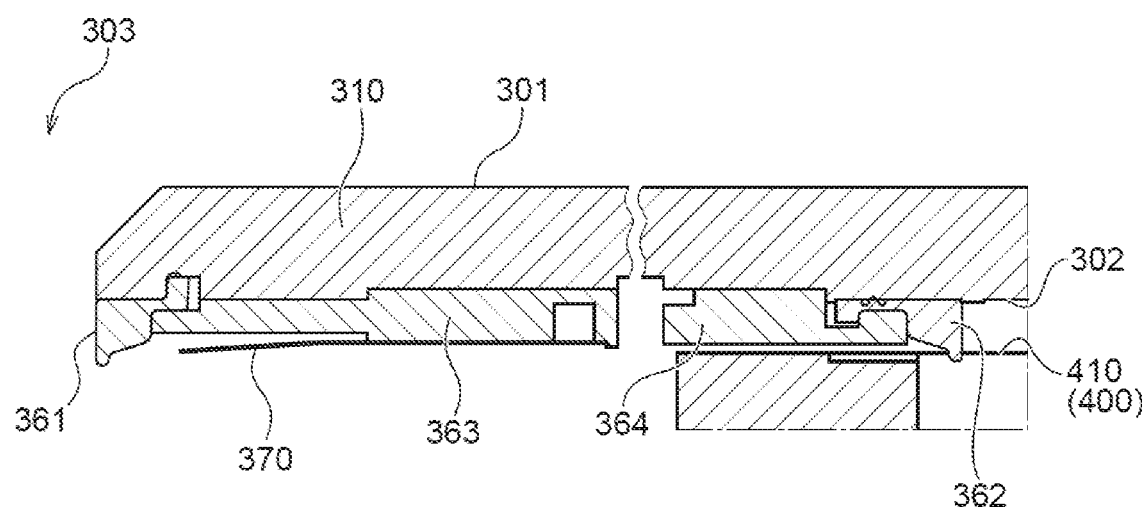
FIG. 16 is a cross-sectional view showing the inner seal portion and an outer seal portion of the front plate.

FIG. 15 is a cross-sectional view showing an inner seal portion of the front plate. FIG. 16 is a cross-sectional view showing the inner seal portion and an outer seal portion of the front plate.

An inner seal 361 is mounted on the back surface 302 of the front plate 300 such that the inner seal 361 is disposed adjacently to the opening portion 303. The inner seal 361 is mounted on the back surface 302 of the front plate 300 by a seal holder 363. The inner seal 361 provides sealing between the substrate S and the front plate 300 thus preventing a plating solution from intruding into an end portion of the substrate S. A contact 370 for supplying a potential to the substrate S is mounted on the seal holder 363.

As shown in FIG. 16, an outer seal 362 is mounted on the back surface 302 of the front plate 300 by a seal holder 364 at a position outside the inner seal 361. The outer seal 362 is brought into contact with the back plate 400 thus providing sealing between the front plate 300 and the back plate 400.

In this embodiment, the seal holder 363 for mounting the inner seal 361 and the seal holder 364 for mounting the outer seal 362 are formed of separate members and hence, the inner seal 361 and the outer seal 362 can be individually replaced.

(Electrical Wiring)

Figure 17:
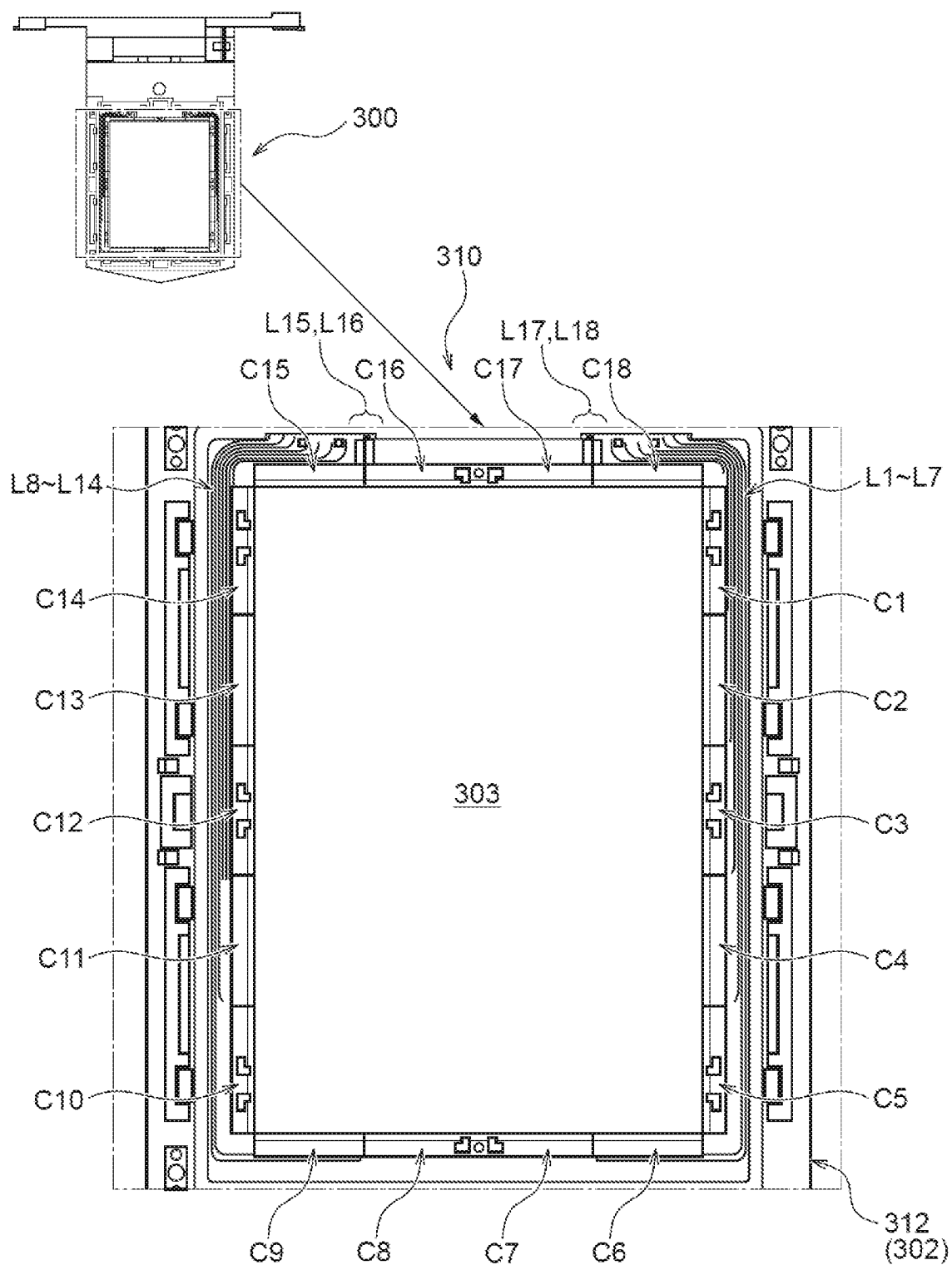
FIG. 17 is a back view of a front plate body.
Figure 18:
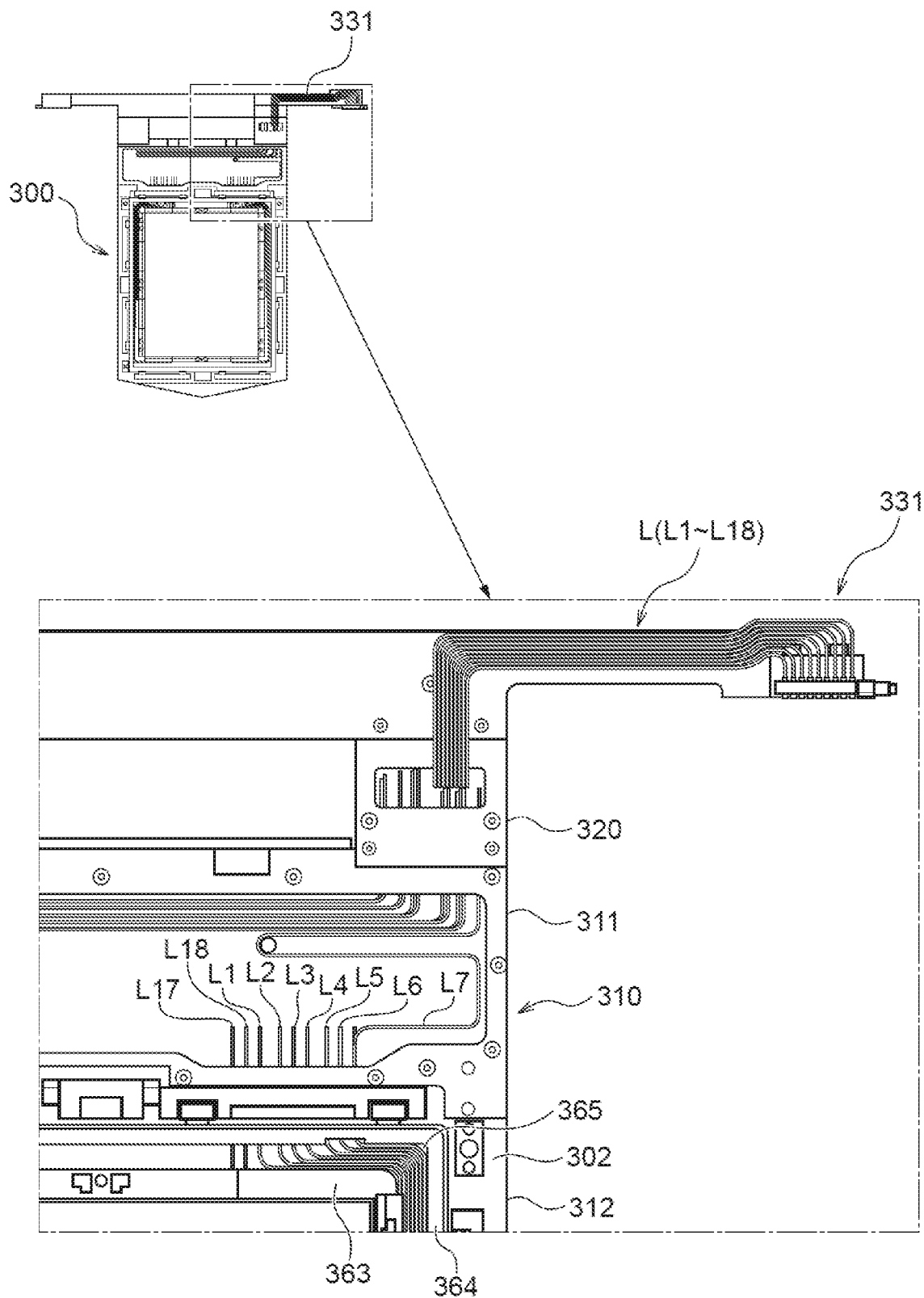
FIG. 18 is a partially enlarged plan view of a region of the front plate which includes a connector.
Figure 19A:
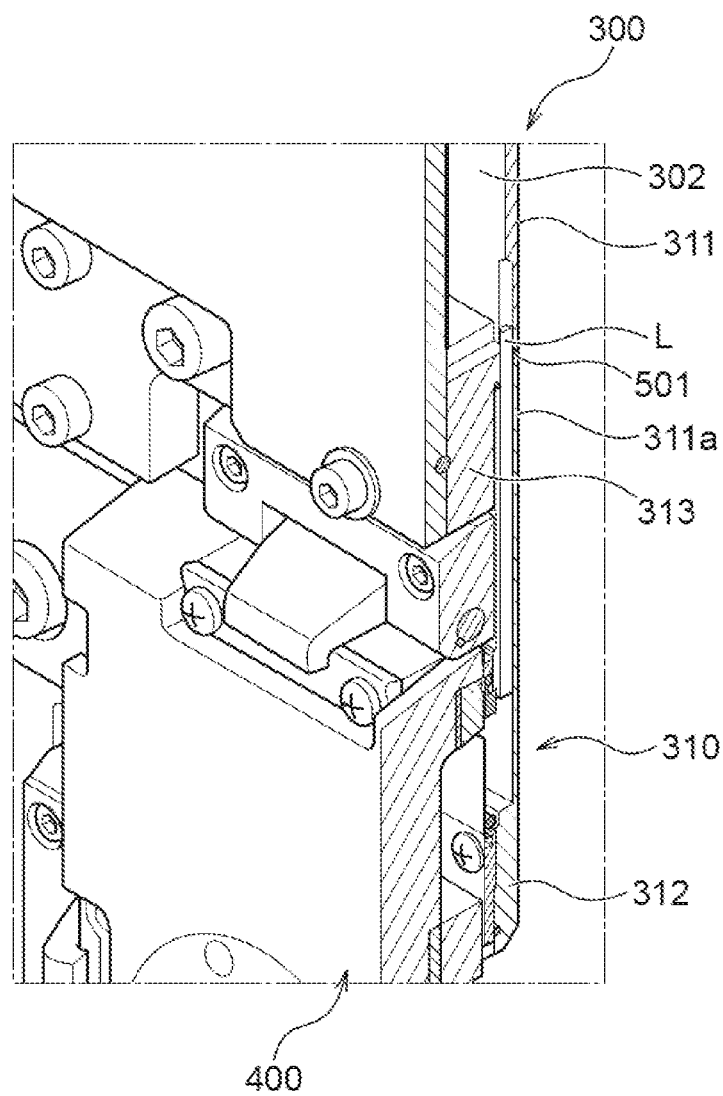
FIG. 19A is a cross-sectional perspective view of the front panel.
Figure 19B:
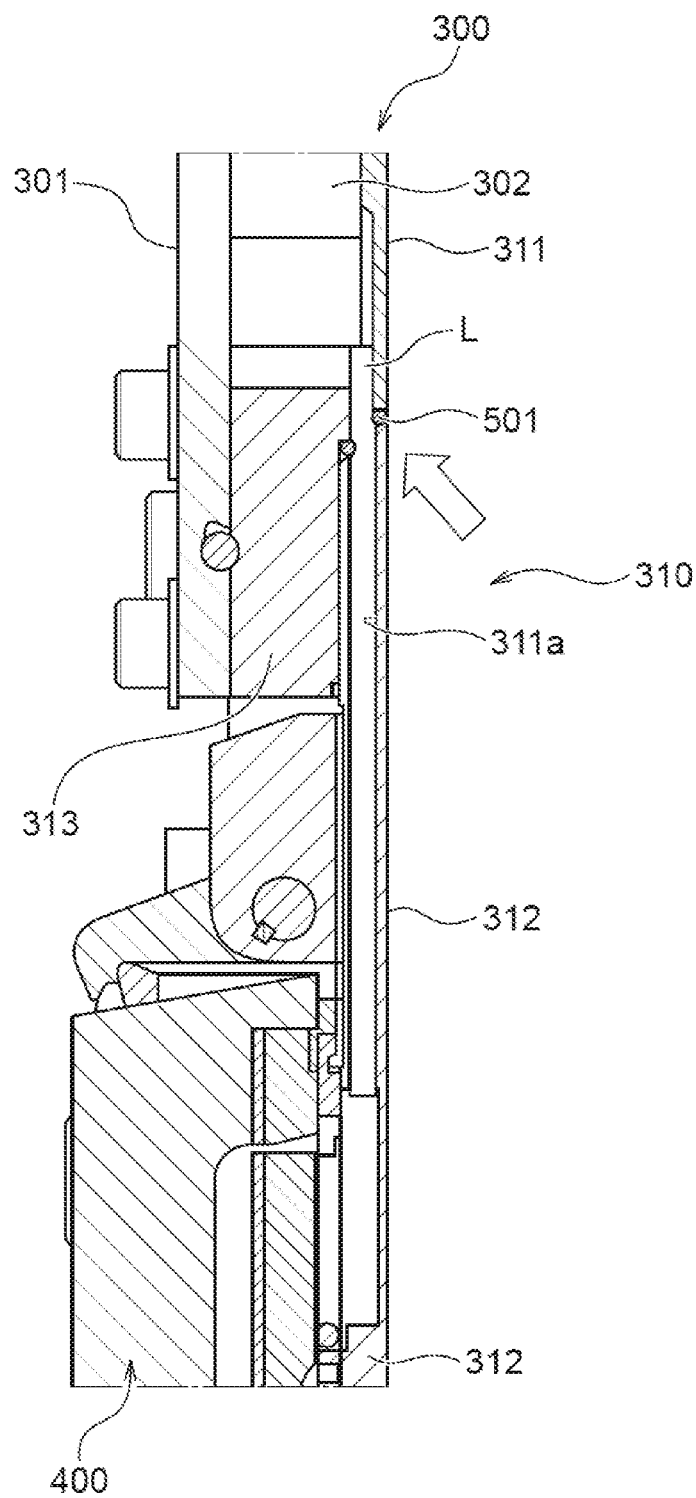
FIG. 19B is a cross-sectional view of the front panel.
Figure 19C:
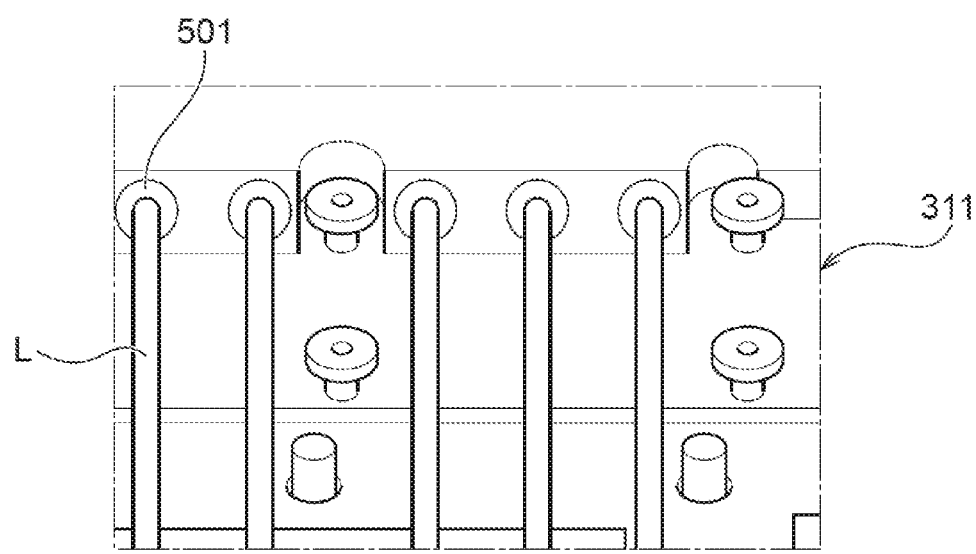
FIG. 19C is a partially enlarged perspective view of the front panel showing the arrangement of cables.
Figure 20A:
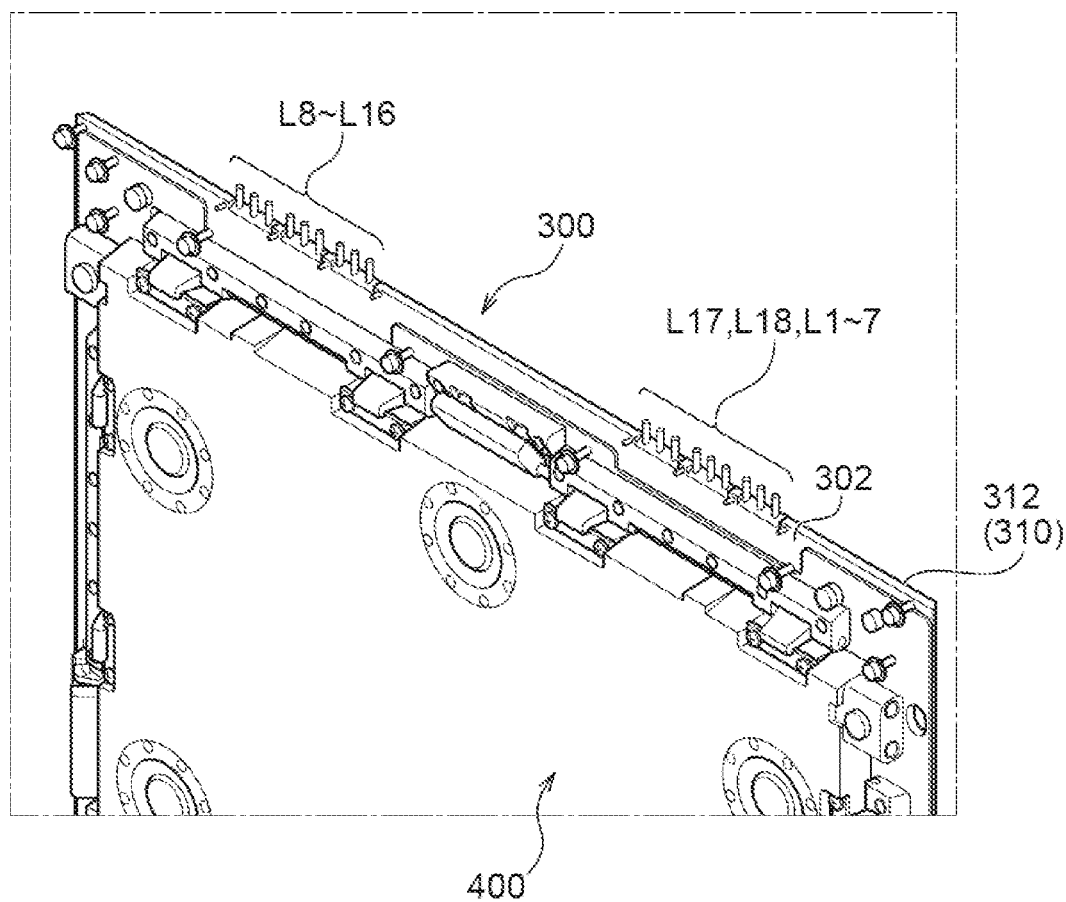
FIG. 20A is a perspective view of a portion of a face portion in the vicinity of the position where the cables are introduced with the illustration of a wiring buffer portion omitted.
Figure 20C:
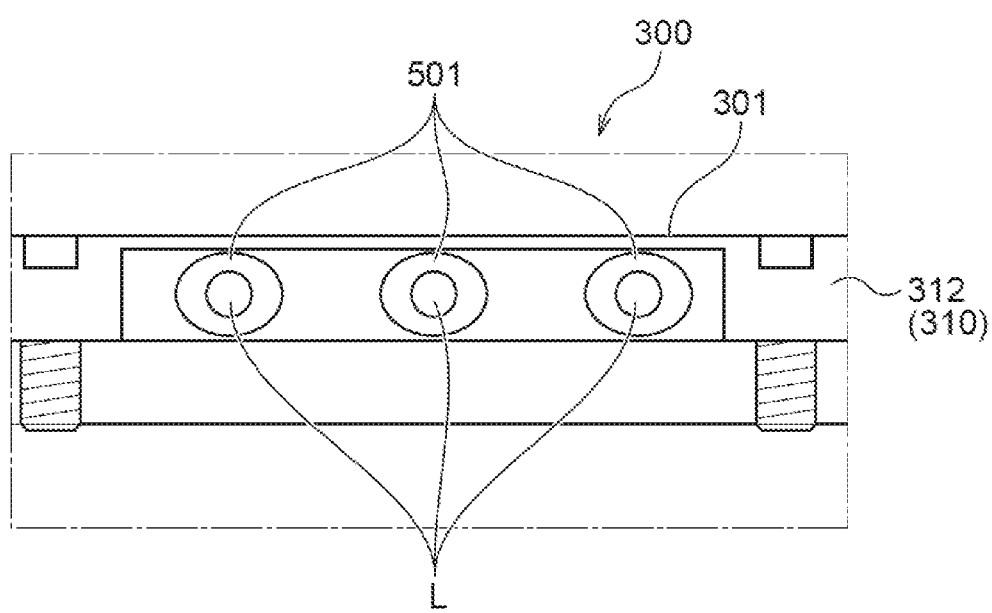
FIG. 20C is an enlarged view of the top plan view showing the portion of the face portion in the vicinity of the position where the cables are introduced with the illustration of the wiring buffer portion omitted.
Figure 21A:
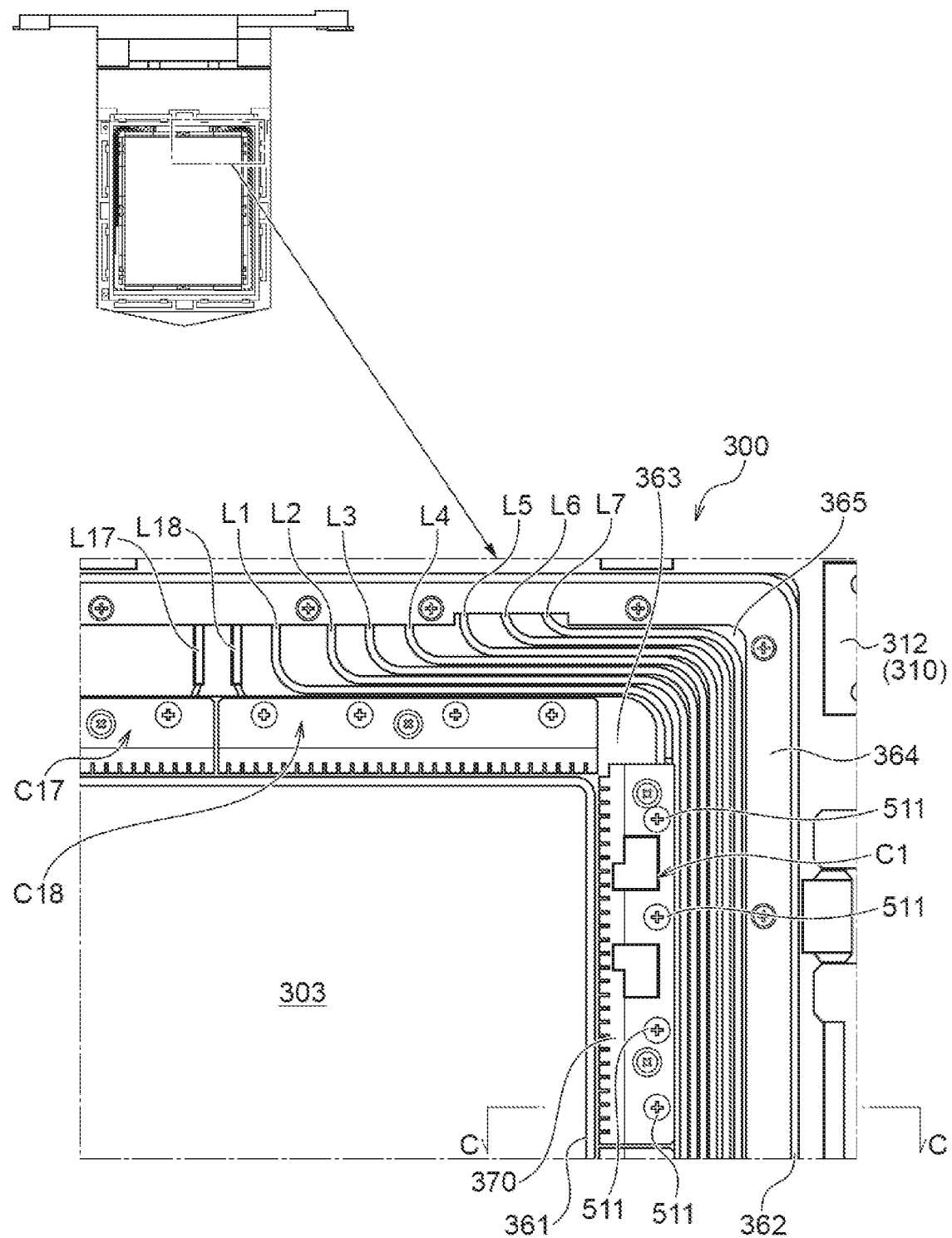
FIG. 21A is a back view of a portion of the face portion in the vicinity of a corner portion on the side close to the connector.

FIG. 17 is a back view of the front plate body. FIG. 18 is a partially enlarged plan view of a region of the front plate which includes the connector. FIG. 19A is a cross-sectional perspective view of the front panel. FIG. 19B is a cross-sectional view of the front panel. FIG. 19C is a partially enlarged perspective view of the front panel showing the arrangement of cables. FIG. 20A is a perspective view of a portion of a face portion in the vicinity of the position where the cables are introduced with the illustration of the wiring buffer portion omitted. FIG. 20B is a top plan view showing the portion of the face portion in the vicinity of the position where the cables are introduced with the illustration of the wiring buffer portion omitted. FIG. 20C is an enlarged view of the top plan view showing the portion of the face portion in the vicinity of the position where the cables are introduced with the illustration of the wiring buffer portion omitted. FIG. 21A is a back view of a portion of the face portion in the vicinity of a corner portion on the side close to the connector.

The back surface 302 of the front plate body 310 has eighteen contact regions C1 to C18. The contact regions C1 to C7, C17, C18 are disposed in a half region (a first region, a right half region in FIG. 17) of the face portion 312 on a side close to the connector 331. The contact regions C8 to C16 are disposed in a half region (a second region, a left half region in FIG. 17) of the face portion 312 on a side away from the connector 331. In the description made hereinafter, for the sake of convenience, cables arranged in the first region may be referred to as "cables of a first group", and cables arranged in the second region may be referred to as "cables of a second group".

Each contact region C1 to C18 includes a contact (contact member) 370 shown in FIG. 15 and FIG. 16 for supplying power to the substrate S. External power is respectively supplied to the contacts 370 in the respective contact regions C1 to C18 through cables L1 to L18. In the description made hereinafter, the cables L1 to L18 may be collectively referred to as "cables L" when it is not necessary to differentiate the respective cables from each other. An arbitrary cable may be referenced as the cable L.

First end portions of the cables L1 to L18 are connected to the connector 331 disposed at one end of the arm portion 330. To be more specific, the first end portions of the cables L1 to L18 are electrically connected to individual contacts in the connector 331 or each plurality of cables is electrically connected to a common contact (not shown in the drawing). The cables L1 to L18 can be electrically connected to an external power source (power source circuit, power source device or the like) through the respective contacts of the connector 331.

FIG. 22 is an explanatory view for describing a connection relationship between the cables and external connection contacts.

The cables L1 to L18 are connected to external connection contacts 331a1, 331a2 in the connector 331 (FIG. 22). The external connection contacts 331a1, 331a2 are connected with power supply terminals of an external power source. For example, three cables (L1 to L7, L17, L18) of the first group are connected to the common external connection contact 331a1 on the first side, and three cables (L8 to L16) of the second group are connected to the common external connection contact 331a2 on the second side. The external connection contact 331a1 on the first side and the external connection contact 331a2 on the second side are assumed as a pair of external connection contacts 331a. In this embodiment, the first side and the second side correspond to the respective sides when two contacts are disposed parallel to each other in the connector 331. For example, when the connector 331 of the substrate holder 1 is viewed from the right side in FIG. 17, the right side is assumed as the first side, and the left side is assumed as the second side. To be more specific, the external connection contacts are configured as follows.

The cables L17, L18, L1 are connected to the common external connection contact 331a1 on the first side, and the cables L8, L9, L10 are connected to the common external connection contact 331a2 on the second side. The external connection contact 331a1 on the first side and the external connection contact 331a2 on the second side are assumed as a pair (referred to as "first pair" or "first pair of external connection contacts 331a").

The cables L2, L3, L4 are connected to another external connection contact 331a1 on the first side, and the cables L11, L12, L13 are connected to another external connection contact 331a2 on the second side. The external connection contact 331a1 on the first side and the external connection contact 331a2 on the second side are assumed as a pair (referred to as "second pair" or "second pair of external connection contacts 331a").

The cables L5, L6, L7 are connected to another external connection contact 331a1 on the first side, and the cables L4, L15, L16 are connected to another external connection contact 331a2 on the second side. The external connection contact 331a1 on the first side and the external connection contact 331a2 on the second side are assumed as a pair (referred to as "third pair" or "third pair of external connection contacts 331a").

In the connector 331, the external connection contact 331a1 on the first side and the external connection contact 331a2 on the second side of each pair 331a of the external connection contacts are arranged so as to opposedly face each other. The external connection contact 331a1 on the first side and the external connection contact 331a2 on the second side of the first pair of the external connection contacts 331a are arranged so as to opposedly face each other. The external connection contact 331a1 on the first side and the external connection contact 331a2 on the second side of the second pair of the external connection contacts 331a are arranged so as to opposedly face each other. The external connection contact 331a1 on the first side and the external connection contact 331a2 on the second side of the third pair of the external connection contacts 331a are arranged so as to opposedly face each other.

Conduction confirmation processing is performed in the substrate attaching and detaching mechanism 29. To be more specific, after the substrate S is held by the substrate holder 1 (after the back plate 400 is fixed by the clamps 340 of the front plate 300), a resistance measuring instrument (not shown in the drawing) is connected to the first to fifth pairs of the connector 331, and a predetermined inspection voltage is applied between the first external connection contact and the second external connection contact of each pair. With such operations, an electrical resistance between the first external connection contact and the second external connection contact of each pair is measured. When an electrical resistance of each pair is equal to or less than a predetermined value and falls within a predetermined range (there is no variation in the electrical resistance between the respective pairs so that there is no abnormality such as disconnection), it is determined that the substrate holder 1 has favorable conduction (conduction confirmation processing). The conduction confirmation processing is performed by the control part 175C of the controller 175. The conduction confirmation processing may be included in "control of attaching and detaching a substrate to and from the substrate holder performed by the substrate attaching and detaching mechanism 29" described previously.

As described later, second end portions forming the other ends of the cables L1 to L18 are electrically connected to the contacts 370 in the contact regions C1 to C18 respectively. The respective cables L1 to L18 extend from the connector 331 along the arm portion 330, and pass through one mounting portion 320 and, then, enter the wiring buffer portion 311 (FIG. 18). In the wiring buffer portion 311, the cables L17, L18, L1 to L7 out of the cables L1 to L18 extend to the first region (the region on the side close to the connector). On the other hand, the cables L8 to L16 extend to the second region (the region on the side away from the connector). FIG. 18 mainly shows the cables L17, L18, L1 to L7 of the first group arranged in the first region. As shown in FIG. 18, the cables L17, L18, L1 to L7 of the first group pass the wiring buffer portion 311, and are introduced into a cable path 365 defined between the seal holders 363, 364 on the face portion 312. Although not shown in the drawing, the cables L8-16 of the second group also pass the second region (the region on the side away from the connector) of the wiring buffer portion 311, and are introduced into a cable path 365 in the second region on the face portion 312. In FIG. 18, to prevent the drawing from becoming complicated, the cables are illustrated with a portion having a certain length omitted. In the wiring buffer portion 311, the cables L1 to L8 may be desirably arranged so as to store portions of the cables L1 to L18 having a certain length as a margin.

A thick wall portion 313 is formed on a face portion 312 side of the wiring buffer portion 311 (FIG. 19A and FIG. 19B). Wiring holes 311a, which correspond to the respective cables L1 to L18, are formed on the thick wall portion 313 of the wiring buffer portion 311 and on the face portion 312 up to the cable path 365 defined between the seal holders 363, 364 (FIG. 19A and FIG. 19B). In this embodiment, each wiring hole 311a is a drilled hole having a diameter which allows the cable to pass therethrough. Although only one wiring hole 311a is shown in FIG. 19A, in an actual holder, a plurality of wiring holes 311a are formed corresponding to the respective cables as shown in FIG. 19C. The number of wiring holes 311a is set to a value at least equal to or larger than the number of cables.

In this embodiment, as shown in FIG. 19A and FIG. 19B, the wiring buffer portion 311 is formed as a separate body from the face portion 312 of the front plate body 310, and the wiring buffer portion 311 is mounted on the face portion 312. On a boundary between the wiring buffer portion 311 and the face portion 312, O rings 501 are disposed around the cables so as to hermetically seal the wiring holes 311a and the cables L. With such a configuration, the wiring holes 311a and the cables L are protected from a plating solution or external foreign materials.

Figure 21B:
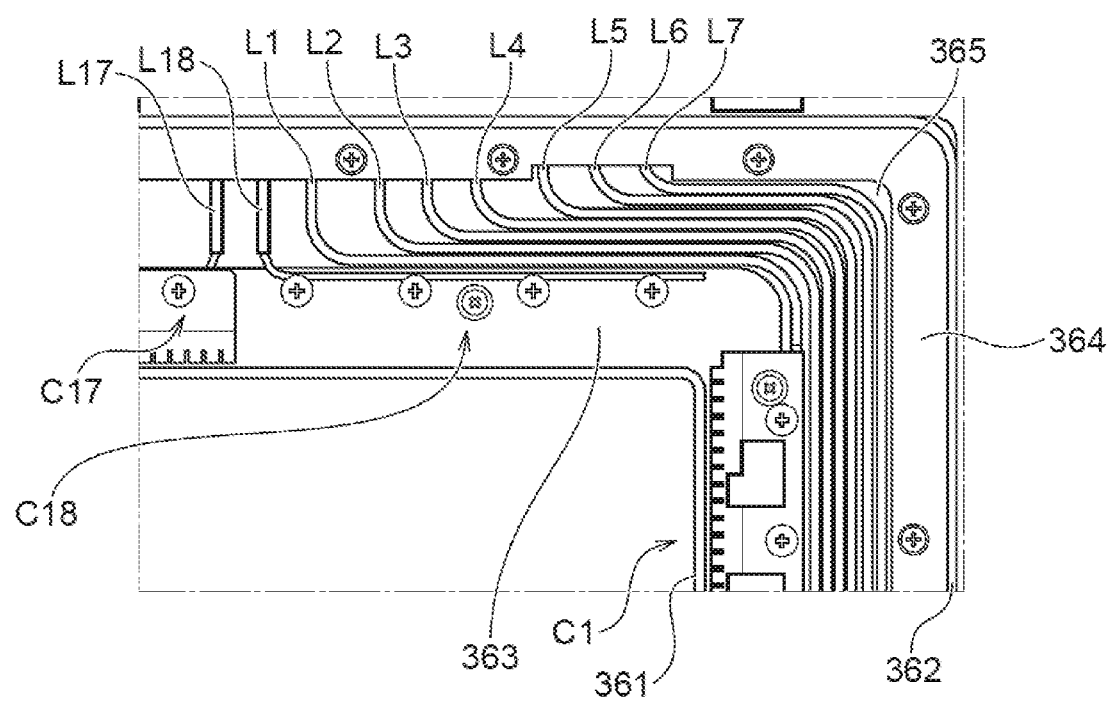
FIG. 21B is a back view showing the portion of the face portion in the vicinity of the corner portion on the side close to the connector in a further enlarged manner.
Figure 21C:
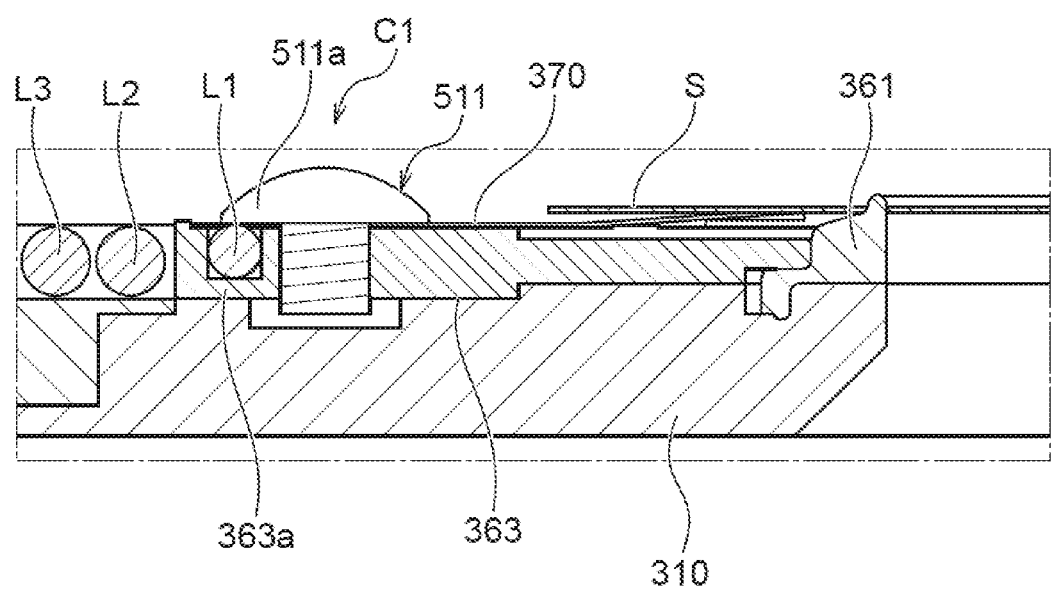
FIG. 21C is a cross-sectional view taken along line C-C in FIG. 21A.
Figure 21D:
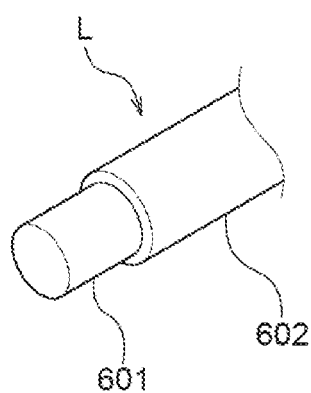
FIG. 21D is a perspective view of a portion of the cable from which a cover is removed.

FIG. 21A is a back view of a portion of the face portion in the vicinity of a corner portion on the side close to the connector. FIG. 21B is a back view showing the portion of the face portion in the vicinity of the corner portion on the side close to the connector in a further enlarged manner. FIG. 21C is a cross-sectional view taken along line C-C in FIG. 21A. FIG. 21D is a perspective view of a portion of the cable from which a cover is removed.

As shown in FIG. 21A and FIG. 21B, the cables L1 to L7 are introduced into the cable path 365 in a state of being arranged parallel to each other on the same plane, and the cables L1 to L7 are arranged along a side of the opening portion 303 which is close to the connector 331. The cables do not overlap with each other in the thickness direction of the face portion 312. Accordingly, a thickness of the face portion 312 and a thickness of the front plate 300 can be suppressed.

As shown in FIG. 21A and FIG. 21B, the contacts 370, each formed of a conductor, are disposed for the contact regions C1 to C18 along respective sides of the opening portion 303. The contacts 370 are disposed adjacently to the inner seal 361 in a state where the contacts 370 are not brought into contact with the inner seal 361. The contacts 370 are disposed on the seal holder 363, and are fixed to the seal holder by the plurality of screws 511. Wiring grooves 363a, into which the cables are pulled, are formed on the seal holder 363 in the respective contact regions so as to extend from the cable path 365 to connection positions (the positions of the screws 511). As shown in FIG. 21D, the cable L includes: a core wire or a conductive wire 601 formed of an electrical conductor; and a cover 602 for providing insulation to the conductive wire 601. The cover 602 is removed from a distal end portion (second end portion) of the cable L so that the core wire or the conductive wire 601 is exposed. The core wire 601 of the cable L is pulled in the wiring groove 363a. The cable L pulled in the wiring groove 363a in the allocated contact region terminates in the allocated contact region.

For example, the contact region C1 has the wiring groove 363a (FIG. 21C) opening toward a portion of the cable path 365 in the vicinity of the contact region C1. The wiring groove 363a extends so as to pass an area below four screws (fastening members) 511 disposed in the contact region C1, and terminates (FIG. 21A). In the same manner, the contact region C2 has the wiring groove 363a opening toward a portion of the cable path 365 in the vicinity of the contact region C2. The wiring groove 363a extends so as to pass an area below four screws 511 disposed in the contact region C2, and terminates. The positional relationship between the screw 511 and the wiring groove 363a is shown in FIG. 21C. When the cable L (the cable L1 in FIG. 21C) is arranged in the wiring groove 363a, the contact 370 and the cable (core wire) are pressed by a flange portion 511a of the screw 511.

An electrical connection between the cable L and the contact 370 in each contact region is performed as follows. The description is made by taking the cable L as an example. The cover 602 is removed from the distal end portion (second end portion) of the cable L1 so that the core wire (conductive wire) 601 is exposed (FIG. 21A to FIG. 21D). The distal end portion of the cable L1 is introduced into the wiring groove 363a of the seal holder 363 in the vicinity of the contact region C1, and is pressed together with the contact 370 by four screws (fastening members) 511 within the contact region C1. That is, the screws (fastening members) 511 and the seal holder 363 sandwich the core wire 601 of the cable L1 together with the contact 370. As a result, as shown in FIG. 21C, the cable L is electrically connected to the contact 370. When the substrate holder 1 holds the substrate S, the contact 370 is brought into contact with the substrate S so that power is supplied to the substrate S from the external power source through the cable L and the contact 370. Other contact regions C2 to C18 have the same configuration so that power is supplied to the substrate S through eighteen contacts 370.

The cables L2 to L7 are not pulled in the contact region C1 so that the cables L2 to L7 are arranged in parallel within a range corresponding to the contact region C1 and the contact region C2. In the contact region C2, in the same manner as the contact region C1, the cable L2 is pulled in the wiring groove 363a of the seal holder 363, and is pressed together with the contact 370 by four screws 511 so that the cable L2 is electrically connected with the contact 370. As a result, the cables L3 to L7 are arranged in parallel within a range corresponding to the contact region C2 and the contact region C3. In the same manner, the cables L3 to L7 are electrically connected with the contacts 370 in the contact regions C3 to C7 respectively. As a result, the cables L4 to L7 are arranged in parallel within a range corresponding to the contact region C3 and the contact region C4. The cables L5 to L7 are arranged in parallel within a range corresponding to the contact region C4 and the contact region C5. The cables L6 and L7 are arranged in parallel within a range corresponding to the contact region C5 and the contact region C6. The cable L7 is arranged in parallel within a range corresponding to the contact region C6 and the contact region C7.

In the same manner, the cables L17, L18 are electrically connected with the contacts 370 in the contact regions C17, C18 respectively. Also in the region (second region) on the side away from the connector, in the same manner as the cables in the first region, the cables L8 to L16 are electrically connected with the contacts 370 in the contact regions C8 to C16 respectively.

In this embodiment, the case has been described where the cable L is sandwiched together with the contact 370, and the cable L and the contact 370 are directly and electrically connected with each other. However, another conductive member (second conductive member) may be interposed between the cable L and the contact 370.

(Functions and Effects of Embodiment)

According to the substrate holder 1 of this embodiment, the front plate 300 and the back plate 400, which sandwich a substrate therebetween, are fixed with each other by the clamps 340 which are rotatable about shafts extending parallel to the surface of the front plate body 310 or by the clamps 340 which are reciprocable in the direction intersecting with the surface of the front plate body 310. Accordingly, it is possible to suppress or prevent that a force in the rotational direction is applied to the substrate. In the case where a substrate has a large size and a small thickness, when a force in the rotational direction is applied to the substrate, the substrate may be deflected. However, according to the substrate holder 1 of this embodiment, even when the substrate holder 1 holds a substrate having a large size and a small thickness, deflection of the substrate can be suppressed or prevented.

The clamps 340 are of a normally-closed type. Accordingly, the clamps are only opened in bringing the back plate body 410 into contact with the front plate body 310, and it is unnecessary to apply an external force to the clamps by actuators or the like when the clamps are in a clamping state. For this reason, energy consumption can be suppressed.

The back plate 400 can be sandwiched by the clamps 340 at a plurality of places, and the operations of the respective clamps 340 are synchronized by the connecting member (rotary shaft 341). Accordingly, the clamps can be effectively operated. Further, the configuration of the actuators AR1, which apply an external force to the clamps, can be simplified. The levers 342 can operate the respective clamps 340 by way of the rotary shafts 341 upon reception of an external force from the first actuators AR1 and hence, fixing of the substrate by the clamps 340 can be easily automated.

The engagement receiving portions 430, each having a shape which receives the engaging portion 340a of the clamp 340, are formed on the back plate 400 and hence, the engagement of the clamps with the back plate 400 can be enhanced. By adopting the configuration where the engagement receiving portions 430, which are formed as separate bodies from the back plate body 410, are mounted on the back plate body 410, a size, a shape, the number or the like of the engagement receiving portion 430 can be suitably and easily selected.

A substrate is fixed to the back plate 400 by the clips 421, which are rotatable about the shafts 424 extending parallel to the surface of the back plate body 410, or by the clips 421, which are reciprocable in the direction intersecting with the surface of the back plate body 410. Accordingly, it is possible to suppress or prevent that a force in the rotational direction is applied to the substrate. In the case where a substrate has a large size and a small thickness, when a force in the rotational direction is applied to the substrate, the substrate may be deflected. However, according to the substrate holder of this embodiment, even when the substrate holder holds a substrate having a large size and a small thickness, deflection of the substrate can be suppressed or prevented.

The clips 421 are of a normally-closed type. Accordingly, the clips 421 are only opened in bringing a substrate into contact with the back plate body 410, and it is unnecessary to apply an external force to the clips 421 by actuators or the like when the clips 421 are in a clipping state. For this reason, energy consumption can be suppressed.

The back plate 400 includes the buttons 470 which receive a force from a surface on a side opposite to a surface brought into contact with a substrate. Accordingly, the actuators AR2 can be disposed on a side opposite to the surface which is brought into contact with the substrate and hence, the movement and a change in posture of the back plate 400 can be easily performed after the substrate is fixed.

The buttons 470 can operate the clips 421 upon reception of an external force from the second actuators AR2. With such a configuration, fixing of the substrate by the clips 421 can be easily automated.

The seal holder 363 for holding the inner seal 361 and the seal holder 364 for holding the outer seal 362 are formed as separate bodies and hence, the respective seals can be replaced individually.

In the substrate holder of this embodiment, the cover 602 is removed from one end portion of the cable L, and the core wire 601 of the cable L is sandwiched together with the contact 370. With such a simple configuration, an electrical connection between the cable L and the contact 370 can be established. That is, the cable L and the contact 370 can be connected with each other without providing a connector or the like to an end portion of the cable. When power is supplied to the substrate S in a state where the contacts 370 are brought into contact with the substrate S at a plurality of places, it is necessary to draw a plurality of cables L in the substrate holder so as to establish an electrical connection. However, according to the substrate holder of this embodiment, an electrical connection between the cables L and the contacts 370 can be established with a simple configuration and hence, an increase in size of the substrate holder can be suppressed. When power is supplied to a substrate having a large size or when a value of electric current supplied to a substrate is large, the number of cables is increased and a diameter of the cables is also increased. In such a case, for example, the substrate holder of this embodiment can be effectively used where the cables can be connected in a simple manner.

In the substrate holder of this embodiment, an electrical connection between the cable L and the contact 370 can be established with a simple configuration and a simple operation using the fastening members 511 such as bolts or screws.

In the substrate holder of this embodiment, the cable L and the contact 370 can be sandwiched using the seal holder 363. Accordingly, the existing configuration can be used and hence, an increase in size of the substrate holder and an increase in cost can be suppressed.

In the substrate holder of this embodiment, the seal holder 363 for the seal 361 and the seal holder 364 for the seal 362 are formed of separate bodies and hence, the seal can be replaced individually. The seal holder 363 and the seal holder 364 can be also easily replaced individually.

In the substrate holder of this embodiment, the cables L are arranged so as not to overlap with each other in the thickness direction of the substrate holder and hence, an increase in thickness of the substrate holder can be suppressed. Particularly, when a substrate has a large size or when an amount of electric current is large, there is a possibility that the number of cables and a diameter of the cables increase. However, according to the configuration of this embodiment, an increase in size of the substrate holder in the thickness direction can be suppressed.

In the substrate holder of this embodiment, the respective cables L, where the cover 602 is removed from the distal end of each cable L, are sequentially pulled into positions of the respective contacts 370, and are connected to the respective contacts 370. Accordingly, insulation can be established between the cables up to the connection positions and, at the same time, the cables can be connected to the conductive members with a simple configuration.

When the substrate holder of this embodiment is used in a plating apparatus, an increase in size of the substrate holder can be suppressed so that an increase in size of the plating apparatus can be also suppressed.

In a method for manufacturing the substrate holder of this embodiment, the cover 602 is removed from one end portion of the cable L, and the core wire 601 of the cable L is sandwiched together with the contact 370. Accordingly, an electrical connection between the cable L and the contact 370 can be established with a simple configuration. That is, the cable L and the contact 370 can be connected with each other without providing a connector or the like to an end portion of the cable. When power is supplied to the substrate S in a state where the contacts 370 are brought into contact with the substrate S at a plurality of places, it is necessary to draw a plurality of cables L in the substrate holder so as to establish an electrical connection. However, according to the substrate holder of this embodiment, an electrical connection between the cables L and the contacts 370 can be established with a simple configuration and hence, an increase in size of the substrate holder can be suppressed. When power is supplied to a substrate having a large size or when a value of electric current supplied to a substrate is large, the number of cables is increased and a diameter of the cables is also increased. In such a case, for example, the substrate holder of this embodiment can be effectively used where the cables can be connected in a simple manner.

In performing plating treatment on a substrate using the above-mentioned substrate holder 1, even when power is supplied to a substrate having a large size or even when a value of electric current supplied to a substrate is large, an electrical connection between the cables and the conductive members in the substrate holder is established with a simple configuration. Accordingly, plating treatment can be performing using the substrate holder where an increase in size of the substrate holder is suppressed or prevented.

In the above-mentioned embodiment, before plating treatment is performed, conduction confirmation processing is performed, where electrical resistance between the contact(s) on the first side and the contact(s) on the second side of each pair of the external connection contacts is measured so as to confirm whether or not there is a variation in electrical resistance between the plurality of pairs of the external connection contacts. Accordingly, it is possible to perform plating treatment after it is confirmed in advance that there is no problem in uniformity in plating film thickness caused by variation in electrical resistance between the plurality of pairs of the external connection contacts. As a result, reliability of plating treatment can be enhanced.

(Substrate Support Structure)

Figure 23:
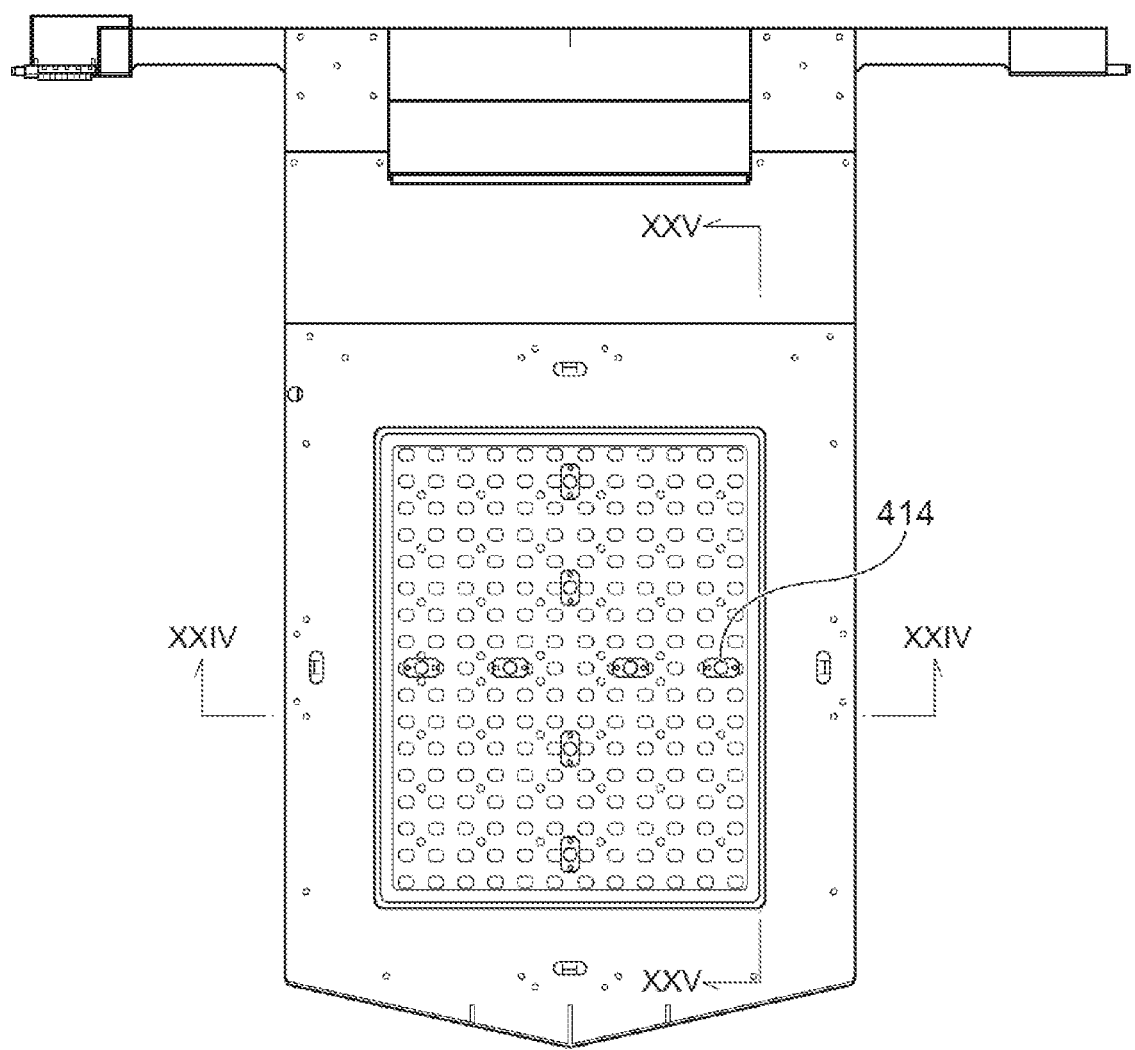
FIG. 23 is a front view showing cutting positions which correspond to respective cross sections of the substrate holder.
Figure 24:
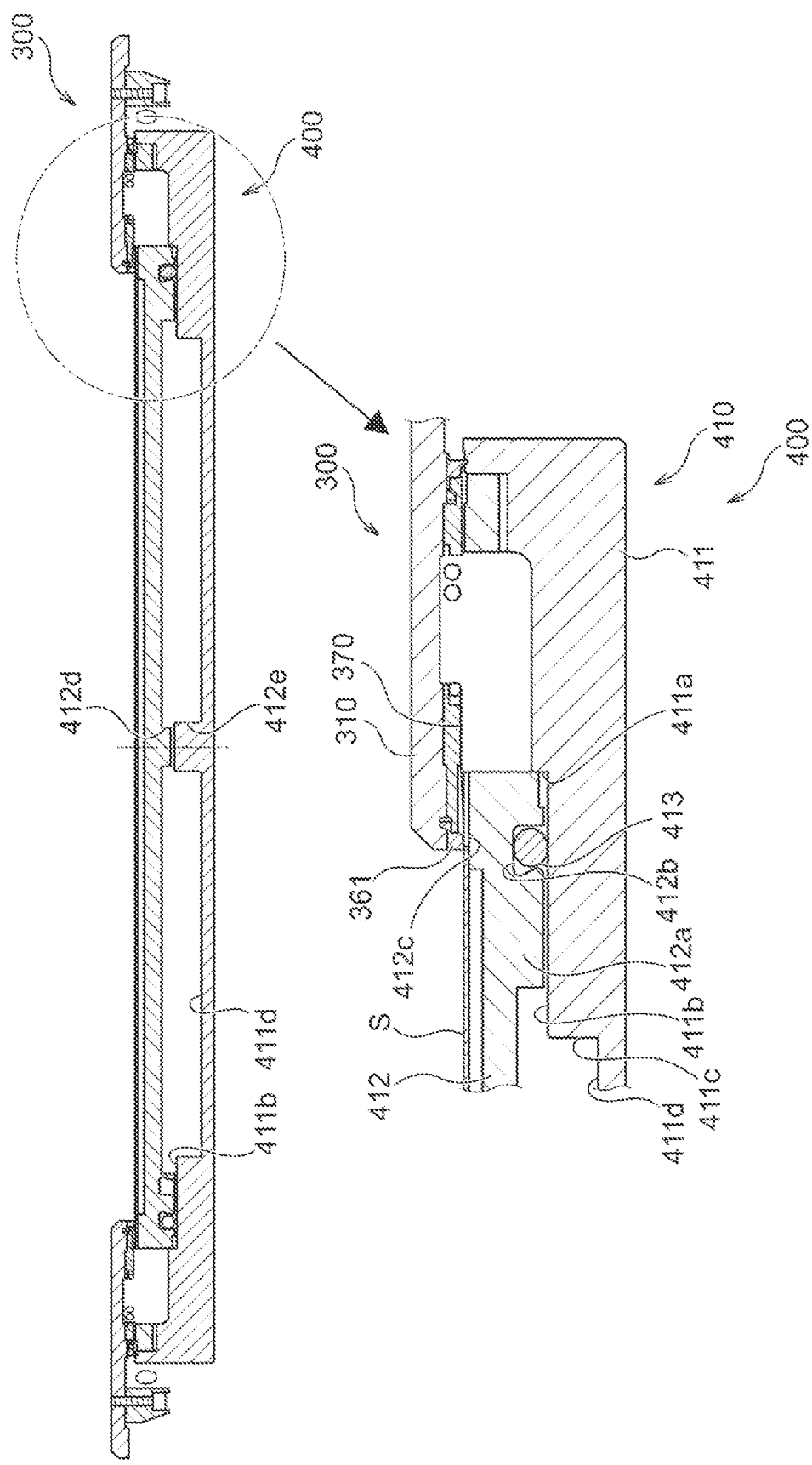
FIG. 24 is a cross-sectional view of the substrate holder shown in FIG. 23 taken along line XXIV-XXIV.
Figure 25:
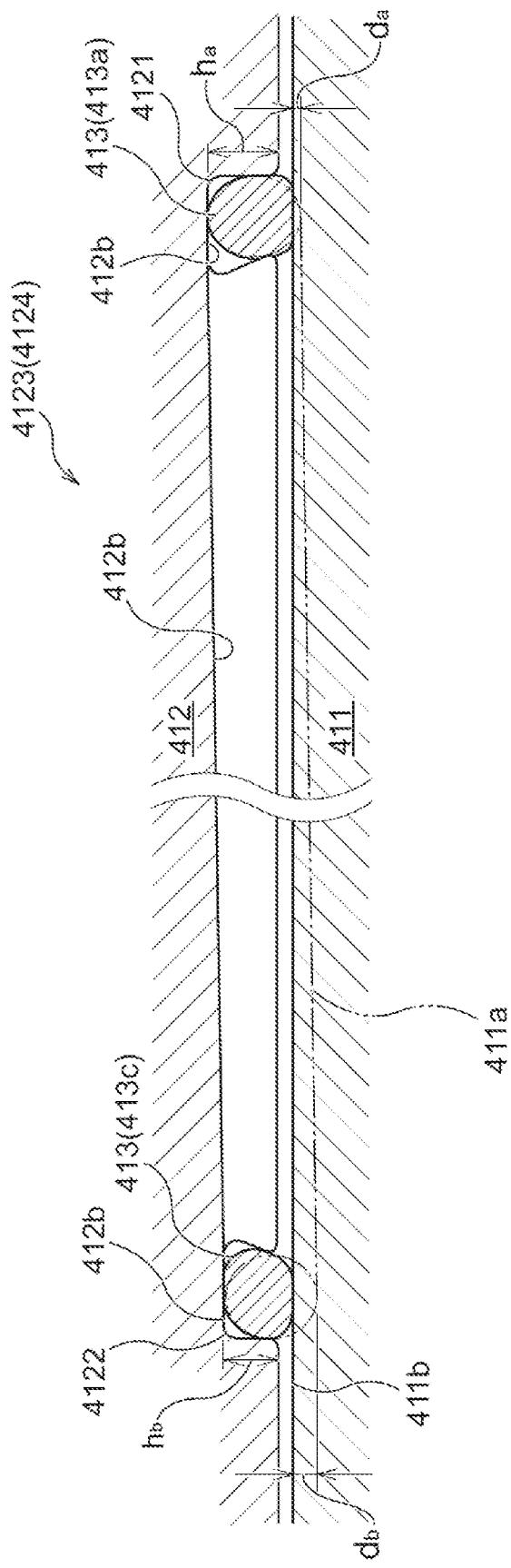
FIG. 25 is a cross-sectional view of the substrate holder shown in FIG. 23 taken along line XXV-XXV.
Figure 26:
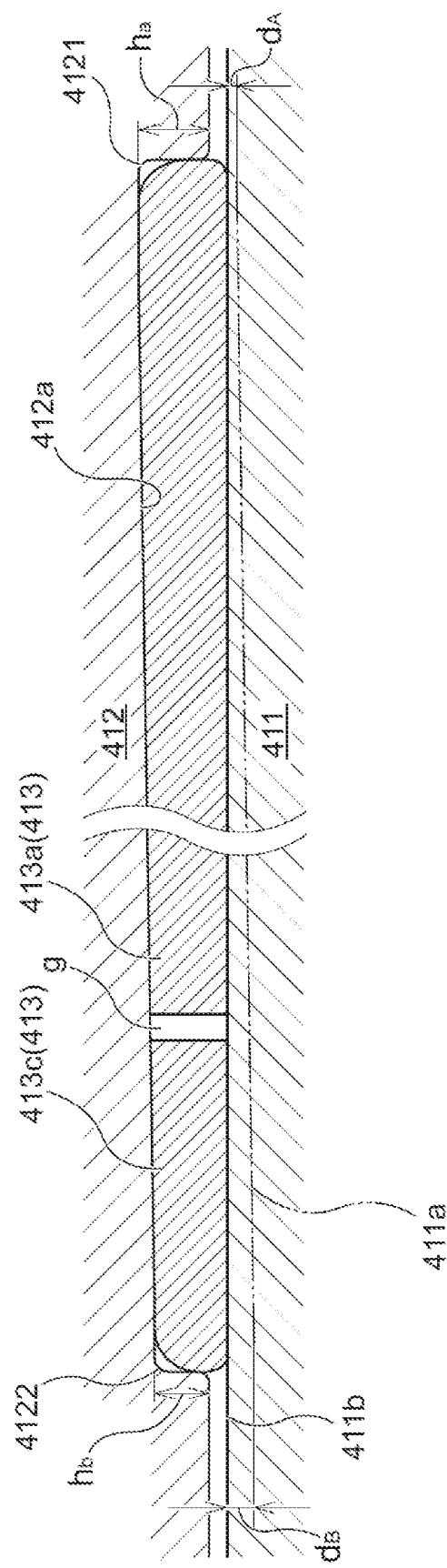
FIG. 26 is a cross-sectional view of the substrate holder shown in FIG. 23 taken at a position in the vicinity of line XXV-XXV which includes an elastic body extending in the vertical direction.
Figure 27:
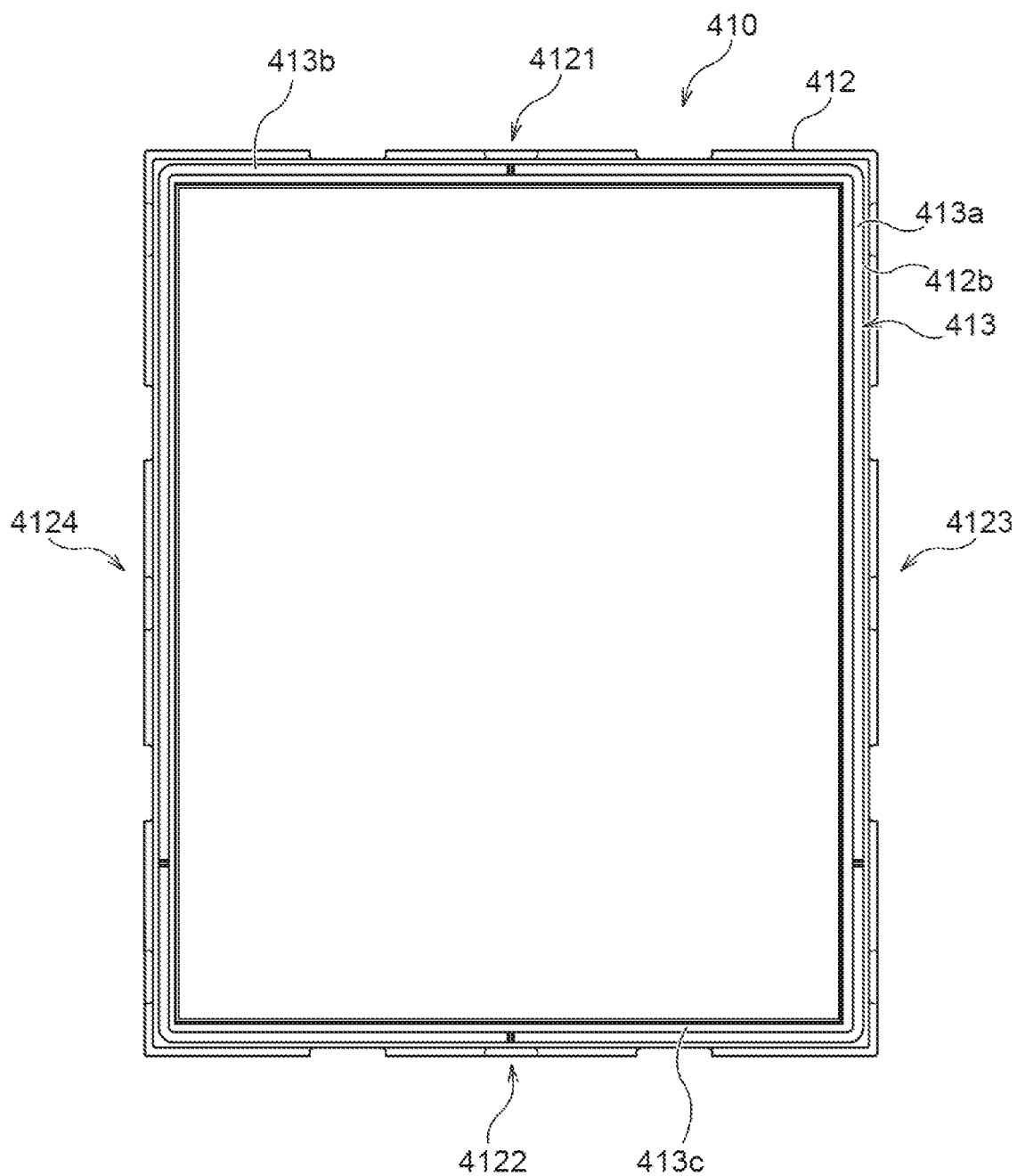
FIG. 27 is a back view of a movable base.

FIG. 23 is a front view showing cutting positions which correspond to respective cross sections of the substrate holder. FIG. 24 is a cross-sectional view of the substrate holder shown in FIG. 23 taken along line XXIV-XXIV. FIG. 25 is a cross-sectional view of the substrate holder shown in FIG. 23 taken along line XXV-XXV. FIG. 26 is a cross-sectional view of the substrate holder shown in FIG. 23 taken at a position in the vicinity of line XXV-XXV which includes an elastic body extending in the vertical direction. FIG. 27 is a back view of a movable base.

As shown in FIG. 5A, FIG. 5B and FIG. 24, the back plate body 410 includes: the support base 411; the movable base 412 which is mounted on the support base 411 in a movable manner; and the elastic body 413 disposed between the support base 411 and the movable base 412. The movable base 412 is movable in the direction, along which the movable base 412 approaches the support base 411, and in the direction, along which the movable base 412 is separated from the support base 411. The movable base 412 is biased in the direction along which the movable base 412 is separated from the support base 411 by an elastic body 413. The substrate S is placed on the movable base 412. An outer peripheral side of the substrate S is pressed by the seal 361 of the front plate 300 so that the outer peripheral portion of the substrate S is sealed from a plating solution. The movable base 412 is pressed by the seal 361 of the front plate 300 by way of the substrate S, and is movable so as to approach the support base 411 corresponding to a thickness of the substrate S.

As shown in FIG. 5A, the support base 411 and the movable base 412 are plate members having a substantially rectangular shape as viewed in a plan view. The movable base 412 has a smaller size than the support base 411. A recessed portion 411a is formed on a front surface of the support base 411 (FIG. 24), and the movable base 412 is mounted in the recessed portion 411a in a movable manner. A recessed portion 411c is formed in the recessed portion 411a of the support base 411. A bottom surface 411d of the recessed portion 411c is disposed at a lower position than a bottom surface 411b of the recessed portion 411a. A stepped portion is formed between the bottom surface 411d and the bottom surface 411b. As shown in FIG. 23, a plurality of guide mechanisms 414 are formed on the movable base 412. The movement of the movable base 412 is guided by the guide mechanisms 414. At the same time, a movable range of the movable base 412 in the direction, along which the movable base 412 is separated from the support base 411, is restricted by the guide mechanisms 414. The guide mechanisms 414 are disposed at a thin wall portion of the movable base 412 (a recessed portion 412d and a recessed portion 412e shown in FIG. 24). The thin wall portion is formed in a cross shape along the arrangement of the guide mechanisms 414 shown in FIG. 23. Each guide mechanism 414 includes a shaft having a flange, for example. The shaft is inserted into a through hole (not shown in the drawing) formed in the thin wall portion of the movable base 412 from a distal end side of the shaft, and a distal end of the shaft is fixed to the bottom surface 411d of the recessed portion 411c. The movable base 412 is guided along the shafts, and the flanges of the shafts are brought into contact with a bottom surface of the recessed portion 412d of the movable base 412 so that the movable range of the movable base 412 is restricted. The movable base 412 includes a peripheral edge portion 412a having a larger thickness than a center portion of the movable base 412 (FIG. 24). A groove portion 412b is formed on a back surface of the peripheral edge portion 412a, and the elastic body 413 is disposed in the groove portion 412b. A substrate support surface 412c is formed on an outer peripheral side of a front surface of the peripheral edge portion 412a over the entire circumference, and the substrate support surface 412c projects from the front surface of the peripheral edge portion 412a in a center region. The substrate S is supported on the substrate support surface 412c.

The elastic body 413 forms a biasing mechanism which biases the movable base 412. To be more specific, the elastic body 413 and portions of the movable base 412 and the support base 411 which are brought into contact with the elastic body 413 form the biasing mechanism. As shown in FIG. 27, the groove portion 412b is formed on the outer peripheral portion of the back surface of the movable base 412 over the entire circumference, and the elastic body 413 (the elastic bodies 413a, 413b, 413c in this embodiment) is disposed in the groove portion 412b over approximately the entire circumference (substantially the entire circumference). In this embodiment, the elastic body 413 includes three rod-shaped elastic bodies 413a, 413b, 413c. The elastic body 413a is disposed over a right portion of an upper side 4121 of the movable base 412 and an upper portion of a right side 4123 of the movable base 412. The elastic body 413b is disposed over a left portion of the upper side 4121 of the movable base 412 and an upper portion of a left side 4124 of the movable base 412. The elastic body 413c is disposed over the entire length of a lower side 4122 of the movable base 412, a lower portion of the right side 4123 and a lower portion of the left side 4124. In this embodiment, an upper side means a side of the movable base 412 disposed on an upper side (a side close to the arm portion 330) when the substrate holder 1 is disposed in the plating tank 39, and a lower side means a side of the movable base 412 disposed on a lower side (a side away from the arm portion 330) when the substrate holder 1 is immersed in the plating tank 39.

The number of individual elastic bodies forming the elastic body 413 is not limited to three, and the elastic body 413 may be formed of two or less individual elastic bodies or may be formed of four or more individual elastic bodies. A gap g (FIG. 26) may be formed between the elastic bodies 413a, 413b, 413c. To bias the entire circumference of the movable base 412 with a uniform force, it is preferable that a plurality of elastic bodies be disposed over substantially the entire circumference. As one example, it is preferable that a plurality of elastic bodies be disposed on 90% or more of the entire circumference of the movable base 412 (the entire circumference of the groove portion 412b). In other words, it is preferable that a total length of the gaps g between the plurality of elastic bodies be less than 10% of the entire circumference of the movable base 412 (the entire circumference of the groove portion 412b). In the description made hereinafter, when it is not particularly necessary to differentiate the elastic bodies from each other, an individual elastic body may also be referred to as "elastic body 413", and the plurality of elastic bodies may be collectively referred to as "elastic body 413".

The elastic body 413 may be formed using an O ring or a packing made of fluororubber or urethane rubber, for example. When the elastic body 413 is formed of a plurality of elastic bodies, for example, a plurality of O rings or packings may be cut and disposed in the groove portion 412b. The elastic body 413 may be formed of one annular elastic body. For example, an O ring or a packing having substantially the same length as the entire circumference of the groove portion 412b may be disposed in the groove portion 412b. The elastic body 413 may have a desired shape such as a circular shape, an elliptical shape or a polygonal shape in cross section. It is sufficient for the elastic body 413 to be suitable for biasing the movable base 412. Accordingly, it is not always necessary for the elastic body 413 to possess sealability.

A biasing force of the elastic body 413 with respect to the movable base 412 can be adjusted by changing a diameter and hardness (elasticity) of the elastic body 413. When the plurality of elastic bodies 413 are disposed in the groove portion 412b in an overlapping manner, a biasing force can be adjusted by changing the number of elastic bodies 413. Accordingly, by adjusting at least one of a diameter of the elastic body 413, hardness (elasticity) of the elastic body 413 and the number of elastic bodies 413, a biasing force of the elastic body 413 with respect to the movable base 412 can be adjusted.

As shown in FIG. 25 and FIG. 26, the groove portion 412b is formed such that a depth of the groove portion 412b varies depending on a position in the vertical direction of the substrate holder 1. When the substrate holder 1 is disposed in the plating tank 39, the upper side 4121 of the movable base 412 is disposed at a shallow depth position in a plating solution, and the lower side 4122 of the movable base 412 is disposed at a deep depth position in the plating solution. A depth hb of the groove portion 412b at a lower end of the movable base 412 is smaller than a depth ha of the groove portion 412b at an upper end of the movable base 412 (hb<ha). That is, as shown in FIG. 25 and FIG. 26, the depth hb of the groove portion 412b along the lower side 4122 of the movable base 412 is smaller than the depth ha of the groove portion 412b along the upper side 4121 of the movable base 412. Further, as shown in FIG. 25 and FIG. 26, a depth of the groove portion 412b along the right side 4123 and the left side 4124 of the movable base 412 continuously decreases from the depth ha to the depth hb from the upper side 4121 to the lower side 4122. In other words, the groove portion 412b is formed such that the depth of the groove portion 412b continuously decreases corresponding to a depth in a plating solution. For example, the groove portion 412b can be formed such that a depth of the groove portion 412b varies (linearly decreases) in proportion to a depth in a plating solution (a distance from the upper side 4121).

In this embodiment, a case has been described where a depth of the groove portion 412b continuously varies in a linear manner corresponding to a depth in a plating solution. However, a depth of the groove portion 412b may vary in a curved manner corresponding to a depth in a plating solution. A depth of the groove portion 412b may vary in a stepwise manner corresponding to a depth in a plating solution such that a depth of the groove portion 412b in a region (or at a position) of the movable base 412, which is largely affected by a depth in a plating solution, may be set smaller than a depth of the groove portion 412b in another region (or at another position) of the movable base 412. The region (or the position) of the movable base 412 which is largely affected by a depth in a plating solution can be acquired in advance by an experiment or the like. For example, a substrate holder 1 on which a substrate S is mounted is immersed into a plating solution, and a depth in a plating solution and an amount of compression of the seal 361 are measured so as to examine a relationship between the depth of the plating solution and the amount of compression of the seal 361. Accordingly, a depth of the groove portion 412b at a depth in a plating solution where an amount of compression is large can be set smaller than a depth of the groove portion 412b in another region (or at another position).

As shown in FIG. 25 and FIG. 26, when the movable base 412 is mounted on the support base 411, the smaller a depth of the groove portion 412b (the closer to the depth hb), the more the elastic body 413 is largely deformed (deformation amount db in FIG. 25) thus having a larger biasing force of the elastic body 413 (a larger biasing force in the direction along which the movable base 412 is separated from the support base 411). On the other hand, when the movable base 412 is mounted on the support base 411, the larger the depth of the groove portion 412b (the closer to the depth ha), the less the elastic body 413 is deformed (deformation amount da in FIG. 25) thus having a smaller biasing force of the elastic body 413 (a smaller biasing force in the direction along which the movable base 412 is separated from the support base 411). When the substrate holder 1 is immersed into a plating solution, a larger biasing force of the elastic body 413 acts against a larger fluid pressure in a region (or at a position) at a deeper depth in a solution. On the other hand, a smaller biasing force of the elastic body 413 acts against a smaller fluid pressure in a region (or at a position) at a shallower depth in the solution. As a result, a sum of a biasing force of the elastic body 413 (a force in the direction along which the movable base 412 is separated from the support base 411) and a fluid pressure (a force in the direction along which the movable base 412 is made to approach the support base 411) becomes constant in the entire region of the movable base 412 so that a force which acts in the direction along which the movable base 412 is separated from the support base 411 becomes constant irrespective of a depth in a solution. Accordingly, when the substrate S on the movable base 412 is sandwiched by the front plate 300 and the movable base 412, an amount of compression of the seal 361 of the front plate 300 becomes constant irrespective of a depth in a solution. As a result, leakage of a plating solution can be suppressed or prevented. An inclination of a substrate can be also suppressed or prevented. A substrate and the contacts 370 can be favorably brought into contact with each other over the entire circumference. With such a configuration, when plating treatment is performed on a substrate using the substrate holder of this embodiment, it is possible to suppress non-uniformity in thickness of metal formed on the substrate, that is, non-uniformity in plating thickness in the plane. That is, by performing electrolytic plating treatment on a substrate using the substrate holder of this embodiment, a thickness of metal formed on the substrate can be made substantially uniform in the plane.

(Modifications of Substrate Support Structure)

In the above-mentioned embodiment, a configuration has been described which suppresses the effect of a fluid pressure by changing a depth of the groove portion 412b of the movable base 412. However, provided that a configuration can adjust a biasing force of the elastic body 413 corresponding to a depth in a solution, any other configuration may be adopted. FIG. 28A to FIG. 28D show another examples of a configuration where a distance between the movable base 412 and the support base 411 at a portion where the elastic body 413 is disposed varies depending on place (a region or a position on a movable base). FIG. 29A and FIG. 29B show examples of a configuration where a biasing force of the elastic body 413 per se varies depending on a region or a position on the movable base 412.

(First Modification)

Figure 28A:
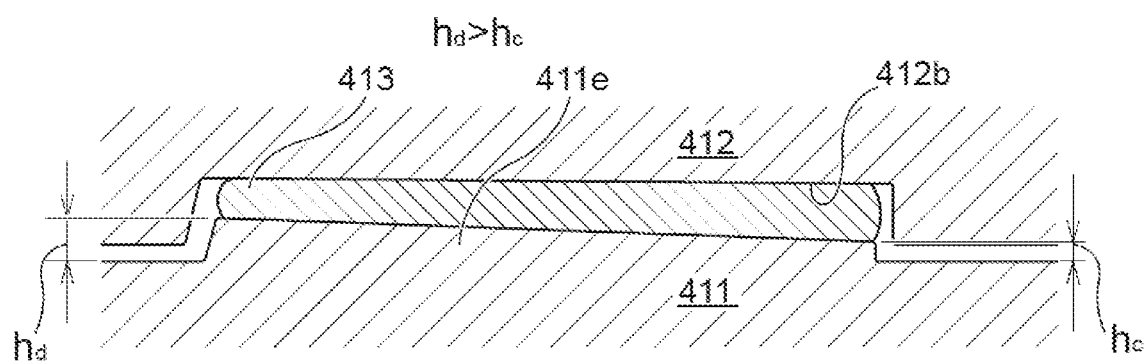
FIG. 28A is a view showing a biasing mechanism according to a first modification.
Figure 29A:
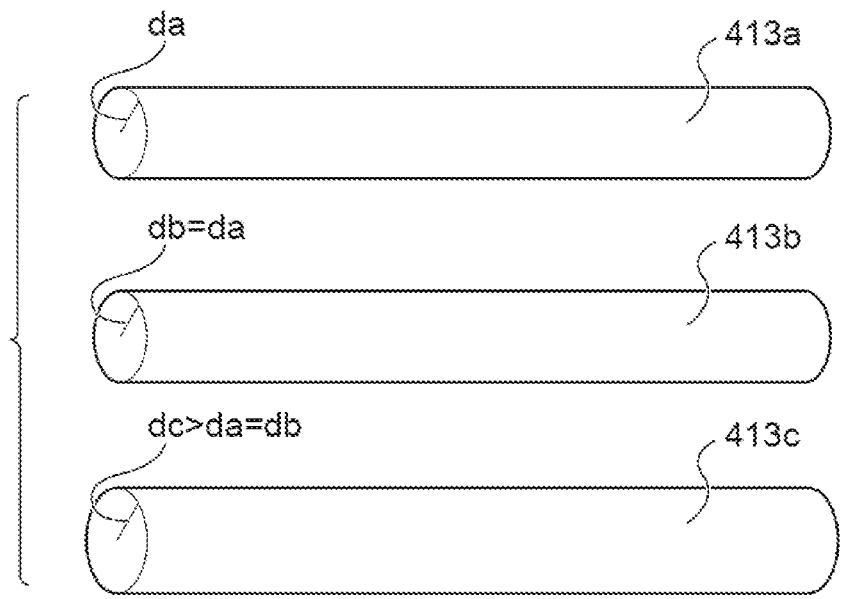
FIG. 29A is a view showing a biasing mechanism according to a fifth modification.
Figure 29B:
FIG. 29B is a view showing a biasing mechanism according to a sixth modification.

FIG. 28A shows a biasing mechanism according to a first modification. In this modification, a depth of the groove portion 412b of the movable base 412 is set constant, and a protrusion 411e having a varying height is formed on the support base 411 at a position which opposedly faces the groove portion 412b. For example, the protrusion 411e is configured such that, in a state where the substrate holder 1 is immersed into a plating solution, the deeper a region (or a position) of the protrusion 411e is disposed in a solution, the larger a height of the protrusion 411e becomes so as to increase an amount of compression of the elastic body 413. In an example of FIG. 28A, a height of the protrusion 411e on the upper side is set to hc, and a height of the protrusion 411e on the lower side is set to hd (>hc). A height of the protrusion 411e may vary in a curved manner or in a stepwise manner. Alternatively, a height of the protrusion 411e may partially vary in a region (or at a position) which is largely affected by a fluid pressure.

(Second Modification)

Figure 28B:
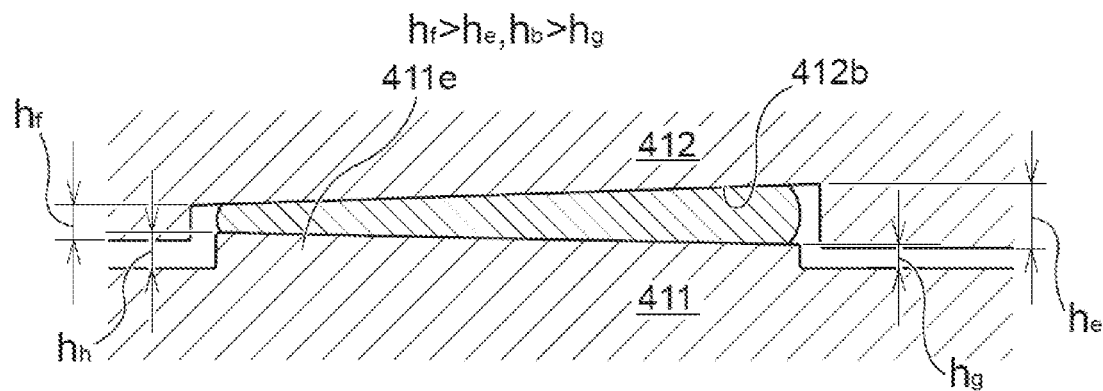
FIG. 28B is a view showing a biasing mechanism according to a second modification.

FIG. 28B shows a biasing mechanism according to a second modification. In this modification, a depth of a groove portion 412b of the movable base 412 is made shallow in a region (or at a position) at a deep depth in a solution, and a height of a protrusion 411e of the support base 411 is made large in the region (or at the position) at a deep depth in the solution. With such a configuration, in the region (or at the position) at a deep depth in the solution, an amount of compression of the elastic body 413 becomes large so that a biasing force of the elastic body 413 becomes large. In an example of FIG. 28B, a depth of the groove portion 412b on the upper side is set to he, and a depth of the groove portion 412b on the lower side is set to hf (<he). A height of the protrusion 411e on the upper side is set to hg, and a height of the protrusion 411e on the lower side is set to hh (>hg). A depth of the groove portion 412b may be made shallow in a stepwise manner, or may be partially made shallow in a region (or at a position) which is largely affected by a fluid pressure. A height of the protrusion 411e may vary in a curved manner or in a stepwise manner. Alternatively, a height of the protrusion 411e may partially vary in a region (or at a position) which is largely affected by a fluid pressure.

(Third Modification)

Figure 28C:
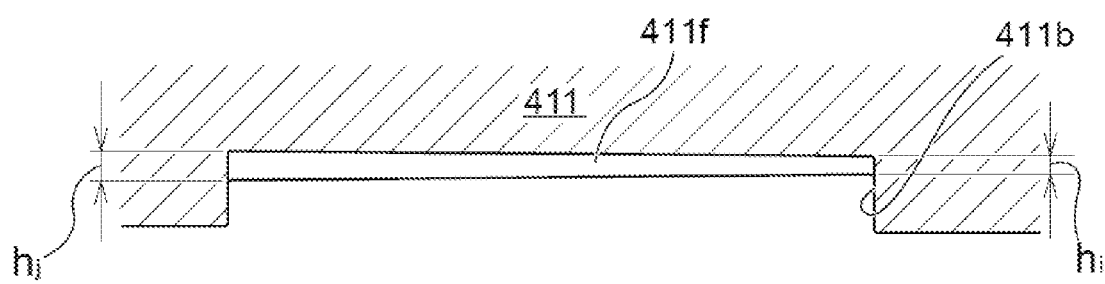
FIG. 28C is a view showing a biasing mechanism according to a third modification.

FIG. 28C shows a biasing mechanism according to a third modification. In this modification, a shim 412f is mounted on a bottom surface of the groove portion 412b of the movable base 412. The shim 412f is formed of a plate member having a varying thickness, and functions as a size adjustment member. For example, the shim 412f is configured such that, in a state where the substrate holder 1 is immersed into a plating solution, the deeper a region (or a position) of the shim 412f is disposed in a solution, the higher a height of the shim 412f becomes (a substantial depth of the groove portion 412b is made shallow). In this modification, a depth of the groove portion 412b is set constant. However, provided that a substantial depth of the groove portion 412b is set to a desired depth in a state where the shim 412f is mounted on the groove portion 412b, the depth of the groove portion 412b may not be set to constant. In an example of FIG. 28C, a height of the shim 412f on the upper side is set to hi, and a height of the shim 412f on the lower side is set to hj (>hi). A height of the shim 412f may vary in a curved manner or in a stepwise manner. Alternatively, a height of the shim 412f may partially vary in a region (or at a position) which is largely affected by a fluid pressure. A shim may be partially mounted on the groove portion 412b in a region (or at a position) which is largely affected by a fluid pressure. As shown in FIG. 26, FIG. 28A and FIG. 28B, the groove portion 412b having a fixed depth is formed, and the shim 412f may be mounted on the groove portion 412b so as to vary a substantial depth of the groove portion 412b. In this modification, a plate member is exemplified as a position adjustment member. However, the position adjustment member may be a rod-like member having a varying diameter.

(Fourth Modification)

Figure 28D:
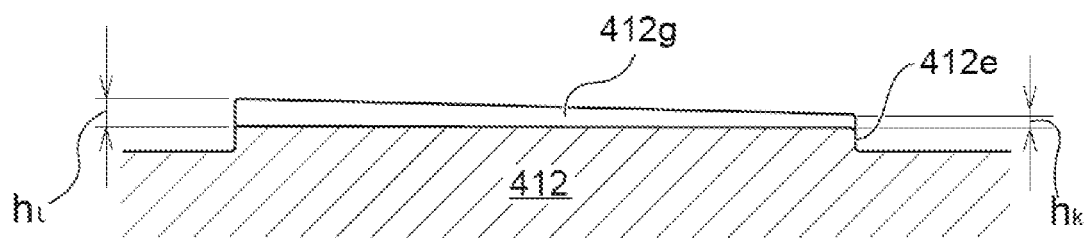
FIG. 28D is a view showing a biasing mechanism according to a fourth modification.

FIG. 28D shows a biasing mechanism according to a fourth modification. In this modification, a shim 411g is assembled to an end surface of the protrusion 411e of the support base 411. The shim 411g is formed of a plate member having a varying thickness, and functions as a size adjustment member. For example, the shim 411g is configured such that, in a state where the substrate holder 1 is immersed into a plating solution, the deeper a region (or a position) of the shim 411g is disposed in a solution, the higher a height of the shim 411g becomes. In this modification, a height of the protrusion 411e is set constant. However, provided that a substantial height of the protrusion 411e is set to a desired height in a state where the shim 411g is mounted on the protrusion 411e, the height of the protrusion 411e may not be set constant. In an example of FIG. 28D, a height of the shim 411g on the upper side is set to hk, and a height of the shim 411g on the lower side is set to hi (>hk). A height of the shim 411g may vary in a curved manner or in a stepwise manner. Alternatively, a height of the shim 411g may partially vary in a region (or at a position) which is largely affected by a fluid pressure. A shim may be partially mounted on the protrusion 411e in a region (or at a position) which is largely affected by a fluid pressure. As shown in FIG. 28A and FIG. 28B, the protrusion 411e having a fixed height is formed, and the shim 411g may be mounted on the protrusion 411e so as to vary a substantial height of the protrusion 411e. In this modification, a plate member is exemplified as a position adjustment member. However, the position adjustment member may be a rod-like member having a varying diameter.

In the above description, a case has been described where the groove portion is formed on the movable base 412, and the protrusion is mounted on the support base 411. However, the groove portion may be formed on the support base 411 and the protrusion may be mounted on the movable base 412.

(Fifth Modification)

Figure 29C:
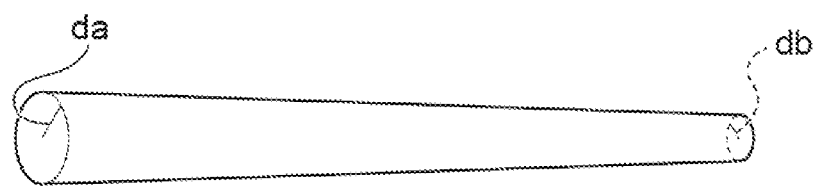
FIG. 29C is a view showing an example of an elastic body which has a continuously varying diameter.

FIG. 29A shows a biasing mechanism according to a fifth modification. In this modification, a diameter of an elastic body 413 varies depending on a region (or a position) on the movable base 412. A diameter of the elastic body 413 disposed in a region (or at a position) at a deep depth in a solution is set larger than a diameter of the elastic body 413 disposed at a shallow depth position in the solution. A diameter of the elastic body 413 may continuously vary in a linear manner or in a curved manner (see FIG. 29C). A diameter of the elastic body 413 may vary in a stepwise manner. Alternatively, a diameter of the elastic body 413 may partially vary in a region (or at a position) which is largely effected by a fluid pressure. In an example of FIG. 29A, with respect to a plurality of elastic bodies 413a, 413b, 413c shown in FIG. 27, diameters da, db of the elastic bodies 413a, 413b, which are disposed on a side having a shallow depth in a solution, are set to satisfy the equation da=db, and a diameter dc of the elastic body 413c, which is disposed on a side having a deep depth in the solution, is set larger than the diameters da, db of the elastic bodies 413a, 413b (dc>da=db). With such a configuration, a biasing force of the elastic body 413c at a deep depth position in the solution is further increased so that the elastic body 413c can act against a high fluid pressure.

The configuration shown in FIG. 26 or FIG. 28A to FIG. 28D and a change in diameter of the elastic body 413 according to the fifth modification may be used in combination so as to acquire a desired biasing force corresponding to a position on the movable base 412.

(Sixth Modification)

FIG. 29B shows a biasing mechanism according to a sixth modification. In this modification, hardness (elasticity) of the elastic body 413 varies depending on a region (or a position) on the movable base 412. Hardness of the elastic body 413 disposed in a region (or at a position) at a deep depth in a solution is set larger than hardness of the elastic body 413 disposed in a region (or at a position) at a shallow depth in the solution. Hardness of the elastic body 413 may continuously vary in a linear manner or in a curved manner. Hardness of the elastic body 413 may vary in a stepwise manner. Alternatively, hardness of the elastic body 413 may partially vary in a region (or at a position) which is largely effected by a fluid pressure. In an example of FIG. 29B, with respect to the elastic bodies 413a, 413b, 413c shown in FIG. 27, hardnesses Ha, Hb of the elastic bodies 413a, 413b, which are disposed on a side having a shallow depth in a solution, are set to satisfy the equation Ha=Hb, and hardness Hc of the elastic body 413c, which is disposed on a side having a deep depth, is set larger than the hardnesses Ha, Hb of the elastic bodies 413a, 413b (Hc>Ha=Hb). With such a configuration, a biasing force of the elastic body 413c at a deep depth position in the solution is further increased so that the elastic body 413c can act against a high fluid pressure.

A change in diameter of the elastic body 413 according to the fifth modification and a change in hardness of the elastic body 413 according to the sixth modification may be used in combination so as to acquire a desired biasing force of the elastic body 413. For example, when there is a limitation on an increase in diameter of an elastic body due to reasons such as a restricted installation space, an increase in diameter of the elastic body and an increase in hardness of the elastic body can be used in combination so as to acquire a desired biasing force. Alternatively, the configuration shown in FIG. 26 or FIG. 28A to FIG. 28D and the configuration of the fifth modification and/or the configuration of the sixth modification may be used in combination so as to acquire a desired biasing force corresponding to a position on the movable base 412.

(Seventh Modification)

A biasing mechanism according to a seventh modification is described with reference to FIG. 30 to FIG. 32.

Figure 30:
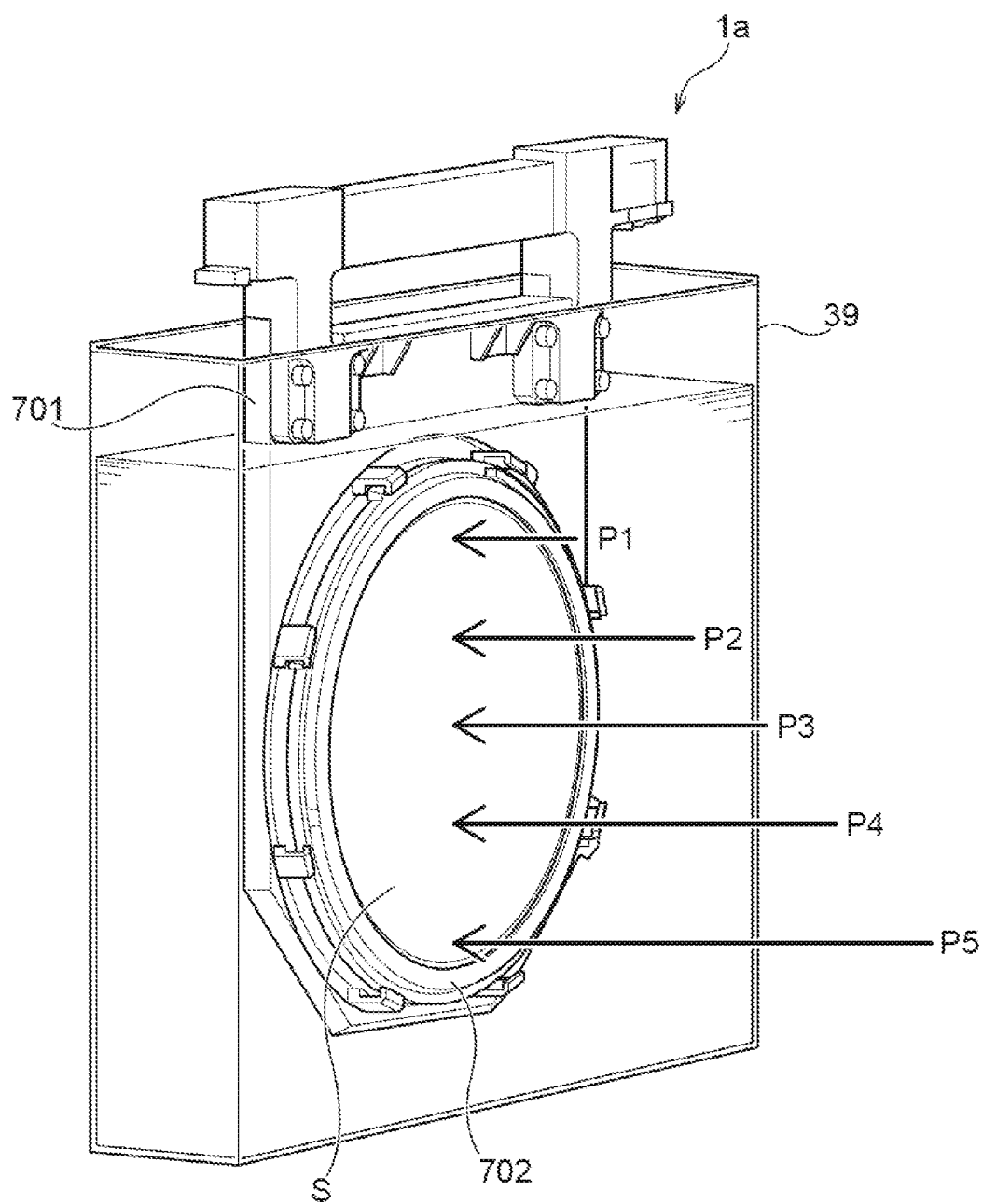
FIG. 30 is an explanatory view for describing a fluid pressure which acts on the substrate holder disposed in a plating tank.

FIG. 30 is an explanatory view for describing a fluid pressure which acts on the substrate holder disposed in a plating tank. A substrate holder 1a holds a substrate S such that a first holding member 701 and a second holding member 702 sandwich the substrate S. The second holding member 702 has an opening portion through which a surface to be plated of the substrate S is exposed. As shown in FIG. 30, a fluid pressure which acts on the surface to be plated of the substrate S is gradually increased toward a deep depth position in a solution (P1<P2<P3<P4<P5). Accordingly, the deeper the surface to be plated of the substrate S is positioned in the solution, the more the surface to be plated of the substrate S is pressed toward the first holding member 701 with a larger fluid pressure. To be more specific, the deeper a position is disposed in the solution, the more the substrate S and the movable base 704 are pressed toward the support base 703 with a larger fluid pressure. As a result, an amount of compression of a seal of the second holding member 702, which presses the substrate S toward the first holding member 701, becomes small at the deep depth position in the solution. In this modification, the substrate holder 1a, which holds a substrate (wafer) having a circular shape, is shown as an example. However, the same goes for the above-mentioned substrate holder 1 which holds a substrate having a rectangular shape or the like. Reference symbols P1 to P5 are illustrated for facilitating the understanding of a magnitude of fluid pressure corresponding to a depth in a solution. In an actual apparatus, a fluid pressure continuously varies corresponding to a depth in a solution.

Figure 31:
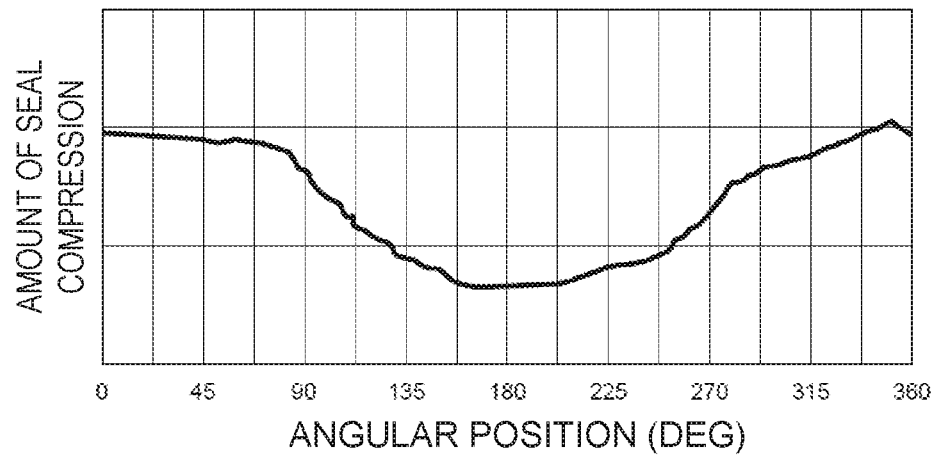
FIG. 31 is a graph showing a measurement result of an amount of seal compression in a substrate holder according to a comparison example.
Figure 32:
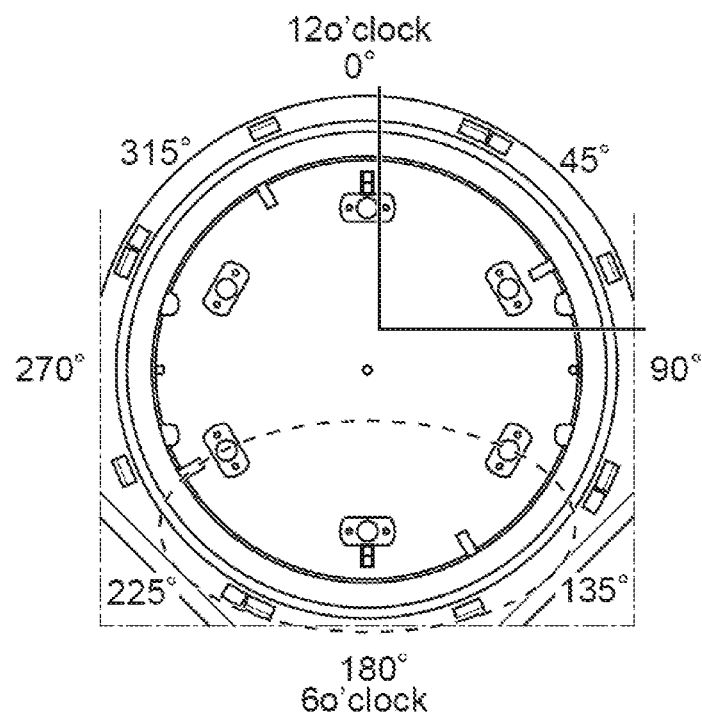
FIG. 32 is an explanatory view showing an angular position of the substrate holder.

FIG. 31 shows a measurement result of an amount of seal compression in a substrate holder according to a comparison example. FIG. 32 is an explanatory view showing an angular position of the substrate holder. In a graph of FIG. 31, an angular position (the position in the rotational direction of a substrate having a circular shape) on the substrate is taken on an axis of abscissas, and corresponds to an angular position shown in FIG. 32. In the graph, an amount of seal compression is taken on an axis of ordinates. In this graph, to describe an effect of a fluid pressure on an amount of seal compression, an amount of seal compression at an angular position of 0° is assumed as a reference, and amounts of seal compression at respective angular positions are shown as a change in amount of seal compression. The substrate holder according to the comparison example is configured such that, in the substrate holder 1a shown in FIG. 33, spring constants of a plurality of elastic bodies (springs) 705 are set to the same value, and a uniform arrangement density of the elastic bodies (springs) 705 is used at all angular positions (0° to 360°). As can be seen from the graph, an amount of seal compression is largely decreased at the angular positions 90° to 270° due to an effect of a fluid pressure.

Figure 33:
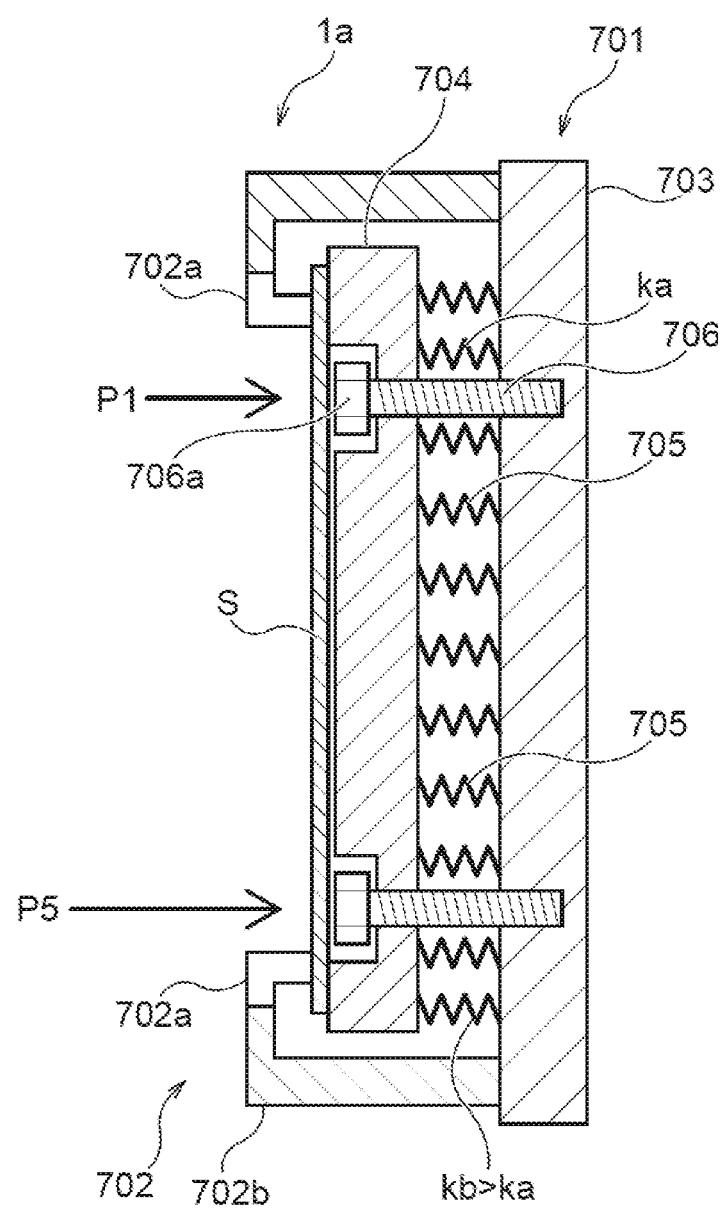
FIG. 33 is a schematic cross-sectional view of the substrate holder.

FIG. 33 is a schematic cross-sectional view of the substrate holder. The substrate holder 1a holds the substrate S such that the first holding member 701 and the second holding member 702 sandwich the substrate S. The first holding member 701 includes: a support base 703; a movable base 704 which supports the substrate S; elastic bodies 705 which bias the movable base 704 in the direction along which the movable base 704 is separated from the support base 703; and guide members 706 which guide the movement of the movable base 704, and restrict a movable range of the movable base 704. In this embodiment, each guide member 706 has a flange 706a, and a distal end side of the guide member 706 is fixed to the support base 703. The movement of the movable base 704 is restricted by the flanges 706a. In this embodiment, the elastic body 705 is formed of a spring, and the plurality of springs 705 are disposed between the movable base 704 and the support base 703. The second holding member 702 is an annular member, and holds an outer peripheral portion of the substrate S, and allows a surface to be plated of the substrate S to be exposed. The second holding member 702 is openably mounted on the first holding member 701 by a hinge or the like. The second holding member 702 has a protruding portion (seal) 702a at a portion thereof which is brought into contact with the outer peripheral portion of the substrate S. The seal 702a may be a separate member from a body 702b of the second holding member 702, or may be an integral body with the body 702b of the second holding member 702. The protruding portion (seal) 702a of the second holding member 702 presses the substrate S on the movable base 704 toward the support base 703 so as to seal the outer peripheral portion of the substrate S from a plating solution. To compensate for the effect of a fluid pressure, the substrate holder 1a of this embodiment adopts the configuration where, in a region (or at a position) at a deep depth in a solution where a fluid pressure is large, the springs 705 are used which have a spring constant kb larger than a spring constant ka of the springs 705 in another region (or at another position).

Figure 34:
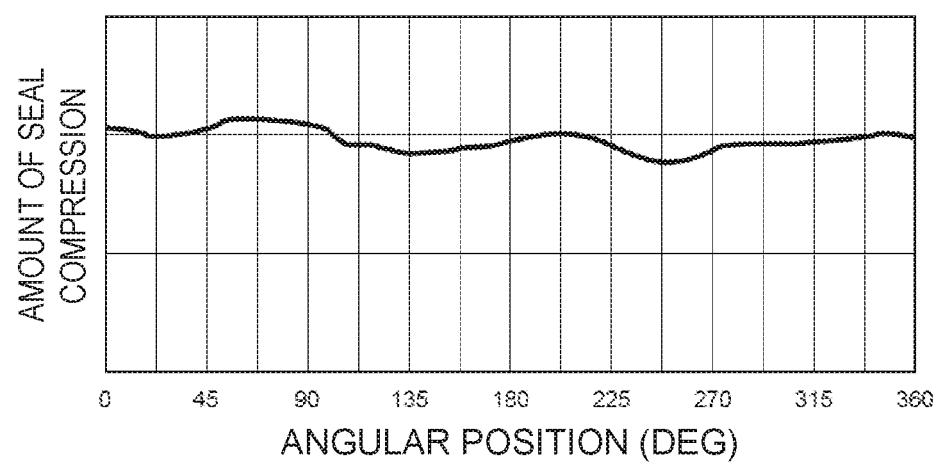
FIG. 34 is a graph showing a measurement result of an amount of seal compression in the substrate holder equipped with a biasing mechanism according to the embodiment.

FIG. 34 shows a measurement result of an amount of seal compression in the substrate holder equipped with the biasing mechanism according to this embodiment. Inventors of the present invention performed an experiment where, in a region which is particularly largely affected by a fluid pressure, that is, in a region of 120° or more and 240° or less out of the angular positions shown in FIG. 32, a spring constant was increased by 20 to 30% compared to a spring constant in other regions (a region of 0° or more and less than 120°, a region of more than 240° and less than 360°). As a result, as shown in FIG. 34, the lowering of an amount of seal compression was suppressed. According to the result of the experiment, it can be understood that a variation in amount of seal compression is suppressed over the entire circumference of the substrate holder, and the amount of seal compression falls within a predetermined range.

Instead of increasing a spring constant of the springs 705, an arrangement density of the springs 705 may be increased in a region (or at a position) where a fluid pressure is large. Alternatively, a change in spring constant of the springs 705 and a change in arrangement density of the springs 705 may be used in combination so as to acquire a desired biasing force. Instead of changing a spring constant and/or an arrangement density of springs in one region (or at one position) of the movable base as in the case of the above-mentioned embodiment, a spring constant and/or an arrangement density of springs may be changed such that a biasing force of the springs is increased in a continuous manner or in a stepwise manner along with the increase in fluid pressure in the entire region of the movable base. Alternatively, a spring constant and/or an arrangement density of springs may be changed such that a biasing force of the springs is increased in a continuous manner or in a stepwise manner along with the increase in fluid pressure in one region (or at one position) of the movable base. As one example, it may be possible to increase only a spring constant of a single spring, which is disposed at a deepest position in a solution.

The substrate holder according to the above-mentioned embodiment can be manufactured as follows. First, the support base, the movable base and the biasing mechanism are prepared. The support base, the movable base and the biasing mechanism are assembled with each other such that one region (or one position) of the movable base is biased with a biasing force which differs from a biasing force applied to another region (or another position) of the movable base. According to the manufacturing method of this embodiment, the biasing mechanism is formed such that a biasing force of the biasing mechanism varies depending of a position on the movable base so that it is possible to easily manufacture a substrate holder where an effect of a difference in fluid pressure can be suppressed or prevented. The configuration, where one region (or one position) of the movable base is biased with a biasing force which differs from a biasing force applied to another region (or another position) of the movable base, may be realized by using various methods described with reference to FIG. 23 to FIG. 34.

[1] According to the above-mentioned embodiment, a substrate can be biased toward the protruding portion (seal) with a biasing force which varies depending on a region (or a position) on the movable base. A biasing force of the biasing mechanism is set large at a portion which receives a large fluid pressure. With such a configuration, the movable base can be biased in the direction along which the movable base is separated from the support base with a biasing force of a magnitude corresponding to a magnitude of a fluid pressure. As a result, a fluctuation in amount of seal compression caused by a fluid pressure difference can be suppressed. As a result, a leakage of a plating solution can be suppressed or prevented. An inclination of the movable base (an inclination of the substrate) caused by a fluid pressure can be also suppressed or prevented. Further, the substrate and the contacts 370 can be favorably brought into contact with each other over the entire circumference. Accordingly, non-uniformity in plating thickness can be suppressed. That is, by performing electrolytic plating treatment on a substrate using the substrate holder of this embodiment, a thickness of metal formed on the substrate can be made substantially uniform in the plane.

[2] According to the above-mentioned embodiment, when the substrate holder is disposed in the plating tank, a biasing force of the biasing mechanism is larger in a lower region (or at a lower position) of the movable base than in an upper region (or at an upper position) of the movable base. Accordingly, the movable base can be biased against a large fluid pressure in the lower region (or at a lower position) of the movable base. With such a configuration, in the lower region (or at the lower position) of the movable base, it is possible to suppress or prevent a decrease in amount of seal compression so that an inclination of the movable base (an inclination of the substrate) can be suppressed or prevented.

[3] According to one example, a biasing force of the biasing mechanism is set corresponding to a distance from one end of the movable base. For example, assume an end portion of the movable base on a shallow depth side in a solution as the first end portion and an end portion of the movable base on a deep depth side in the solution as the second end portion. In such a case, a biasing force of the biasing mechanism is set so as to gradually increase toward the end portion of the movable base on the deep depth side. With such a configuration, a biasing force can be set with higher accuracy corresponding to a fluid pressure.

[4] According to one example, spring constants of the springs are varied depending on a region (or a position) on the movable base so that a biasing force can be varied. Accordingly, a biasing force can be varied depending on a region (or a position) on the movable base while an increase in arrangement space of the springs is suppressed or prevented. By setting spring constants in a region (or at a position) at a deep depth in a solution larger than spring constants in a region (or at a position) at a shallow depth in the solution, a biasing force corresponding to a magnitude of a fluid pressure can be realized by the springs.

[5] According to one example, an arrangement density of the springs is changed depending on a region (or a position) on the movable base so that a biasing force can be varied. Accordingly, a biasing force also can be varied depending on a region (or a position) on the movable base by changing an arrangement density of the springs of an identical type.

[6] According to one example, a change in spring constant and a change in arrangement density of springs are used in combination corresponding to a region (or a position) on the movable base so that a biasing force can be varied. For example, when there is a restriction on an arrangement space of springs, an arrangement density of springs is increased within an allowable range of the arrangement space so that an insufficient biasing force can be compensated for by increasing a spring constant. With such a configuration, it is possible to suppress a design change or the like brought about by the increase in arrangement space and, at the same time, an increase in spring constant difference can be also suppressed.

[7] According to one example, the rod-shaped elastic body is sandwiched between the groove and/or the protrusion formed on at least one of the movable base and the support base, and a size of the groove and the protrusion is varied depending on a region (or a position) on the movable base so as to vary an amount of compression of the elastic body. The larger the amount of compression of the elastic body, the larger a biasing force applied to the movable base becomes. Accordingly, for example, an amount of compression of the elastic body is set such that a distance between the movable base and the support base becomes small at a deep depth position in a solution. With such setting, when a substrate is sandwiched between the first and second holding members, the amount of compression of the elastic body becomes large between the movable base and the support base at a deep depth position in the solution so that a larger biasing force is generated. Accordingly, a biasing force corresponding to a fluid pressure can be applied to the movable base at a deep depth position in the solution so that it is possible to suppress or prevent a decrease or a variation in amount of seal compression and an inclination of the movable base which are caused by an effect of a fluid pressure.

In the configuration which uses the rod-shaped elastic body, a thickness of the space, which is required for installing the elastic body, can be reduced compared to the configuration which uses springs and, at the same time, a continuity of a biasing force can be maintained along a seal region. Accordingly, a thickness of the substrate holder can be reduced, and a continuity of a biasing force is also enhanced. For this reason, the substrate holder according to this embodiment can be suitably applicable to a quadrangular substrate having a small thickness and a large size.

[8] According to one example, an inclination is formed on the groove and/or the protrusion so as to vary a size of the groove and/or the protrusion depending on a position on the movable base. In this case, a size of the groove and/or the protrusion can be continuously varied corresponding to a fluid pressure.

[9] According to one example, the size adjustment member is disposed on the bottom surface of the groove and/or the end surface of the protrusion so as to vary a depth of the groove depending on a position on the movable base. In this case, after the groove and/or the protrusion are formed on the movable base and/or the support base, a size of the groove can be easily varied corresponding to a fluid pressure.

[10] According to one example, a biasing force can be varied by varying at least one of a diameter of the elastic body, hardness of the elastic body, and the number of elastic bodies depending on a region (or a position) on the movable base. In this case, even when a size of the groove and/or the protrusion formed on the movable base and/or the support base is not varied, a biasing force can be varied depending on a region (or a position) on the movable base by adjusting at least one of a diameter of the elastic body, hardness of the elastic body, and the number of elastic bodies. Alternatively, elastic bodies (for example, O rings) of different diameters, different hardnesses, and/or different numbers are prepared. Then, the elastic bodies of different diameters, different hardnesses, and/or different numbers are disposed corresponding to a region (or a position) on the movable base. With such a configuration, a biasing force can be easily varied.

[11] According to one example, an adjustment of a size of the groove and/or the protrusion on the movable base and/or the support base and an adjustment of at least one of a diameter of the elastic body, hardness of the elastic body, and the number of elastic bodies are used in combination so that it is possible to realize a biasing force corresponding to a region (or a position) of the movable base. In this case, for example, when there is a restriction on an adjustment range of a size of the groove and/or the protrusion due to reasons such as a restricted size of the substrate holder in the thickness direction and required mechanical strength, an insufficient biasing force can be compensated for by adjusting at least one of a diameter of the elastic body, hardness of the elastic body, and the number of elastic bodies. In this case, an increase in thickness of the substrate holder can be suppressed, and an insufficient adjustment of a biasing force can be compensated for in a flexible manner by adjusting at least one of a diameter of the elastic body, hardness of the elastic body, and the number of elastic bodies while required mechanical strength is acquired.

[12] According to the substrate treatment apparatus of this embodiment, plating treatment can be performed on a substrate while an effect of a fluid pressure difference on the substrate holder can be suppressed or prevented.

At least following technical concept can be recognized from the above-described embodiments.

[1] According to an aspect 1, there is provided a substrate holder. The substrate holder includes a first holding member and a second holding member which are configured to sandwich a substrate. The first holding member includes: a support base; a movable base configured to support the substrate; and a biasing mechanism disposed between the support base and the movable base, and configured to bias the movable base in a direction along which the movable base is separated from the support base. The second holding member includes a protruding portion brought into contact with the substrate so as to seal the substrate. A biasing force of the biasing mechanism which is applied to a region or a position of the movable base differs from a biasing force of the biasing mechanism which is applied to another region or another position of the movable base. A position may be one position or a plurality of positions.

According to the aspect 1, the substrate can be biased toward the protruding portion (seal) with a biasing force which varies depending on a position on the movable base. For example, when the substrate holder is disposed in a plating tank in a substantially vertical posture so as to perform plating treatment, a fluid pressure (water pressure) which respective portions of the substrate holder receive varies depending on a depth in a plating solution. That is, a fluid pressure which the substrate holder receives varies depending on a position on the movable base. The movable base is pressed toward the support base at a large fluid pressure at a deep depth position in the solution. On the other hand, the movable base is pressed toward the support base at a small fluid pressure at a shallow depth position in the solution. The movable base receives a fluid pressure from a plating solution by way of a surface to be plated of the substrate which is exposed from the second holding member. In this case, when a biasing force of the biasing mechanism is set constant in the entire region of the movable base, the movable base approaches the support base more at the deep depth position in the solution than at other depth positions due to a fluid pressure so that an amount of seal compression (compression margin) becomes small. Such a decrease or a variation in amount of seal compression may cause a leakage of a plating solution. When an amount of seal compression is set large in the entire region of the movable base, there is a possibility of causing breakage of a substrate. Inclination (deflection) of the movable base caused by a fluid pressure difference may also cause a substrate on the movable base to be inclined. Further, at a portion where an amount of seal compression is lowered, a substrate and contacts may not be favorably brought into contact with each other so that a plating thickness may become non-uniform.

According to the aspect 1, a biasing force of the biasing mechanism is set large at a portion which receives a large fluid pressure (a portion which receives a large force in the direction along which the movable base is made to approach the support base). With such a configuration, the movable base can be biased in the direction along which the movable base is separated from the support base with a biasing force of a magnitude corresponding to a magnitude of a fluid pressure. As a result, a fluctuation in amount of seal compression caused by a fluid pressure difference can be suppressed. As a result, a leakage of a plating solution can be suppressed or prevented. An inclination of the movable base (an inclination of the substrate) caused by a fluid pressure can be also suppressed or prevented. Further, the substrate and the contacts can be favorably brought into contact with each other over the entire circumference. Accordingly, non-uniformity in plating thickness can be suppressed.

[2] According to an aspect 2, in the substrate holder of the aspect 1, the substrate holder is used in the plating tank in a substantially vertical posture, and the biasing force of the biasing mechanism is larger in a region or at a position disposed on a lower side in the plating tank than in a region or at a position disposed on an upper side in the plating tank.

According to the aspect 2, when the substrate holder is disposed in the plating tank, a biasing force of the biasing mechanism is larger in a lower region or at a lower position of the movable base than in an upper region or at an upper position of the movable base. Accordingly, the movable base can be biased against a large fluid pressure in the lower region or at the lower position of the movable base. With such a configuration, in the lower region or at the lower position of the movable base, it is possible to suppress or prevent a decrease in amount of seal compression so that an inclination of the movable base (an inclination of the substrate) can be suppressed or prevented.

[3] According to an aspect 3, in the substrate holder of the aspect 1 or 2, the movable base has a first end portion and a second end portion, and the biasing force of the biasing mechanism increases corresponding to a distance in a direction from the first end portion of the movable base toward the second end portion of the movable base.

According to the aspect 3, a biasing force of the biasing mechanism is set corresponding to a distance from one end of the movable base. For example, assume an end portion of the movable base on a shallow depth side in a solution as a first end portion and an end portion of the movable base on a deep depth side in the solution as a second end portion. In such a case, a biasing force of the biasing mechanism is set so as to gradually increase toward the end portion of the movable base on the deep depth side. With such a configuration, a biasing force can be set with higher accuracy corresponding to a fluid pressure.

[4] According to an aspect 4, in the substrate holder of any one of the aspects 1 to 3, the biasing mechanism includes a plurality of springs, and spring constants of the plurality of springs are adjusted so as to vary the biasing force of the biasing mechanism.

According to the aspect 4, spring constants of the springs are varied depending on a position on the movable base so that a biasing force can be varied. Accordingly, a biasing force can be varied depending on a position on the movable base while an increase in arrangement space of the springs is suppressed or prevented. For example, by setting spring constants in a region or at a position at a deep depth in a solution larger than spring constants in a region or at a position at a shallow depth in the solution, a biasing force corresponding to a magnitude of a fluid pressure can be realized by the springs.

[5] According to an aspect 5, in the substrate holder of any one of the aspects 1 to 3, the biasing mechanism includes a plurality of springs, and an arrangement density of the springs is adjusted so as to vary the biasing force of the biasing mechanism.

According to the aspect 5, an arrangement density of the springs is changed depending on a position on the movable base so that a biasing force can be varied. Accordingly, a biasing force can be varied depending on a position on the movable base also by changing an arrangement density of springs of an identical type. For example, by setting an arrangement density of the springs disposed in a region or at a position at a deep depth in a solution larger than an arrangement density of the springs disposed in a region or at a position at a shallow depth in the solution, a biasing force corresponding to a magnitude of a fluid pressure can be realized by the springs.

[6] According to an aspect 6, in the substrate holder of any one of the aspects 1 to 3, the biasing mechanism includes a plurality of springs, and spring constants of the plurality of springs and an arrangement density of the springs are adjusted so as to vary the biasing force of the biasing mechanism.

According to the aspect 6, a change in spring constant and a change in arrangement density of springs are used in combination so that a biasing force can be varied depending on a position on the movable base. For example, when there is a restriction on an arrangement space of springs, an arrangement density of springs is increased within an allowable range of the arrangement space so that an insufficient biasing force can be compensated for by increasing a spring constant. With such a configuration, it is possible to suppress a design change or the like brought about by the increase in arrangement space and, at the same time, an increase in spring constant difference can be also suppressed. Further, by using a change in spring constant and a change in arrangement density of springs in combination, an adjustment range of a biasing force can be expanded.

[7] According to an aspect 7, in the substrate holder of any one of the aspects 1 to 3, the biasing mechanism includes one or a plurality of rod-shaped elastic bodies, at least one of a groove or a protrusion is formed on at least one of a portion of the movable base where the elastic body is disposed and a portion of the support base where the elastic body is disposed, and a size of at least one of the groove or the protrusion is adjusted corresponding to a position on the movable base so as to vary the biasing force of the biasing mechanism.

According to the aspect 7, the rod-shaped elastic body is sandwiched between the groove and/or the protrusion formed on at least one of the movable base and the support base, and a size of the groove and the protrusion (a depth of the groove and a height of the protrusion) is varied depending on a position on the movable base so as to vary an amount of compression of the elastic body. The larger the amount of compression of the elastic body, the larger a biasing force applied to the movable base becomes. Accordingly, for example, an amount of compression of the elastic body is set such that a distance between the movable base and the support base becomes small at a deep depth position in a solution. With such setting, when a substrate is sandwiched between the first and second holding members, the amount of compression of the elastic body becomes large between the movable base and the support base at a deep depth position in the solution so that a larger biasing force is generated. Accordingly, a biasing force corresponding to a fluid pressure can be applied to the movable base at a deep depth position in the solution so that it is possible to suppress or prevent a decrease or a variation in amount of seal compression and an inclination of the movable base which are caused by an effect of a fluid pressure.

In the configuration which uses the rod-shaped elastic body, a thickness of the elastic body, which is required for installing the elastic body, can be reduced compared to the configuration which uses springs and, at the same time, a continuity of a biasing force can be maintained along a seal region. Accordingly, a thickness of the substrate holder can be reduced, and a continuity of a biasing force is also enhanced. The configuration which uses the rod-shaped elastic body can be suitably applicable to a quadrangular substrate having a small thickness and a large size.

[8] According to an aspect 8, in the substrate holder of the aspect 7, at least one of the groove or the protrusion is formed on at least one of the movable base and the support base, and an inclination is formed on at least one of the groove or the protrusion.

According to the aspect 8, an inclination is formed on the groove and/or the protrusion so as to vary a size of the groove and/or the protrusion depending on a position on the movable base. In this case, a size of the groove and/or the protrusion can be continuously varied corresponding to a fluid pressure.

[9] According to an aspect 9, in the substrate holder of the aspect 7 or 8, at least one of the groove or the protrusion is formed on at least one of the movable base and the support base, and a size adjustment member is disposed on at least one of a bottom surface of the groove or an end surface of the protrusion. The size adjustment member may be formed of a plate member or a rod-like member having a fixed or varying size (thickness, diameter) in cross section.

According to the aspect 9, the size adjustment member is disposed on the bottom surface of the groove and/or the end surface of the protrusion so as to vary a depth of the groove and/or a height of the protrusion depending on a position on the movable base. In this case, after the groove and/or the protrusion are formed on the movable base and/or the support base, a size of the groove can be easily varied corresponding to a fluid pressure.

[10] According to an aspect 10, in the substrate holder of any one of the aspects 1 to 3, the biasing mechanism includes one or a plurality of rod-shaped elastic bodies, and at least one of a diameter of the elastic body, hardness of the elastic body and the number of elastic bodies is adjusted corresponding to a position on the movable base so as to vary the biasing force of the biasing mechanism.

According to the aspect 10, a biasing force can be varied by varying at least one of a diameter of the elastic body, hardness (elasticity) of the elastic body, and the number of elastic bodies depending on a position on the movable base. In this case, even when a size of the groove and/or the protrusion formed on the movable base and/or the support base is not varied, a biasing force can be varied depending on a position on the movable base by adjusting at least one of a diameter of the elastic body, hardness of the elastic body, and the number of elastic bodies. Alternatively, elastic bodies (for example, O rings) of different diameters, different hardnesses, and/or different number are prepared. Then, the elastic bodies having different diameters, different hardnesses, and/or of different number are disposed corresponding to a position on the movable base. With such a configuration, a biasing force can be easily varied.

[11] According to an aspect 11, in the substrate holder of any one of the aspects 1 to 3, the biasing mechanism includes one or a plurality of rod-shaped elastic bodies, at least one of a groove or a protrusion is formed on at least one of a portion of the movable base where the elastic body is disposed and a portion of the support base where the elastic body is disposed, a size of at least one of the groove or the protrusion is adjusted corresponding to a position on the movable base, and at least one of a diameter of the elastic body, hardness of the elastic body and the number of elastic bodies is adjusted corresponding to a position on the movable base so as to vary the biasing force of the biasing mechanism.

According to the aspect 11, an adjustment of a size of the groove and/or the protrusion on the movable base and/or the support base and an adjustment of at least one of a diameter of the elastic body, hardness of the elastic body, and the number of elastic bodies are used in combination so that it is possible to realize a biasing force corresponding to a region or a position of the movable base. In this case, for example, when there is a restriction on an adjustment range of a size of the groove and/or the protrusion due to reasons such as a restricted size of the substrate holder in the thickness direction and required mechanical strength, an insufficient biasing force can be compensated for by adjusting at least one of a diameter of the elastic body, hardness of the elastic body, and the number of elastic bodies. In this case, an increase in thickness of the substrate holder can be suppressed, and an insufficient adjustment of a biasing force can be compensated for in a flexible manner by adjusting at least one of a diameter of the elastic body, hardness of the elastic body, and the number of elastic bodies while required mechanical strength is acquired.

[12] According to an aspect 12, the substrate holder according to any one of the aspects 1 to 11 is configured to hold a substrate having a quadrangular shape.

According to the aspect 12, it is possible to acquire functions and effects substantially equal to the functions and effects in the aspect 1. Particularly, recently, substrates having a quadrangular shape have reduced in thickness and have increased in size thus having a large size in the vertical direction. Accordingly, there is a tendency to increase a fluid pressure difference between an upper portion and a lower portion of the substrate holder. Further, the substrate holder has a small thickness and hence, the substrate holder is easily affected by a fluid pressure. By applying the aspect 12 to such a substrate holder holding a quadrangular substrate, an effect, which may be caused on the substrate holder by a fluid pressure difference, can be effectively suppressed or prevented.

[13] According to an aspect 13, the substrate holder according to any one of the aspects 1 to 11 is configured to hold a substrate having a circular shape.

According to the aspect 13, it is possible to acquire functions and effects substantially equal to the functions and effects in the aspect 1. Recently, a diameter of semiconductor wafers has increased. Due to an increase in size of semiconductor wafers in the vertical direction, there is a tendency to increase a fluid pressure difference between an upper portion and a lower portion of the substrate holder. According to the aspect 13, an effect, which may be caused on the substrate holder by a fluid pressure difference, can be effectively suppressed or prevented.

[14] According to an aspect 14, there is provided a substrate treatment apparatus which includes a plating tank in which the substrate holder according to any one of the aspects 1 to 13 is disposed. According to this substrate treatment apparatus, plating treatment can be performed on a substrate while an effect of a fluid pressure difference on the substrate holder can be suppressed or prevented.

[15] According to an aspect 15, there is provided a method for manufacturing a substrate holder for sandwiching a substrate, the method including the steps of: preparing a support base, a movable base and a biasing mechanism; and assembling the support base, the movable base and the biasing mechanism with each other such that a region or a position of the movable base is biased with a biasing force which differs from a biasing force applied to another region or another position of the movable base.

According to the aspect 15, the biasing mechanism is formed such that a biasing force of the biasing mechanism varies depending on a position on the movable base. Accordingly, it is possible to easily manufacture a substrate holder where an effect on the substrate holder caused by a fluid pressure difference can be suppressed or prevented.

Although the embodiment of the present invention has been described heretofore based on some examples, the above-mentioned embodiment of the present invention is provided for facilitating the understanding of the present invention, and does not limit the present invention. As a matter of course, without departing from the gist of the present invention, various modifications and variations are conceivable, and the present invention includes a technique equivalent to the present invention. Within a range where at least a portion of the above-mentioned problems can be solved or within a range where at least a portion of the above-mentioned functions and effects can be acquired, respective constitutional elements described in the claims and the specification may be combined or omitted as desired.

The present application claims priority to Japanese Patent Applications No. 2016-234169 filed on Dec. 1, 2016. The entire disclosure of Japanese Patent Applications No. 2016-234169 filed on Dec. 1, 2016, including specification, claims, drawings and summary is incorporated herein by reference in its entirety.

The entire disclosure of Japanese Patent No. 5643239 specification (PTL 1), Japanese Patent Laid-Open No. 2015-145537 (PTL 2), and Japanese Patent Laid-Open No. 2016-3376 (PTL 3) including specification, claims, drawings and summary is incorporated herein by reference in its entirety.

| REFERENCE SIGNS LIST | | |
| --- | --- | --- |
| 1, 1a: substrate holder | 25: cassette table | 25a: cassette |
| 27: substrate transferring device | 28: traveling mechanism | |
| 29: substrate attaching and detaching mechanism | 30: stocker | |
| 32: pre-wetting tank | 33: presoaking tank | 34: pre-rinse tank |
| 35: blow tank | 36: rinse tank | |
| 37: substrate holder transporting device | 38: overflow tank | |

REFERENCE SIGNS LIST

| | | | |
|---|---|---|---|
| 39: plating tank | 50: cleaning device | 50a: cleaning part | |
| 100: plating apparatus | 110: loading/unloading part | 120: treatment part | |
| 120A: pretreatment and post-treatment part | 120B: plating treatment part | | |
| 175: controller | 175A: CPU | 175B: memory | |
| 175C: control part | 300: front plate | 301: front surface | |
| 302: back surface | 303: opening portion | 310: front plate body | |
| 311: wiring buffer portion | 311a: wiring hole | 312: face portion | |
| 313: thick wall portion | 320: mounting portion | 330: arm portion | |
| 331: connector | 340: clamp | 340a: engaging portion | 342: lever |
| 350: fixing member | 361: inner seal | 362: outer seal | |
| 363: seal holder | 363a: wiring groove | 364: seal holder | |
| 365: cable path | 370: contact | 390: positioning pin | |
| 400: back plate | 401: front surface | 402: back surface | |
| 410: back plate body | 411: support base | 411a: recessed portion | |
| 411b: bottom surface | 411c: recessed portion | 411d: bottom surface | |
| 411e: protrusion | 412: movable base | 412a: peripheral edge portion | |
| 412b: groove portion | 412c: substrate support surface | 412d: recessed portion | |
| 412e: recessed portion | 412f: shim | 412g: shim | 413: elastic body |
| 414: guide mechanism | 420: clip portion | 421: clip | |
| 421a: pawl portion | 421b: elongated hole | 421c: circular hole | |
| 422: coil spring | 422a: leg portion | 422b: leg portion | |
| 422c: wound portion | 423: fixed portion | 423a: restricting surface | |
| 423b: guide surface | 424: fixed shaft | 430: engagement receiving portion | |
| 430a: projecting portion | 470: button | 471: force receiving portion | |
| 472: elastic portion | 473: mounting portion | 474: pressing member | |
| 475: fastening member | 490: positioning piece | 601: conductive wire | |
| 602: cover | 701: first holding member | 702: second holding member | |
| 702a: protruding portion (seal) | 702b: body | 703: support base | |
| 704: movable base | 705: elastic body | 706: guide member | |
| 706a: flange | 4121: upper side | 4122: lower side | |
| 4123: right side | 4124: left side | | |

What is claimed is:

1. A substrate holder comprising a first holding member and a second holding member which are configured to sandwich a substrate, wherein
the first holding member includes: a support base; a movable base configured to support the substrate; and a biasing mechanism disposed between the support base and the movable base, and configured to bias the movable base in a direction along which the movable base is separated from the support base,
the second holding member includes a protruding portion brought into contact with the substrate so as to seal the substrate, and
a biasing force of the biasing mechanism which is applied to a region or a position of the movable base differs from a biasing force of the biasing mechanism which is applied to another region or another position of the movable base,
wherein the substrate holder is used in a plating tank in a substantially vertical posture, and
wherein the biasing force of the biasing mechanism is larger in a region or at a position disposed on a lower side in the plating tank than in a region or at a position disposed on an upper side in the plating tank.

2. The substrate holder according to claim 1, wherein
the movable base has a first end portion and a second end portion, and
the biasing force of the biasing mechanism increases corresponding to a distance in a direction from the first end portion of the movable base toward the second end portion of the movable base.

3. The substrate holder according to claim 1, wherein
the biasing mechanism includes a plurality of springs, and spring constants of the plurality of springs are adjusted so as to vary the biasing force of the biasing mechanism.

4. The substrate holder according to claim 1, wherein
the biasing mechanism includes a plurality of springs, and an arrangement density of the springs is adjusted so as to vary the biasing force of the biasing mechanism.

5. The substrate holder according to any one of claim 1, wherein
the biasing mechanism includes a plurality of springs, and spring constants of the plurality of springs and an arrangement density of the springs are adjusted so as to vary the biasing force of the biasing mechanism.

6. The substrate holder according to claim 1, wherein
the biasing mechanism includes one or a plurality of rod-shaped elastic bodies, at least one of a groove or a protrusion is formed on at least one of a portion of the movable base where the elastic body is disposed and a portion of the support base where the elastic body is disposed, and a size of at least one of the groove or the protrusion is adjusted corresponding to a position on the movable base so as to vary the biasing force of the biasing mechanism.

7. The substrate holder according to claim 6, wherein
at least one of the groove or the protrusion is formed on at least one of the movable base and the support base, and an inclination is formed on at least one of the groove or the protrusion.

8. The substrate holder according to claim 6, wherein
at least one of the groove or the protrusion is formed on at least one of the movable base and the support base, and a size adjustment member is disposed on at least one of a bottom surface of the groove or an end surface of the protrusion.

9. The substrate holder according to claim 1, wherein
the biasing mechanism includes one or a plurality of rod-shaped elastic bodies, and at least one of a diameter of the elastic body, hardness of the elastic body and the number of elastic bodies is adjusted corresponding to a position on the movable base so as to vary the biasing force of the biasing mechanism.

10. The substrate holder according to claim 1, wherein
the biasing mechanism includes one or a plurality of rod-shaped elastic bodies, at least one of a groove or a protrusion is formed on at least one of a portion of the movable base where the elastic body is disposed and a portion of the support base where the elastic body is disposed, a size of at least one of the groove or the protrusion is adjusted corresponding to a position on the movable base, and at least one of a diameter of the elastic body, hardness of the elastic body and the number of elastic bodies is adjusted corresponding to a position on the movable base so as to vary the biasing force of the biasing mechanism.

11. The substrate holder according to claim 1, wherein the substrate holder is configured to sandwich a substrate having a quadrangular shape.

12. The substrate holder according to claim 1, wherein the substrate holder is configured to sandwich a substrate having a circular shape.

13. A substrate treatment apparatus comprising a plating tank in which the substrate holder described in claim 1 is disposed.

14. A method for manufacturing a substrate holder for sandwiching a substrate which is used in a plating tank in a substantially vertical posture, the method comprising the steps of:

preparing a support base, a movable base and a biasing mechanism; and assembling the support base, the movable base and the biasing mechanism with each other such that a region or a position of the movable base is biased with a biasing force which differs from a biasing force applied to another region or another position of the movable base, wherein the biasing force of the biasing mechanism is larger in a region or at a position disposed on a lower side in the plating tank than in a region or at a position disposed on an upper side in the plating tank.

* * * * *